(12) United States Patent
Agnello et al.

(10) Patent No.: US 12,207,539 B1
(45) Date of Patent: Jan. 21, 2025

(54) FOLDABLE SUBSTRATES HAVING A CAVITY FILLED WITH A POLYMER AND METHODS OF MAKING

(71) Applicant: CORNING INCORPORATED, Corning, NY (US)

(72) Inventors: Gabriel Pierce Agnello, Corning, NY (US); Matthew Wade Fenton, Elmira, NY (US); Aize Li, Painted Post, NY (US); Katherine Anne Lindberg, Corning, NY (US); Ren Liu, Horseheads, NY (US); Robert Arthur McIntosh, Painted Post, NY (US); Adam James Ruggles, Corning, NY (US); Vitor Marino Schneider, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 18/409,627

(22) Filed: Jan. 10, 2024

Related U.S. Application Data

(60) Provisional application No. 63/545,576, filed on Oct. 25, 2023.

(51) Int. Cl.
*H10K 59/122* (2023.01)
*H01L 23/538* (2006.01)
(Continued)

(52) U.S. Cl.
CPC ........ *H10K 77/111* (2023.02); *H01L 23/5387* (2013.01); *H10K 71/135* (2023.02);
(Continued)

(58) Field of Classification Search
CPC .............. H10K 71/236; H10K 77/111; H10K 2102/311; H10K 71/135; H10K 71/231; H01L 23/5387
See application file for complete search history.

(56) References Cited

U.S. PATENT DOCUMENTS

| 8,854,623 B2 | 10/2014 | Fontaine et al. |
| 2015/0110990 A1 | 4/2015 | Chou et al. |
| (Continued) | | |

FOREIGN PATENT DOCUMENTS

| JP | 2019-186786 A | 10/2019 |
| KR | 10-2017-0124715 A | 11/2017 |
| (Continued) | | |

*Primary Examiner* — Alonzo Chambliss
(74) *Attorney, Agent, or Firm* — Jeffrey A. Schmidt

(57) ABSTRACT

Foldable substrates have a first portion, a second portion, and a central portion positioned therebetween with a first transition region having a first central surface area of the central portion with a first average angle. In aspects, the first average angle is from about 176.10 to about 179.9° or from about 177.0° to about 179.9°. In aspects, a polymer angle is from 178.3° to about 179.9° or from about 179.10 to about 179.9°. Methods comprise disposing an etch mask over the first major surface of the foldable substrate before etching the foldable substrate. In aspects, the etch mask comprises a first polymer layer positioned between a first barrier layer and the first major surface. In aspects, the etch mask comprises a plurality of ink-jet printed shapes. Methods of measuring a contrast ratio comprise impinging a transparent apparatus with a collimated beam.

20 Claims, 22 Drawing Sheets

(51) Int. Cl.
    *H10K 71/00*         (2023.01)
    *H10K 71/13*         (2023.01)
    *H10K 71/20*         (2023.01)
    *H10K 77/10*         (2023.01)
    *H10K 102/00*      (2023.01)

(52) U.S. Cl.
    CPC ......... *H10K 71/231* (2023.02); *H10K 71/236*
        (2023.02); *H10K 2102/311* (2023.02)

(56) References Cited

U.S. PATENT DOCUMENTS

| | | | |
|---|---|---|---|
| 2020/0292731 A1* | 9/2020 | Park | G06F 1/1641 |
| 2020/0319673 A1* | 10/2020 | Lee | G06F 1/1652 |
| 2021/0107826 A1 | 4/2021 | Hwang et al. | |
| 2022/0048813 A1 | 2/2022 | Kim et al. | |
| 2022/0217863 A1 | 7/2022 | Kim et al. | |
| 2022/0287195 A1* | 9/2022 | Chen | B32B 17/06 |
| 2022/0413556 A1 | 12/2022 | Lee et al. | |
| 2023/0168718 A1 | 6/2023 | Lee et al. | |
| 2023/0278917 A1 | 9/2023 | Ostholt et al. | |
| 2023/0309368 A1* | 9/2023 | Allan | B32B 3/266 |

FOREIGN PATENT DOCUMENTS

| | | | | |
|---|---|---|---|---|
| KR | 10-2020-0117638 A | 10/2020 | | |
| WO | 2021/012190 A1 | 1/2021 | | |
| WO | WO-2021041857 A1 * | 3/2021 | ............. | B32B 17/06 |
| WO | WO-2021041882 A1 * | 3/2021 | ............ | C03C 21/002 |
| WO | 2023/038982 A1 | 3/2023 | | |

\* cited by examiner

FIG. 3

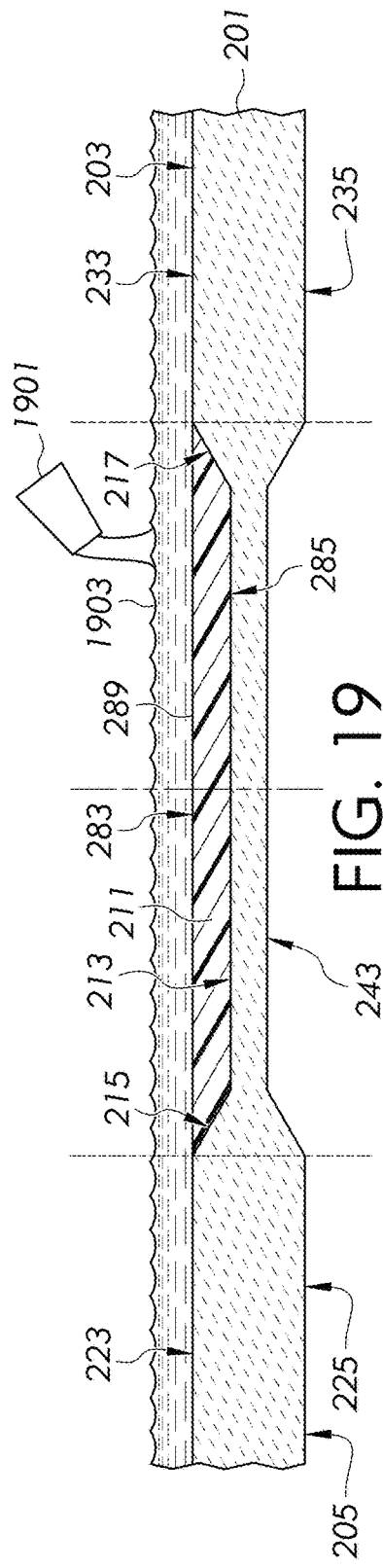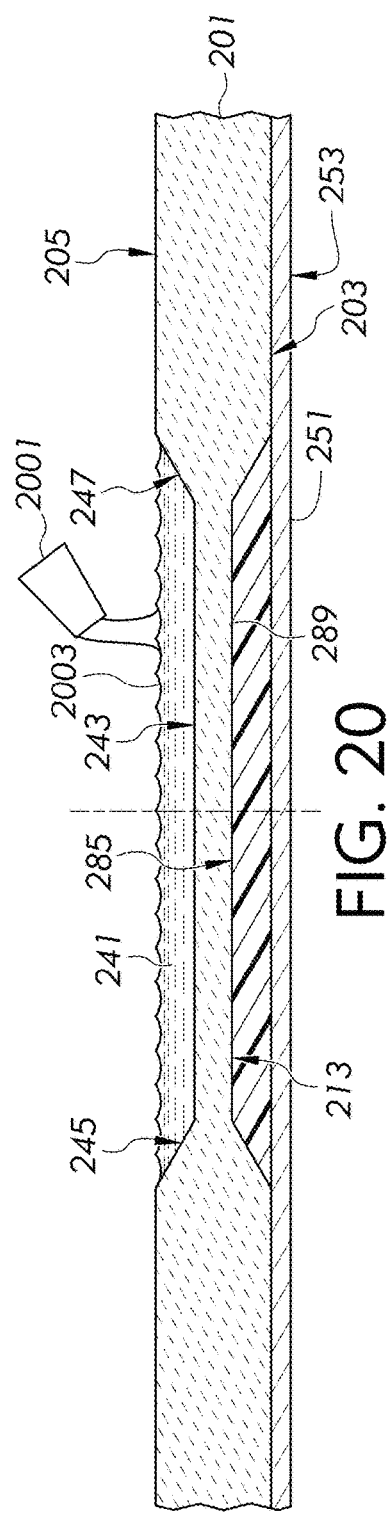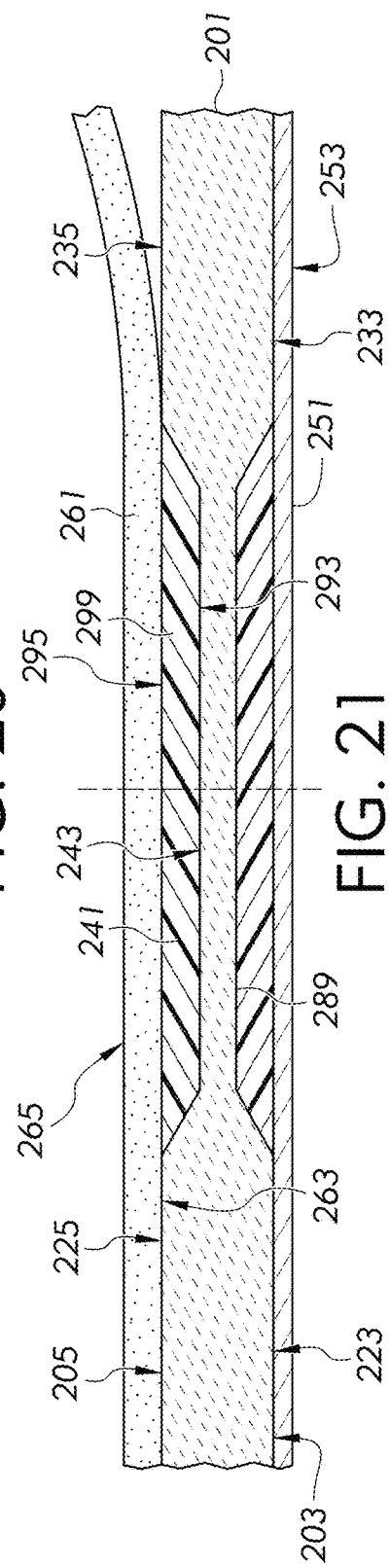

FOLDABLE SUBSTRATES HAVING A CAVITY FILLED WITH A POLYMER AND METHODS OF MAKING

CROSS-REFERENCE TO RELATED APPLICATION

This application claims the benefit of priority under 35 U.S.C. § 119 of U.S. Provisional Application Ser. No. 63/545,576 filed on Oct. 25, 2023, the content of which is relied upon and incorporated herein by reference in its entirety.

FIELD

The present disclosure relates generally to foldable substrates and methods of making and, more particularly, to foldable substrates comprising a first central surface area recessed from a first major surface and methods of making foldable substrates.

BACKGROUND

Glass-based substrates are commonly used, for example, in display devices, for example, liquid crystal displays (LCDs), electrophoretic displays (EPD), organic light-emitting diode displays (OLEDs), plasma display panels (PDPs), or the like.

There is a desire to develop foldable versions of displays as well as foldable protective covers to mount on foldable displays. Foldable displays and covers should have good impact and puncture resistance. At the same time, foldable displays and covers should have small minimum bend radii (e.g., about 10 millimeters (mm) or less). However, plastic displays and covers with small minimum bend radii tend to have poor impact and/or puncture resistance. Furthermore, conventional wisdom suggests that ultra-thin glass-based sheets (e.g., about 75 micrometers (μm or microns) or less thick) with small minimum bend radii tend to have poor impact and/or puncture resistance. Furthermore, thicker glass-based sheets (e.g., greater than 125 micrometers) with good impact and/or puncture resistance tend to have relatively large minimum bend radii (e.g., about 30 millimeters or more). Consequently, there is a need to develop foldable apparatus that have low minimum bend radii and good impact and puncture resistance.

SUMMARY

There are set forth herein foldable apparatus comprising foldable substrates, foldable substrates, and methods of making foldable apparatus and foldable substrates comprising foldable substrates that comprise a first portion and a second portion. The portions can comprise glass-based and/or ceramic-based portions, which can provide good dimensional stability, reduced incidence of mechanical instabilities, good impact resistance, and/or good puncture resistance. The first portion and/or the second portion can comprise glass-based and/or ceramic-based portions comprising one or more compressive stress regions, which can further provide increased impact resistance and/or increased puncture resistance. By providing a substrate comprising a glass-based and/or ceramic-based substrate, the substrate can also provide increased impact resistance and/or puncture resistance while simultaneously facilitating good folding performance. In aspects, the substrate thickness can be sufficiently large (e.g., from about 80 micrometers (microns or μm) to about 2 millimeters) to further enhance impact resistance and puncture resistance. Providing foldable substrates comprising a central portion comprising a central thickness that is less than a substrate thickness can enable a small parallel plate distance (e.g., about 10 millimeters or less) based on the reduced thickness in the central portion.

In aspects, the foldable apparatus and/or foldable substrates can comprise a plurality of recesses, for example, a first central surface area recessed from a first major surface by a first distance and a second central surface area recessed from a second major surface by a second distance. Providing a first recess opposite a second recess can provide the central thickness that is less than a substrate thickness. Further, providing a first recess opposite a second recess can reduce a maximum bend-induced strain of the foldable apparatus, for example, between a central portion and a first portion and/or second portion since the central portion comprising the central thickness can be closer to a neutral axis of the foldable apparatus and/or foldable substrates than if only a single recess was provided. Additionally, providing the first distance substantially equal to the second distance can reduce the incidence of mechanical instabilities in the central portion, for example, because the foldable substrate is symmetric about a plane comprising a midpoint in the substrate thickness and the central thickness. Moreover, providing a first recess opposite a second recess can reduce a bend-induced strain of a material positioned in the first recess and/or second recess compared to a single recess with a surface recessed by the sum of the first distance and the second distance. Providing a reduced bend-induced strain of a material positioned in the first recess and/or the second recess can enable the use of a wider range of materials because of the reduced strain requirements for the material. For example, stiffer and/or more rigid materials can be positioned in the first recess, which can improve impact resistance, puncture resistance, abrasion resistance, and/or scratch resistance of the foldable apparatus. Additionally, controlling properties of a first material positioned in a first recess and a second material positioned in a second recess can control the position of a neutral axis of the foldable apparatus and/or foldable substrates, which can reduce (e.g., mitigate, eliminate) the incidence of mechanical instabilities, apparatus fatigue, and/or apparatus failure.

In aspects, the foldable apparatus and/or foldable substrates can comprise a first transition region attaching the central portion to the first portion and/or a second transition region attaching the central portion to the second portion. Providing transition regions with smoothly and/or monotonically decreasing (e.g., continuously decreasing) thicknesses can reduce stress concentration in the transition regions and/or avoid optical distortions. Providing a sufficient length of the transition region(s) (e.g., from about 2 mm to about 5 mm, from about 2.2 mm to about 4 mm, or from about 2.5 mm to about 3.5 mm) can decrease a visibility of the transition region (e.g., enable a lower contrast ratio and/or produce a transition region that is invisible to the naked eye), for example as measured by a contrast ratio defined herein. The sufficiently long transition region (and/or associated average transition angle) and/or polymer angle (defined herein) can avoid optical distortions (that may otherwise exist from a sharp change in thickness of the foldable substrate) from being discernable to a user, for example with a contrast ratio of about 0.27 or less, about 0.26 or less, or 0.25 or less. As discussed with reference to FIG. 29 and Examples A-E, a contrast ratio of 0.25 or less can be invisible to the naked eye (e.g., user).

Providing an average transition angle and/or a surface angle of a first transition surface area of the first transition region relative to the first central surface area that is sufficiently large (e.g., from about 176.1° to about 179.9° or from about 177.0° to about 179.9°) can reduce optical distortions and/or reduce visibility of the transition region such that it may not be discernable to a user. As demonstrated by Examples 1-4 and FIG. 30, when the foldable substrate comprises a first recess and a second recess opposite the first recess, the average transition angle and/or the surface angle can be from about 176.10 to about 179.9° or from about 177.0° to about 179.9° to produce a contrast ratio of 0.25 or less, which is associated with a transition region that is invisible to the naked eye. As demonstrated by Examples 5-8 and FIG. 30, when the foldable substrate comprises a second recess and the second central surface area is flush with the second major surface, the average transition angle can be from about 176.1° to about 179.9° to produce a contrast ratio of 0.25 or less, which is associated with a transition region that is invisible to the naked eye.

Providing a polymer angle that is sufficiently large (e.g., from about 178.3° to about 179.9° or from about 179.10 to about 179.9°) can reduce optical distortions and/or reduce visibility of the transition region such that it may not be discernable to a user. As demonstrated by Examples 1-4 and FIG. 30, when the foldable substrate comprises a first recess and a second recess opposite the first recess, the polymer angle can be from about 178.3° to about 179.9° or from about 179.10 to about 179.9° to produce a contrast ratio of 0.25 or less, which is associated with a transition region that is invisible to the naked eye. As demonstrated by Examples 5-8 and FIG. 30, when the foldable substrate comprises a second recess and the second central surface area is flush with the second major surface, the polymer angle can be from about 179.10 to about 179.9° to produce a contrast ratio of 0.25 or less, which is associated with a transition region that is invisible to the naked eye.

Also, providing a polymer-based material in the recess (es) with a refractive index close (e.g., within 0.1 or less, within 0.05 or less, within 0.02 or less, or within 0.01 or less) to the refractive index of the foldable substrate can further decrease a visibility of the transition region (e.g., enable a lower contrast ratio and/or produce a transition region that is invisible to the naked eye), as demonstrated by comparing Examples 3-4 or Examples 7-8. When the polymer-based material that does not extend beyond the recess(es), providing a distance between the contact surface of the polymer-based portion and the corresponding major surface of the foldable substrate of about 5 μm or less (e.g., about 2 μm or less) facilitates a low contrast ratio (e.g., low visibility) of the transition region. Alternatively, a portion of the polymer-based portion can be positioned in the recess and another (e.g., continuous) portion of the polymer-based portion can further contact a major surface of the foldable substrate, which can reduce optical distortions.

Methods of the aspects of the disclosure can enable formation of transition regions using an etch mask and an etchant. Providing an etch mask comprising a polymer layer at a peripheral portion of the etch mask can enable formation of transition regions with a transition width (e.g., about 1.5 mm or more, from about 1.5 mm to about 5 mm, from about 2 mm to about 4 mm), an average transition angle (e.g., from about 178.3° to about 179.9° or from about 179.10 to about 179.9°), and/or a surface angle (e.g., from about 178.3° to about 179.9° or from about 179.1° to about 179.9°) that can be greater than comparative etch masks (see Examples 10-12). Without wishing to be bound by theory, the polymer layer can be deflected away from the foldable substrate during etching to enable the etchant access to an additional portion of the foldable substrate that the polymer layer could otherwise be in contact with. While the etchant can contact the additional portion of the foldable substrate by deflection of the polymer layer, diffusion of the etchant to the additional portion is limited, which limits the extent of etching of the additional portion, producing a transition region.

Alternatively, methods can comprise ink-jet printing a plurality of shapes (e.g., on the existing first central surface area and/or existing first major surface) that can be etched to form the central portion (e.g., first transition region, second transition region, central region). Providing a width of one or more shapes of the plurality of shapes from about 500 nm to about 50 μm can enable the underlying foldable substrate to be etched to produce a substantially continuous and/or smooth surface of the resulting surface (e.g., first transition surface area 215, third transition surface area 217, and/or first central surface area 213 shown in FIGS. 2-5). In aspects, the fractional area profile (of the corresponding predetermined pattern) can be proportional to an amount of material removed by the etching to produce a predetermined first transition region and a predetermined second transition region in the etching of step 1207. Without wishing to be bound by theory, it is believed that the shapes of the present disclosure are sufficiently small that undercutting by the etchant (e.g., isotropic etchant) can produce a relatively smooth surface (e.g., without discernable flat spots corresponding to the predetermined pattern). At the same time, it is believed that the shapes of the present disclosure are large enough that the shapes can limit etching (e.g., diffusion of the etchant) in areas with higher fractional areas to produce the predetermined profile.

Some example aspects of the disclosure are described below with the understanding that any of the features of the various aspects may be used alone or in combination with one another.

Aspect 1. A foldable apparatus comprising a foldable substrate, the foldable substrate comprising:
  a substrate thickness in a range from about 80 micrometers to about 5 millimeters defined between a first major surface and a second major surface opposite the first major surface, the foldable substrate comprising a glass-based material or a ceramic-based material;
  a first portion comprising the substrate thickness between a first surface area of the first major surface and a second surface area of the second major surface;
  a second portion comprising the substrate thickness between a third surface area of the first major surface and a fourth surface area of the second major surface; and
  a central portion comprising:
    a central thickness less than the substrate thickness and in a range from about 20 micrometers to about 200 micrometers defined between a first central surface area and a second central surface area opposite the first central surface area, and the first central surface area recessed from the first major surface by a first distance and defining a first recess;
    a first transition region comprising a first transition surface area extending between the first surface area and the first central surface area with a first average angle relative to the first central surface area, and a thickness of the first transition region smoothly and monotonically decreases between the substrate thickness of the first portion and the central thickness of the central portion; and a second transition region comprising a third transition surface area extending between the third surface area and the first central surface area with a third average angle relative to the first central surface area, and a thickness of the second transition region smoothly and monotonically decreases between the substrate thickness of the second portion and the central thickness of the central portion, wherein the first average angle is in a range from about 178.3° to about 179.90.

Aspect 2. The foldable apparatus of aspect 1, wherein the first average angle is in a range from 178.5° to about 179.0°.

Aspect 3. The foldable apparatus of any one of aspects 1-2, wherein a first transition width of the first transition region is in a range from about 2.0 millimeters to about 6.0 millimeters.

Aspect 4. The foldable apparatus of any one of aspects 1-3, wherein the second central surface area is flush with the second surface area and the fourth surface area.

Aspect 5. The foldable apparatus of any one of aspects 1-4, further comprising a polymer-based portion positioned in the first recess, an absolute value of a difference between a first refractive index of the foldable substrate and a second refractive index of the polymer-based portion is about 0.1 or less.

Aspect 6. The foldable apparatus of aspect 5, wherein the absolute value of the difference between the first refractive index of the foldable substrate and the second refractive index is about 0.01 or less.

Aspect 7. The foldable apparatus of any one of aspects 5-6, wherein the polymer-based portion comprises a first contact surface facing the first central surface area and a second contact surface opposite the first contact surface, wherein a distance in a direction of the substrate thickness between the first major surface and the second contact surface is about 5 micrometers or less.

Aspect 8. The foldable apparatus of any one of aspects 5-6, wherein the polymer-based portion further extends beyond a plane defined by the first major surface.

Aspect 9. The foldable apparatus of any one of aspects 5-8, wherein the foldable apparatus comprises a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

Aspect 10. The foldable apparatus of any one of aspects 1-9, wherein the first distance, as a percentage of the substrate thickness, is in a range from about 50% to about 80%.

Aspect 11. The foldable apparatus of any one of aspects 1-10, wherein the substrate thickness is in a range from about 100 micrometers to about 400 micrometers, and the central thickness is in a range from about 25 micrometers to about 80 micrometers.

Aspect 12. The foldable apparatus of any one of aspects 1-11, wherein the third average angle is substantially equal to the first average angle.

Aspect 13. The foldable apparatus of any one of aspects 1-12, wherein the foldable substrate achieves a parallel plate distance of 10 millimeters.

Aspect 14. The foldable apparatus of any one of aspects 1-13, wherein the foldable substrate comprises a minimum parallel plate distance in a range from about 0.5 millimeters to about 10 millimeters.

Aspect 15. The foldable apparatus of any one of aspects 1-14, wherein the second central surface area is recessed from the second major surface by a second distance and defines a second recess, the first transition region further comprises a second transition surface area extending between the second surface area and the second central surface area with a second average angle relative to the second central surface area, and the second transition region further comprises a fourth transition surface area extending between the fourth surface area and the second central surface area with a fourth average angle relative to the second central surface area.

Aspect 16. A foldable apparatus comprising a foldable substrate, the foldable substrate comprising:
 a substrate thickness in a range from about 80 micrometers to about 5 millimeters defined between a first major surface and a second major surface opposite the first major surface, the foldable substrate comprising a glass-based material or a ceramic-based material;
 a first portion comprising the substrate thickness between a first surface area of the first major surface and a second surface area of the second major surface;
 a second portion comprising the substrate thickness between a third surface area of the first major surface and a fourth surface area of the second major surface; and
 a central portion comprising:
  a central thickness less than the substrate thickness and in a range from about 20 micrometers to about 200 micrometers defined between a first central surface area and a second central surface area opposite the first central surface area, the first central surface area recessed from the first major surface by a first distance and defines a first distance, and the second central surface area is recessed from the second major surface by a second distance and defines a second recess;
  a first transition region comprising a first transition surface area extending between the first surface area and the first central surface area with a first average angle relative to the first central surface area and a second transition surface area extending between the second surface area and the second central surface area with a second average angle relative to the second central surface area, and a thickness of the first transition region smoothly and monotonically decreases between the substrate thickness of the first portion and the central thickness of the central portion; and
  a second transition region comprising a third transition surface area extending between the third surface area and the first central surface area with a third average angle relative to the first central surface area and a fourth transition surface area extending between the fourth surface area and the second central surface area with a fourth average angle relative to the second central surface area, and a thickness of the second transition region smoothly and monotonically decreases between the substrate thickness of the second portion and the central thickness of the central portion, wherein the first average angle is in a range from about 179.1° to about 179.90.

Aspect 17. The foldable apparatus of any one of aspects 15-16, wherein the first average angle is in a range from 179.2° to about 179.5°.

Aspect 18. The foldable apparatus of any one of aspects 15-17, wherein the second average angle is in a range from about 179.1° to about 179.9°.

Aspect 19. The foldable apparatus of any one of aspects 15-18, wherein the first average angle is substantially equal to the third average angle.

Aspect 20. The foldable apparatus of any one of aspects 15-19, wherein the first average angle is substantially equal to the second average angle.

Aspect 21. The foldable apparatus of any one of aspects 15-20, wherein a first transition width of the first transition region is in a range from about 2.0 millimeters to about 6.0 millimeters.

Aspect 22. The foldable apparatus of any one of aspects 15-21, further comprising:
- a first polymer-based portion positioned in the first recess, an absolute value of a difference between a first refractive index of the foldable substrate and a second refractive index of the first polymer-based portion is about 0.1 or less; and
- a second polymer-based portion positioned in the second recess, an absolute value of a difference between the first refractive index of the foldable substrate and a third refractive index of the second polymer-based portion is about 0.1 or less.

Aspect 23. The foldable apparatus of aspect 22, wherein the absolute value of the difference between the first refractive index of the foldable substrate and the second refractive index is about 0.01 or less.

Aspect 24. The foldable apparatus of any one of aspects 22-23, wherein the absolute value of the difference between the first refractive index of the foldable substrate and the third refractive index is about 0.01 or less.

Aspect 25. The foldable apparatus of any one of aspects 22-24, wherein the first polymer-based portion comprises a first contact surface facing the first central surface area and a second contact surface opposite the first contact surface, wherein a distance in a direction of the substrate thickness between the first major surface and the second contact surface is about 5 micrometers or less.

Aspect 26. The foldable apparatus of any one of aspects 22-25, wherein the first polymer-based portion further extends beyond a first plane defined by the first major surface.

Aspect 27. The foldable apparatus of any one of aspects 22-25, wherein the second polymer-based portion comprises a fourth contact surface facing the second central surface area and a third contact surface opposite the fourth contact surface, wherein a distance in a direction of the substrate thickness between the second major surface and the third contact surface is about 5 micrometers or less.

Aspect 28. The foldable apparatus of any one of aspects 22-27, wherein the second polymer-based portion further extends beyond a second plane defined by the second major surface.

Aspect 29. The foldable apparatus of any one of aspects 22-27, wherein the foldable apparatus comprises a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

Aspect 30. The foldable apparatus of any one of aspects 15-29, wherein the first distance, as a percentage of the substrate thickness, is in a range from about 20% to about 50%, and the second distance, as a percentage of the substrate thickness, is in a range from about 20% to about 50%.

Aspect 31. The foldable apparatus of aspect 30, wherein the first distance is substantially equal to the second distance.

Aspect 32. The foldable apparatus of any one of aspects 15-31, wherein the substrate thickness is in a range from about 100 micrometers to about 400 micrometers, and the central thickness is in a range from about 25 micrometers to about 80 micrometers.

Aspect 33. The foldable apparatus of any one of aspects 15-32, wherein the foldable substrate achieves a parallel plate distance of 10 millimeters.

Aspect 34. The foldable apparatus of any one of aspects 15-33, wherein the foldable substrate comprises a minimum parallel plate distance in a range from about 0.5 millimeters to about 10 millimeters.

Aspect 35. A consumer electronic device comprising:
- a housing comprising a front surface, a back surface, and side surfaces;
- electrical components at least partially within the housing, the electrical components comprising a controller, a memory, and a display, the display is at or adjacent to the front surface of the housing; and
- a cover substrate disposed over the display,
- wherein at least one of a portion of the housing or the cover substrate comprises the foldable apparatus of any one of aspects 1-34.

Aspect 36. A method of measuring a contrast ratio of a transparent apparatus comprising a substrate with at least one recess:
- positioning the transparent apparatus in a sample holder;
- generating a collimated beam from a light source;
- impinging the transparent apparatus with the collimated beam to form a measurement beam;
- focusing the measurement beam on a surface of an optical detector;
- transmitting a signal corresponding to the measurement beam detected by the optical detector;
- processing the signal to determine a location associated with the at least one recess; and
- calculating a contrast ratio is defined as a difference between a maximum fractional intensity and a minimum fractional intensity divided by the sum of the maximum fractional intensity and the minimum fractional intensity, the maximum fractional intensity and the minimum fractional intensity are measured at the location.

Aspect 37. The method of aspect 36, wherein the generating a collimated beam from the light source comprises:
- emitting a first beam from a light source towards the sample holder;
- transmitting the first beam through a pinhole aperture to form a second beam; and
- transmitting the second beam through a spatial filter optical aperture to form a collimated beam.

Aspect 38. The method of any one of aspects 36-37, wherein the light source is configured to emit substantially monochromatic light.

Aspect 39. The method of aspect 38, wherein the substantially monochromatic light comprises an optical wavelength in a range from about 300 nanometers to about 700 nanometers.

Aspect 40. The method of any one of aspects 36-39, wherein the optical detector comprises a plurality of pixels.

Aspect 41. The method of any one of aspects 36-40, wherein the processing the signal further comprises:

rotating an image associated with the signal so that a portion of the signal associated with the at least one recess is aligned along an axis; and determining a location associated with the at least one recess comprises averaging the signal in a direction of the axis.

Aspect 42. The method of any one of aspects 36-41, wherein the processing the signal further comprises removing background noise based on a signal detected when the transparent apparatus is not in the sample holder.

Aspect 43. A method of making a foldable substrate comprising a substrate thickness, the method comprising:

disposing an etch mask over a first major surface of the foldable substrate, the etch mask comprising:

a first portion comprising a first barrier layer at least partially adhered to the first major surface, a first polymer layer positioned between the first barrier layer and the first major surface at a first peripheral portion of the first portion, a first contact surface of the first polymer layer adhered to the first barrier layer, and a second contact surface of the first polymer layer facing the first major surface; and a second portion comprising a second barrier layer at least partially adhered to the first major surface, a second polymer layer positioned between the second barrier layer and the first major surface at a second peripheral portion of the second portion, a third contact surface of the second polymer layer adhered to the second barrier layer, a fourth contact surface of the second polymer layer facing the first major surface, and a minimum distance between the first peripheral portion and the second peripheral portion is in a range from about 1 millimeter to about 50 millimeters;

etching the foldable substrate by contacting a central region of a central portion of the foldable substrate between the first portion of the etch mask and the second portion of the etch mask, the etching removes a portion of the foldable substrate to form a first central surface area recessed from the first major surface by a first distance and defining a first recess, the etching removes a portion of the foldable substrate to form a first transition surface area of a first transition region, and the etching removes a portion of the foldable substrate to form a third transition surface area of a second transition region; and removing the etch mask, wherein a first transition width of the first transition region is greater than or equal to a first width of the first polymer layer, a second transition width of the second transition region is greater than or equal to a second width of the second polymer layer, the central portion comprising the first transition region, the central region, and the second transition region, and the first width is in a range from about 1.5 millimeters to about 4 millimeters, and the second width is in a range from about 1.5 millimeters to about 4 millimeters.

Aspect 44. The method of aspect 43, wherein the method produces the foldable substrate of the foldable apparatus of any one of aspects 1-34.

Aspect 45. The method of aspect 43, wherein the first transition surface area extends between a first surface of the first major surface and the first central surface area with a first average angle relative to the first central surface area, the third transition surface area extends between a third surface area of the first major surface and the first central surface area with a third average angle relative to the first central surface area, and the first average angle is in a range from about 178.3° to about 179.9°.

Aspect 46. The method of aspect 45, wherein the first average angle is in a range from 178.5° to about 179.0°.

Aspect 47. The method of any one of aspects 43-46, wherein the central portion comprises a second central surface area opposite the first central surface area, the foldable substrate further comprises a second major surface opposite the first major surface, and the second central surface area is flush with the second major surface.

Aspect 48. The method of aspect 43, further comprising before the etching, disposing a second etch mask over a second major surface of the foldable substrate, the second etch mask comprising:

a third portion comprising a third barrier layer at least partially adhered to the second major surface, a third polymer layer positioned between the third barrier layer and the second major surface at a third peripheral portion of the third portion, a fifth contact surface of the third polymer layer adhered to the third barrier layer, and a sixth contact surface of the third polymer layer facing the second major surface; and a fourth portion comprising a fourth barrier layer at least partially adhered to the second major surface, a fourth polymer layer positioned between the fourth barrier layer and the second major surface at a fourth peripheral portion of the fourth portion, a seventh contact surface of the fourth polymer layer adhered to the fourth barrier layer, and an eighth contact surface of the fourth polymer layer facing the second major surface, and a minimum distance between the third peripheral portion and the fourth peripheral portion is in a range from about 1 millimeter to about 50 millimeters;

the etching further comprises contacting the central region of the central portion of the foldable substrate between the third portion of the second etch mask and the fourth portion of the second etch mask, the etching removes a portion of the foldable substrate to form a second central surface area recessed from the second major surface by a second distance and defining a second recess, the etching removes a portion of the foldable substrate to form a second transition surface area of the first transition region, and the etching removes a portion of the foldable substrate to form a fourth transition surface area of the second transition region; and after the etching, removing the second etch mask, wherein a third width of the third polymer layer is in a range from about 1.5 millimeters to about 4 millimeters, a fourth width of the fourth polymer layer is in a range from about 1.5 millimeters to about 4 millimeters.

Aspect 49. The method of aspect 48, wherein the first transition surface area extends between a first surface of the first major surface and the first central surface area with a first average angle relative to the first central surface area, the third transition surface area extends between a third surface area of the first major surface and the first central surface area with a third average angle relative to the first central surface area, and the first average angle is in a range from about 179.1° to about 179.9°.

Aspect 50. The method of aspect 48, wherein the first average angle is in a range from 179.2° to about 179.5°.

Aspect 51. A method of making a foldable substrate comprising a substrate thickness a predetermined first transition region and a predetermined second transition region, the method comprising:

ink-jet printing a plurality of shapes on a first major surface including a central portion of the foldable substrate, wherein the plurality of shapes are non-uniformly distributed over the first major surface in a predetermined pattern; and etching the foldable substrate by contacting a central portion of the foldable substrate and the plurality of shapes with an etchant, the etching removes a portion of the foldable substrate to form a first central surface area recessed from the first major surface by a first distance and defining a first recess, the etching removes a portion of the foldable substrate to form a first transition surface area of the predetermined first transition region, and the etching removes a portion of the foldable substrate to form a third transition surface area of the predetermined second transition region.

Aspect 52. The method of aspect 51, wherein the predetermined pattern produces a fractional area profile of a portion of first major surface covered by the plurality of shapes averaged in a direction perpendicular to both a direction of the substrate thickness and a direction extending from the first transition surface to the third transition surface area, and the fractional area profile is proportional to an amount of material removed by the etching to produce the predetermined first transition region and the predetermined second transition region.

Aspect 53. The method of any one of aspects 51-52, wherein the plurality of shapes correspond to a plurality of curved shapes.

Aspect 54. The method of any one of aspects 51-52, wherein the plurality of shapes comprise a plurality of elongated shapes with an aspect ratio of about 10 or more.

Aspect 55. The method of any one of aspects 51-54, wherein a shape of the plurality of shapes comprises a shape width in a range from about 500 nanometers to about 50 micrometers, and the shape width is in a direction extending from the first transition surface to the third transition surface area.

Aspect 56. The method of any one of aspects 51-55, wherein the method produces the foldable substrate of the foldable apparatus of any one of aspects 1-34.

Aspect 57. The method of any one of aspects 51-55, wherein the first transition surface area extends between a first surface of the first major surface and the first central surface area with a first average angle relative to the first central surface area, the third transition surface area extends between a third surface area of the first major surface and the first central surface area with a third average angle relative to the first central surface area, and the first average angle is in a range from about 178.3° to about 179.9°.

Aspect 58. The method of aspect 57, wherein the first average angle is in a range from 178.5° to about 179.0°.

Aspect 59. The method of any one of aspects 51-55 and 57-58 inclusive, wherein the central portion comprises a second central surface area opposite the first central surface area, the foldable substrate further comprises a second major surface opposite the first major surface, and the second central surface area is flush with the second major surface.

Aspect 60. The method of aspect 57, wherein the first average angle is in a range from about 179.10 to about 179.9°.

Aspect 61. The method of aspect 60, wherein the foldable substrate comprises a second central surface area opposite the first central surface area, the second central surface area recessed from a second major surface opposite the second major surface by a second distance and defining a second recess.

Aspect 62. The method of any one of aspects 43-61, wherein the foldable substrate exhibits a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test when the first recess is filled with a material comprising substantially the same refractive index as the foldable substrate.

Aspect 63. A method of forming a foldable apparatus comprising: the method of making the foldable substrate of any one of aspects 43-61; and disposing a first polymer-based portion in at least the first recess, and an absolute value of a difference between a first refractive index of the foldable substrate and a second refractive index of the first polymer-based portion is about 0.1 or less, wherein the foldable substrate exhibits a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

Aspect 64. The method of forming a foldable apparatus comprising:
the method of making the foldable substrate of aspect 47 or aspect 61;
disposing a first polymer-based portion in at least the first recess, and an absolute value of a difference between a first refractive index of the foldable substrate and a second refractive index of the first polymer-based portion is about 0.1 or less; and
disposing a second polymer-based portion in at least the second recess, and an absolute value of a difference between the first refractive index of the foldable substrate and a third refractive index of the second polymer-based portion is about 0.1 or less,
wherein the foldable substrate exhibits a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

Aspect 65. The method of aspect 64, wherein the absolute value of the difference between the first refractive index of the foldable substrate and the third refractive index is about 0.01 or less.

Aspect 66. The method of any one of aspects 63-65, wherein the absolute value of the difference between the first refractive index of the foldable substrate and the second refractive index is about 0.01 or less.

Aspect 67. A foldable apparatus comprising a foldable substrate, the foldable substrate comprising:
a substrate thickness in a range from about 80 micrometers to about 5 millimeters defined between a first major surface and a second major surface opposite the first major surface, the foldable substrate comprising a glass-based material or a ceramic-based material;
a first portion comprising the substrate thickness between a first surface area of the first major surface and a second surface area of the second major surface;
a second portion comprising the substrate thickness between a third surface area of the first major surface and a fourth surface area of the second major surface;
a central portion comprising a central thickness less than the substrate thickness and in a range from about 20 micrometers to about 200 micrometers defined between a first central surface area and a second central surface area opposite the first central surface area, and the first central surface area recessed from the first major surface by a first distance and defining a first recess; and
a first polymer-based portion disposed in the first recess comprising a first contact surface facing the first central surface area and a second contact surface opposite the second contact surface, and an absolute value of a difference between a first refractive index of the foldable substrate and a second refractive index of the first polymer-based portion is about 0.1 or less,
wherein a first polymer angle defined as an internal angle between the first major surface of the foldable substrate and the second contact surface of the polymer-based portion is in a range from about 178.3° to about 179.9°.

Aspect 68. The foldable apparatus of aspect 67, wherein the first polymer angle is in a range from 178.5° to about 179.0°.

Aspect 69. The foldable apparatus of any one of aspects 67-68, wherein a distance in a direction of the substrate thickness between the first major surface and the second contact surface is about 5 micrometers or less.

Aspect 70. The foldable apparatus of any one of aspects 67-69, wherein the foldable apparatus comprises a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

Aspect 71. The foldable apparatus of any one of aspects 67-70, wherein the substrate thickness is in a range from about 100 micrometers to about 400 micrometers, and the central thickness is in a range from about 25 micrometers to about 80 micrometers.

Aspect 72. The foldable apparatus of any one of aspects 67-71, wherein the second central surface area is flush with the second surface area and the fourth surface area.

Aspect 73. The foldable apparatus of any one of aspects 67-71, wherein the second central surface area is recessed from the second major surface by a second distance and defines a second recess, and the first polymer angle is in a range from 179.2° to about 179.5°.

Aspect 74. The foldable apparatus of any one of aspects 67-73, wherein the central portion further comprises:
a first transition region comprising a first transition surface area extending between the first surface area and the first central surface area with a first average angle relative to the first central surface area, and a thickness of the first transition region smoothly and monotonically decreases between the substrate thickness of the first portion and the central thickness of the central portion; and
a second transition region comprising a third transition surface area extending between the third surface area and the first central surface area with a third average angle relative to the first central surface area, and a thickness of the second transition region smoothly and monotonically decreases between the substrate thickness of the second portion and the central thickness of the central portion,
wherein the first average angle is in a range from about 176.1° to about 179.90.

Aspect 75. The foldable apparatus of any one of aspects 67-74, wherein the first average angle is in a range from about 177.0 to about 179.0°.

Aspect 76. The foldable apparatus of any one of aspects 74-75, wherein a first transition width of the first transition region is in a range from about 2.0 millimeters to about 6.0 millimeters.

Aspect 77. The foldable apparatus of any one of aspects 67-76, wherein the foldable substrate achieves a parallel plate distance of 10 millimeters.

Aspect 78. The foldable apparatus of any one of aspects 67-77, wherein the foldable substrate comprises a minimum parallel plate distance in a range from about 0.5 millimeters to about 10 millimeters.

Aspect 79. A consumer electronic device comprising:
a housing comprising a front surface, a back surface, and side surfaces;
electrical components at least partially within the housing, the electrical components comprising a controller, a memory, and a display, the display is at or adjacent to the front surface of the housing; and
a cover substrate disposed over the display,
wherein at least one of a portion of the housing or the cover substrate comprises the foldable apparatus of any one of aspects 67-78.

Aspect 80. A foldable apparatus comprising a foldable substrate, the foldable substrate comprising:
a substrate thickness in a range from about 80 micrometers to about 5 millimeters defined between a first major surface and a second major surface opposite the first major surface, the foldable substrate comprising a glass-based material or a ceramic-based material;
a first portion comprising the substrate thickness between a first surface area of the first major surface and a second surface area of the second major surface;
a second portion comprising the substrate thickness between a third surface area of the first major surface and a fourth surface area of the second major surface; and
a central portion comprising:
a central thickness less than the substrate thickness and in a range from about 20 micrometers to about 200 micrometers defined between a first central surface area and a second central surface area opposite the first central surface area, and the first central surface area recessed from the first major surface by a first distance and defining a first recess;
a first transition region comprising a first transition surface area extending between the first surface area and the first central surface area with a first average angle relative to the first central surface area, and a thickness of the first transition region smoothly and monotonically decreases between the substrate thickness of the first portion and the central thickness of the central portion; and
a second transition region comprising a third transition surface area extending between the third surface area and the first central surface area with a third average angle relative to the first central surface area, and a thickness of the second transition region smoothly and monotonically decreases between the substrate thickness of the second portion and the central thickness of the central portion,
wherein the first average angle is in a range from about 176.1° to about 179.90.

Aspect 81. The foldable apparatus of aspect 80, wherein the first average angle is in a range from 177.0° to about 179.0°.

Aspect 82. The foldable apparatus of any one of aspects 80-81, wherein a first transition width of the first transition region is in a range from about 0.6 millimeters to about 5.0 millimeters.

Aspect 83. The foldable apparatus of aspect 82, wherein the first transition width is in a range from about 1.0 millimeters to about 5.0 millimeters.

Aspect 84. The foldable apparatus of aspect 82, wherein the first transition width is in a range from about 2.0 millimeters to about 5.0 millimeters.

Aspect 85. The foldable apparatus of any one of aspects 80-84, wherein the second central surface area is flush with the second surface area and the fourth surface area.

Aspect 86. The foldable apparatus of any one of aspects 80-85, further comprising a polymer-based portion positioned in the first recess, an absolute value of a difference between a first refractive index of the foldable substrate and a second refractive index of the polymer-based portion is about 0.1 or less.

Aspect 87. The foldable apparatus of aspect 86, wherein the absolute value of the difference between the first refractive index of the foldable substrate and the second refractive index is about 0.01 or less.

Aspect 88. The foldable apparatus of any one of aspects 86-87, wherein the polymer-based portion comprises a first contact surface facing the first central surface area and a second contact surface opposite the first contact surface, wherein a distance in a direction of the substrate thickness between the first major surface and the second contact surface is about 5 micrometers or less.

Aspect 89. The foldable apparatus of any one of aspects 86-88, wherein a first polymer angle defined as an internal angle between the first major surface of the foldable substrate and the second contact surface of the polymer-based portion is in a range from about 178.3° to about 179.9°.

Aspect 90. The foldable apparatus of aspect 89, wherein the first polymer angle is in a range from about 178.5° to about 179.0°.

Aspect 91. The foldable apparatus of aspect 89, wherein the first polymer angle is in a range from about 179.1° to about 179.9°.

Aspect 92. The foldable apparatus of aspect 91, wherein the first polymer angle is in a range from about 179.2° to about 179.5°.

Aspect 93. The foldable apparatus of any one of aspects 86-87, wherein the polymer-based portion further extends beyond a plane defined by the first major surface.

Aspect 94. The foldable apparatus of any one of aspects 86-93, wherein the foldable apparatus comprises a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

Aspect 95. The foldable apparatus of any one of aspects 80-94, wherein the first distance, as a percentage of the substrate thickness, is in a range from about 50% to about 80%.

Aspect 96. The foldable apparatus of any one of aspects 80-95, wherein the substrate thickness is in a range from about 100 micrometers to about 400 micrometers, and the central thickness is in a range from about 25 micrometers to about 80 micrometers.

Aspect 97. The foldable apparatus of any one of aspects 80-96, wherein the foldable substrate achieves a parallel plate distance of 10 millimeters.

Aspect 98. The foldable apparatus of any one of aspects 80-97, wherein the foldable substrate comprises a minimum parallel plate distance in a range from about 0.5 millimeters to about 10 millimeters.

Aspect 99. The foldable apparatus of any one of aspects 80-83, wherein the second central surface area is recessed from the second major surface by a second distance and defines a second recess, the first transition region further comprises a second transition surface area extending between the second surface area and the second central surface area with a second average angle relative to the second central surface area, and the second transition region further comprises a fourth transition surface area extending between the fourth surface area and the second central surface area with a fourth average angle relative to the second central surface area.

Aspect 100. A foldable apparatus comprising a foldable substrate, the foldable substrate comprising:
  a substrate thickness in a range from about 80 micrometers to about 5 millimeters defined between a first major surface and a second major surface opposite the first major surface, the foldable substrate comprising a glass-based material or a ceramic-based material;
  a first portion comprising the substrate thickness between a first surface area of the first major surface and a second surface area of the second major surface;
  a second portion comprising the substrate thickness between a third surface area of the first major surface and a fourth surface area of the second major surface; and
  a central portion comprising:
    a central thickness less than the substrate thickness and in a range from about 20 micrometers to about 200 micrometers defined between a first central surface area and a second central surface area opposite the first central surface area, the first central surface area recessed from the first major surface by a first distance and defines a first distance, and the second central surface area is recessed from the second major surface by a second distance and defines a second recess;
    a first transition region comprising a first transition surface area extending between the first surface area and the first central surface area with a first average angle relative to the first central surface area and a second transition surface area extending between the second surface area and the second central surface area with a second average angle relative to the second central surface area, and a thickness of the first transition region smoothly and monotonically decreases between the substrate thickness of the first portion and the central thickness of the central portion; and
    a second transition region comprising a third transition surface area extending between the third surface area and the first central surface area with a third average angle relative to the first central surface area and a fourth transition surface area extending between the fourth surface area and the second central surface area with a fourth average angle relative to the second central surface area, and a thickness of the second transition region smoothly and monotonically decreases between the substrate thickness of the second portion and the central thickness of the central portion,
  wherein the first average angle is in a range from about 177.0° to about 179.90.

Aspect 101. The foldable apparatus of aspect 100, wherein a first transition width of the first transition region is in a range from about 1.0 millimeters to about 5.0 millimeters.

Aspect 102. The foldable apparatus of aspect 101, wherein the first transition width is in a range from about 2.0 millimeters to about 5.0 millimeters.

Aspect 103. The foldable apparatus of any one of aspects 100-102, further comprising:
a first polymer-based portion positioned in the first recess, an absolute value of a difference between a first refractive index of the foldable substrate and a second refractive index of the first polymer-based portion is about 0.1 or less; and
a second polymer-based portion positioned in the second recess, an absolute value of a difference between the first refractive index of the foldable substrate and a third refractive index of the second polymer-based portion is about 0.1 or less.

Aspect 104. The foldable apparatus of aspect 103, wherein the absolute value of the difference between the first refractive index of the foldable substrate and the second refractive index is about 0.01 or less.

Aspect 105. The foldable apparatus of any one of aspects 103-104, wherein the absolute value of the difference between the first refractive index of the foldable substrate and the third refractive index is about 0.01 or less.

Aspect 106. The foldable apparatus of any one of aspects 103-105, wherein the first polymer-based portion comprises a first contact surface facing the first central surface area and a second contact surface opposite the first contact surface, wherein a distance in a direction of the substrate thickness between the first major surface and the second contact surface is about 5 micrometers or less.

Aspect 107. The foldable apparatus of any one of aspects 103-106, wherein a first polymer angle defined as an internal angle between the first major surface of the foldable substrate and the second contact surface of the polymer-based portion is in a range from about 179.1° to about 179.9°.

Aspect 108. The foldable apparatus of aspect 107, wherein the first polymer angle is in a range from about 179.2° to about 179.5°.

Aspect 109. The foldable apparatus of any one of aspects 103-105, wherein the first polymer-based portion further extends beyond a first plane defined by the first major surface.

Aspect 110. The foldable apparatus of any one of aspects 100-109, wherein the second polymer-based portion comprises a fourth contact surface facing the second central surface area and a third contact surface opposite the fourth contact surface, wherein a distance in a direction of the substrate thickness between the second major surface and the third contact surface is about 5 micrometers or less.

Aspect 111. The foldable apparatus of any one of aspects 101-109, wherein the second polymer-based portion further extends beyond a second plane defined by the second major surface.

Aspect 112. The foldable apparatus of any one of aspects 100-111, wherein the foldable apparatus comprises a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

Aspect 113. The foldable apparatus of any one of aspects 100-112, wherein the first distance, as a percentage of the substrate thickness, is in a range from about 20% to about 50%, and the second distance, as a percentage of the substrate thickness, is in a range from about 20% to about 50%.

Aspect 114. The foldable apparatus of aspect 113, wherein the first distance is substantially equal to the second distance.

Aspect 115. The foldable apparatus of any one of aspects 100-114, wherein the substrate thickness is in a range from about 100 micrometers to about 400 micrometers, and the central thickness is in a range from about 25 micrometers to about 80 micrometers.

Aspect 116. The foldable apparatus of any one of aspects 100-115, wherein the foldable substrate achieves a parallel plate distance of 10 millimeters.

Aspect 117. The foldable apparatus of any one of aspects 100-116, wherein the foldable substrate comprises a minimum parallel plate distance in a range from about 0.5 millimeters to about 10 millimeters.

Aspect 118. A consumer electronic device comprising:
a housing comprising a front surface, a back surface, and side surfaces;
electrical components at least partially within the housing, the electrical components comprising a controller, a memory, and a display, the display is at or adjacent to the front surface of the housing; and
a cover substrate disposed over the display,
wherein at least one of a portion of the housing or the cover substrate comprises the foldable apparatus of any one of claims 80-117.

BRIEF DESCRIPTION OF THE DRAWINGS

The above and other features and advantages of aspects of the present disclosure are better understood when the following detailed description is read with reference to the accompanying drawings, in which:

FIGS. 2-5 are cross-sectional views of the foldable apparatus along line 2-2 of FIG. 1 according to aspects;

FIGS. 13-25 schematically illustrate steps in methods of making a foldable substrate and/or foldable apparatus;

Figure 1:
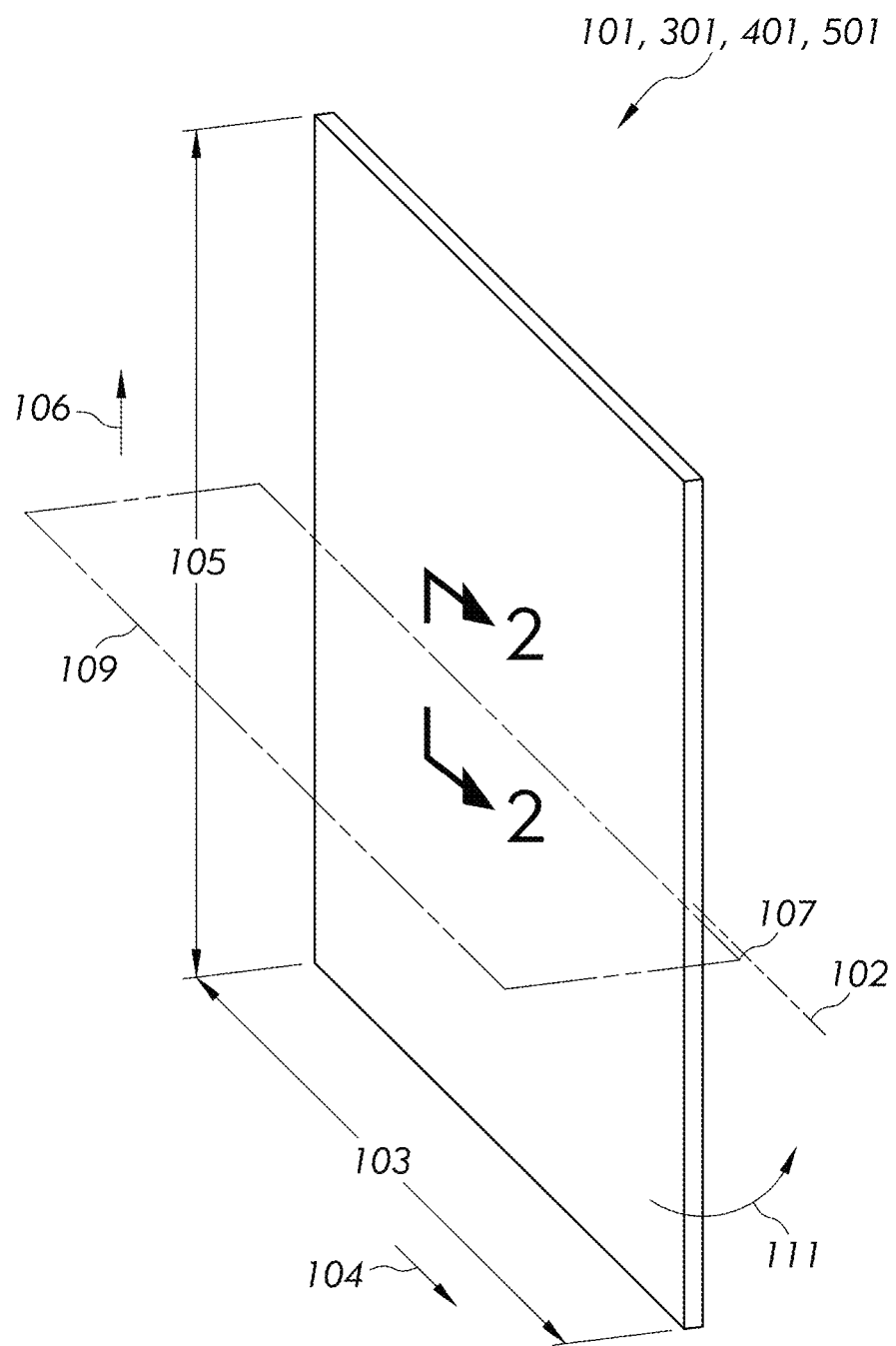
FIG. 1 is a schematic view of an example foldable apparatus in a flat configuration according to aspects, wherein a schematic view of the folded configuration may appear as shown in FIG. 6.

Throughout the disclosure, the drawings are used to emphasize certain aspects. As such, it should not be assumed that the relative size of different regions, portions, and substrates shown in the drawings are proportional to its actual relative size, unless explicitly indicated otherwise.

DETAILED DESCRIPTION

Aspects will now be described more fully hereinafter with reference to the accompanying drawings in which example aspects are shown. Whenever possible, the same reference numerals are used throughout the drawings to refer to the same or like parts.

FIGS. 1-5, 7-8, and 33 illustrate views of foldable apparatus 101, 301, 401, 501, 601, and 801 comprising a foldable substrate 201 in accordance with aspects of the disclosure. Unless otherwise noted, a discussion of features of aspects of one foldable apparatus can apply equally to corresponding features of any aspects of the disclosure. For example, identical part numbers throughout the disclosure can indicate that, in some aspects, the identified features are identical to one another and that the discussion of the identified feature of one aspect, unless otherwise noted, can apply equally to the identified feature of any of the other aspects of the disclosure.

Figure 7:
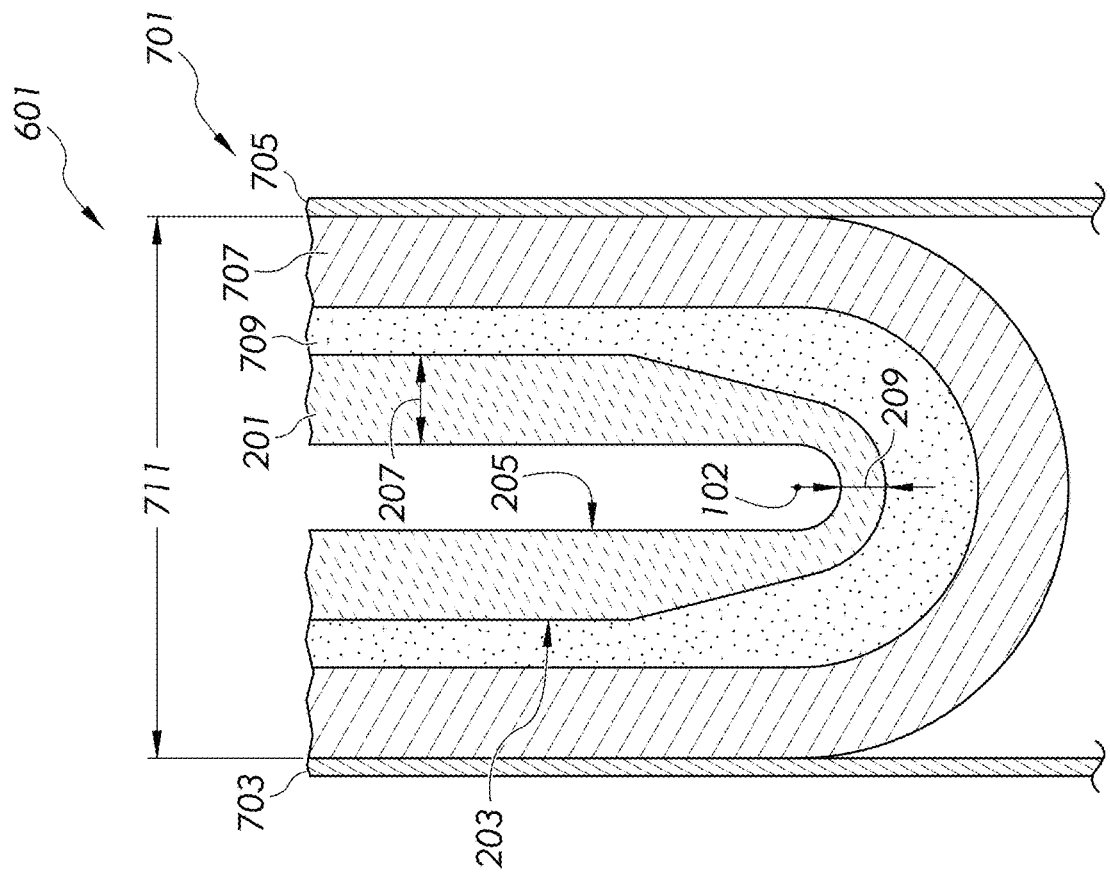
FIGS. 7-8 are cross-sectional views of testing apparatus to determine the minimum parallel plate distance of example foldable apparatus along line 7-7 of FIG. 5.
Figure 8:
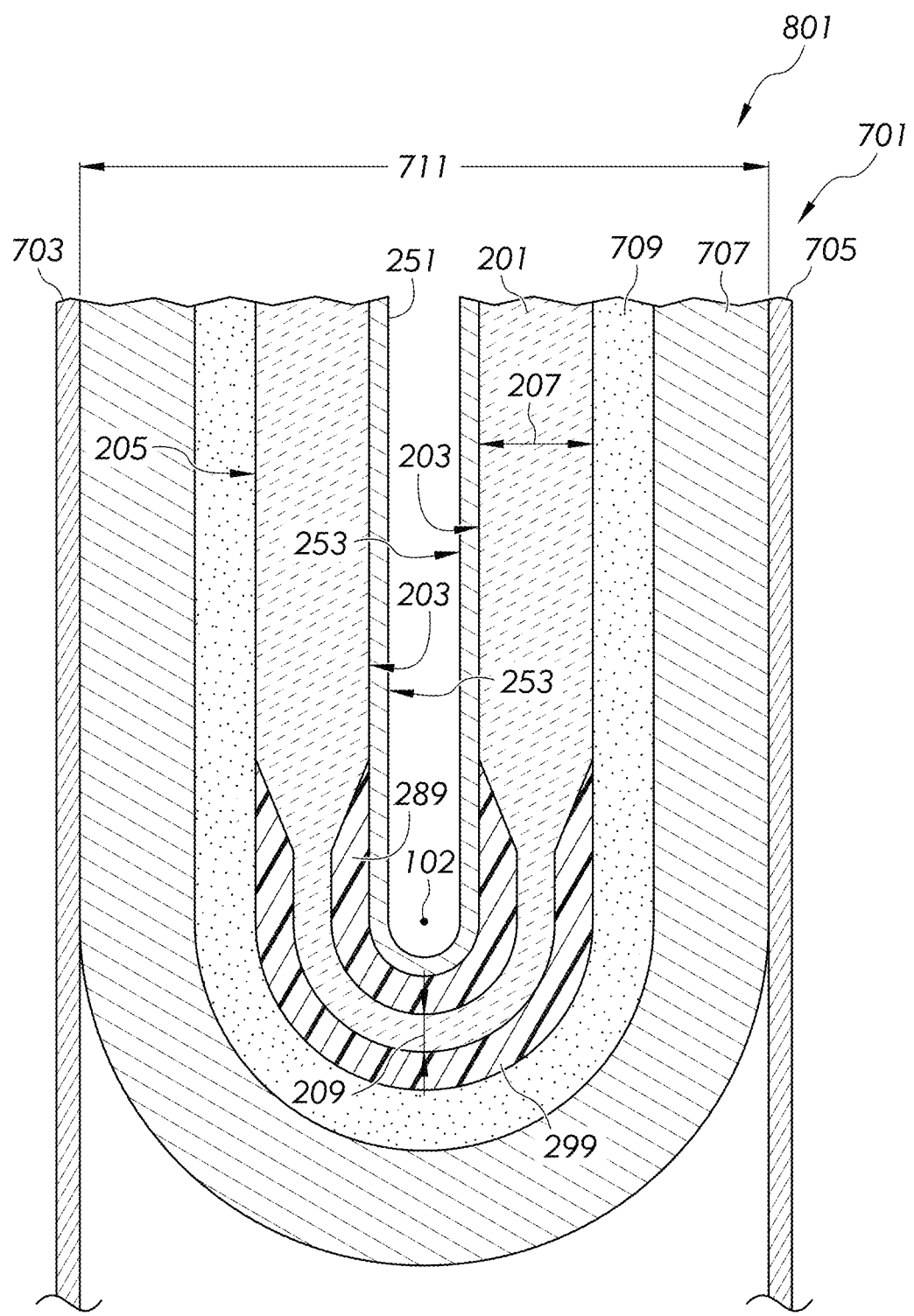

FIGS. 2-5 and 33 schematically illustrate example aspects of foldable apparatus 101, 301, 401, 501, and 3301 comprising the foldable substrate 201 in accordance with aspects of the disclosure in an unfolded (e.g., flat) configuration while FIGS. 7-8 illustrates an example aspect of a foldable apparatus 601 and 801 comprising the foldable substrate 201 in accordance with aspects of the disclosure in a folded configuration.

Figure 2:
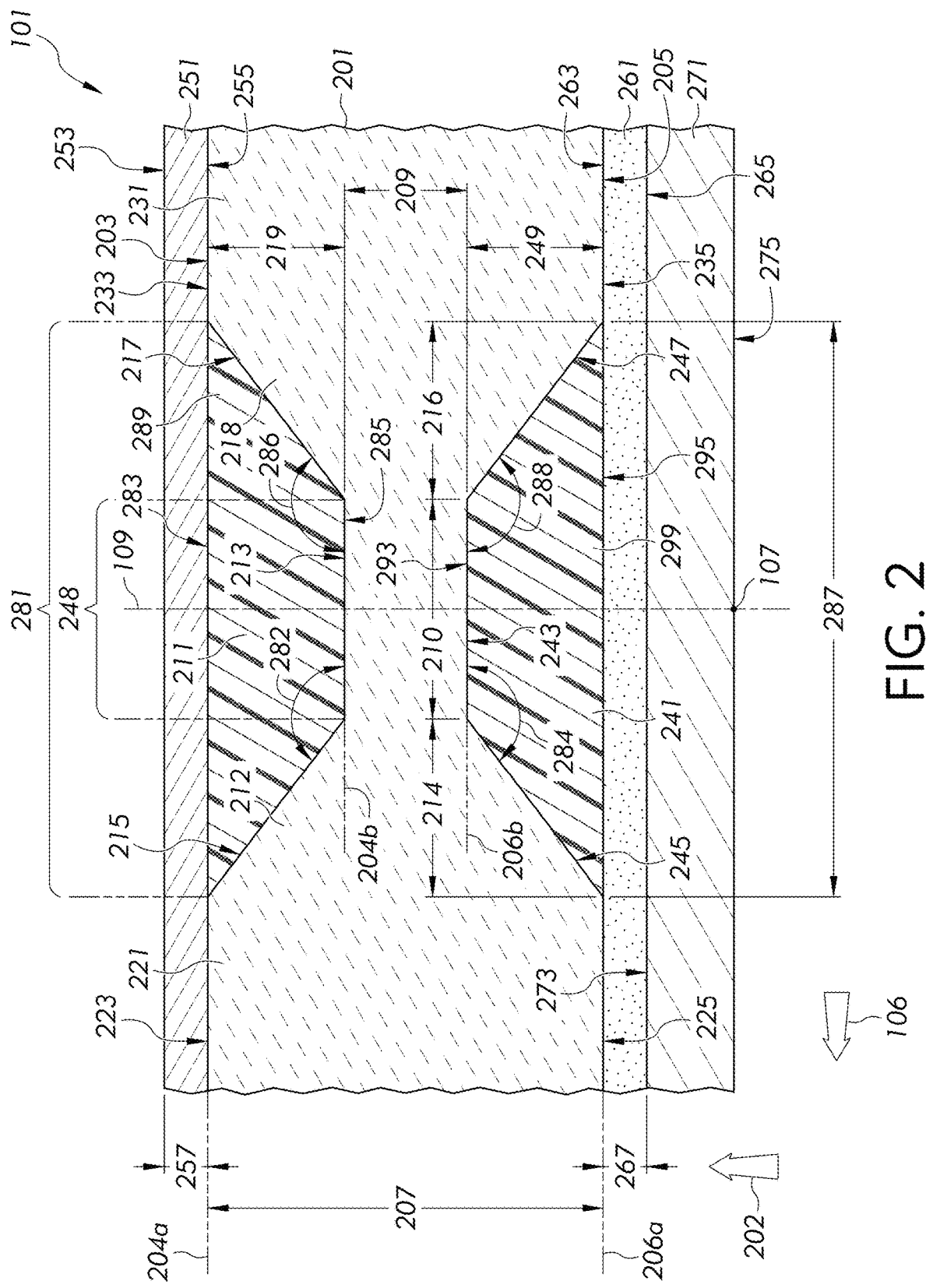
Figure 3:
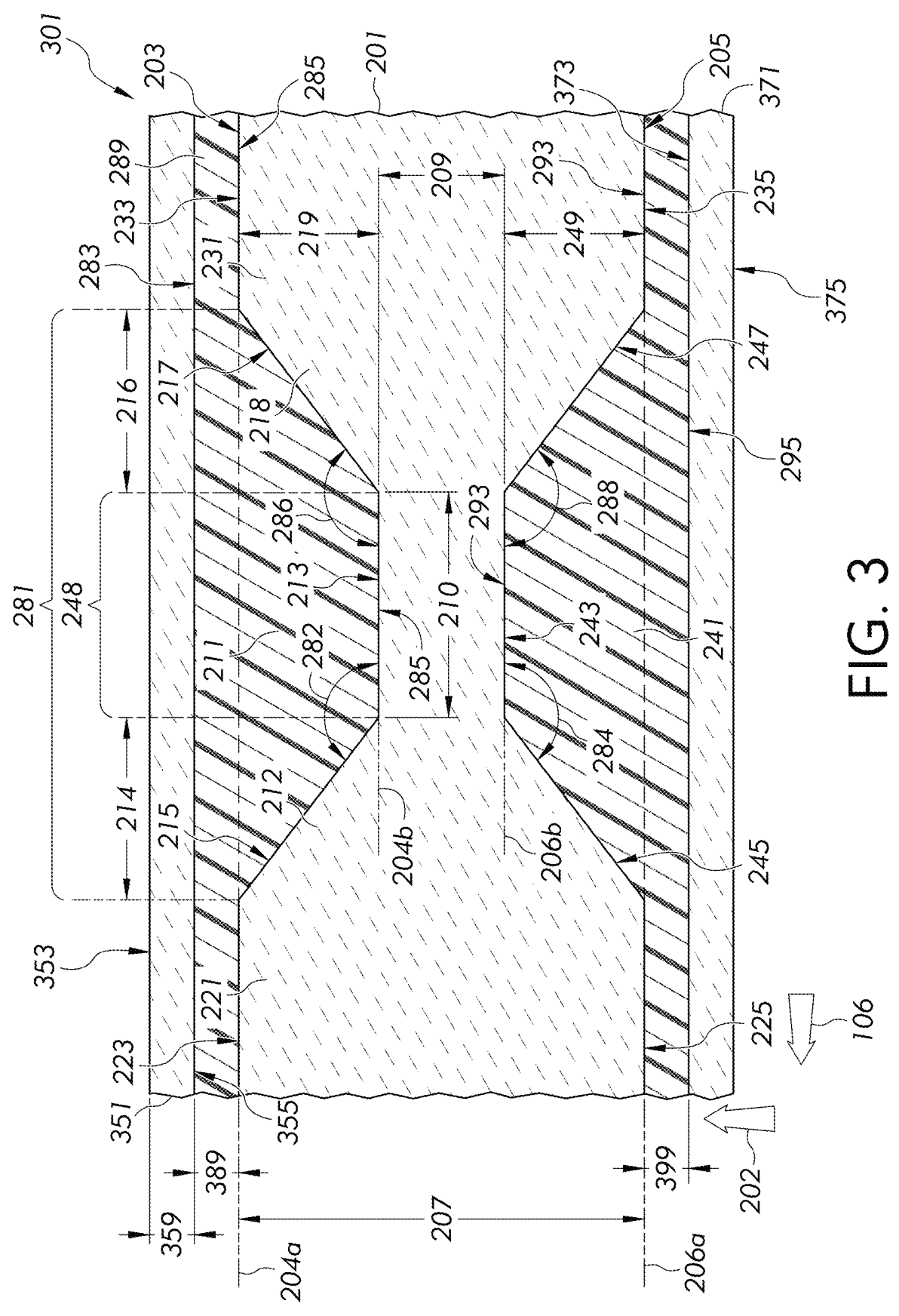
Figure 4:
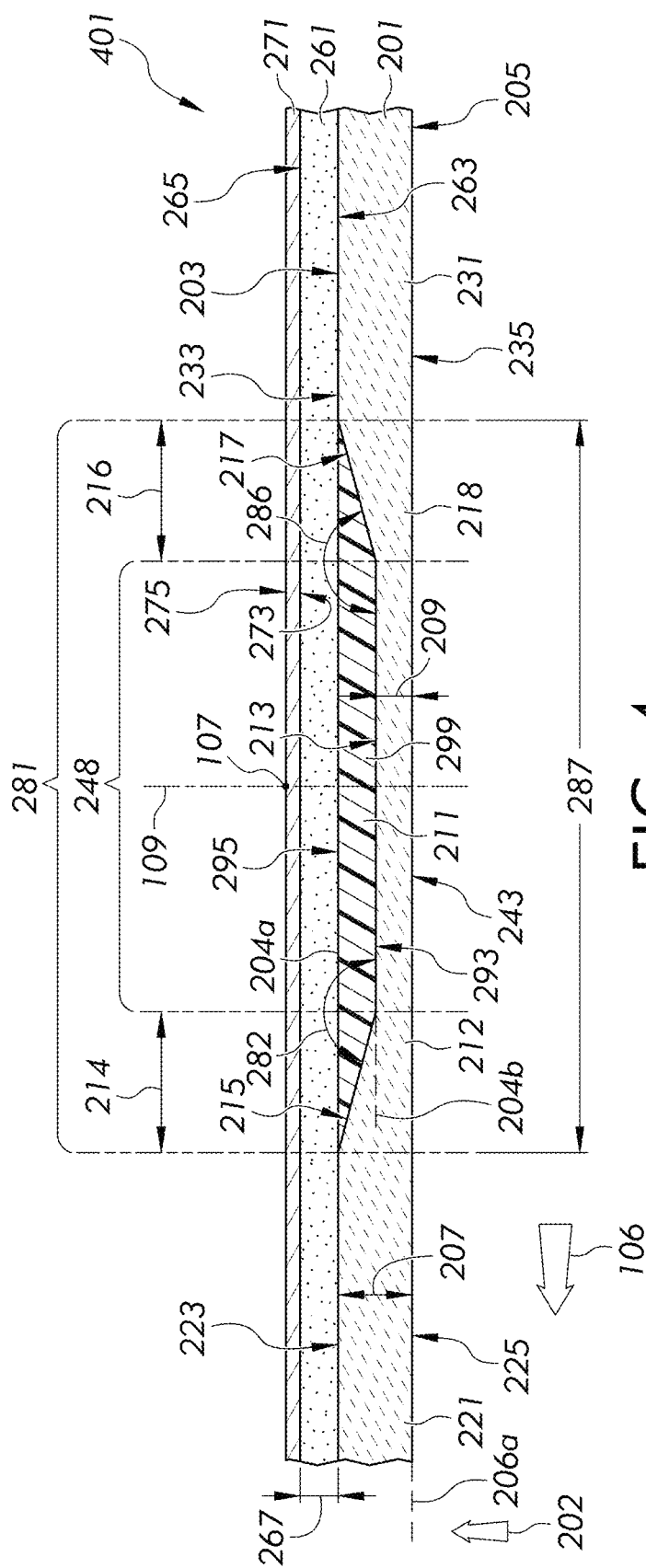
Figure 5:
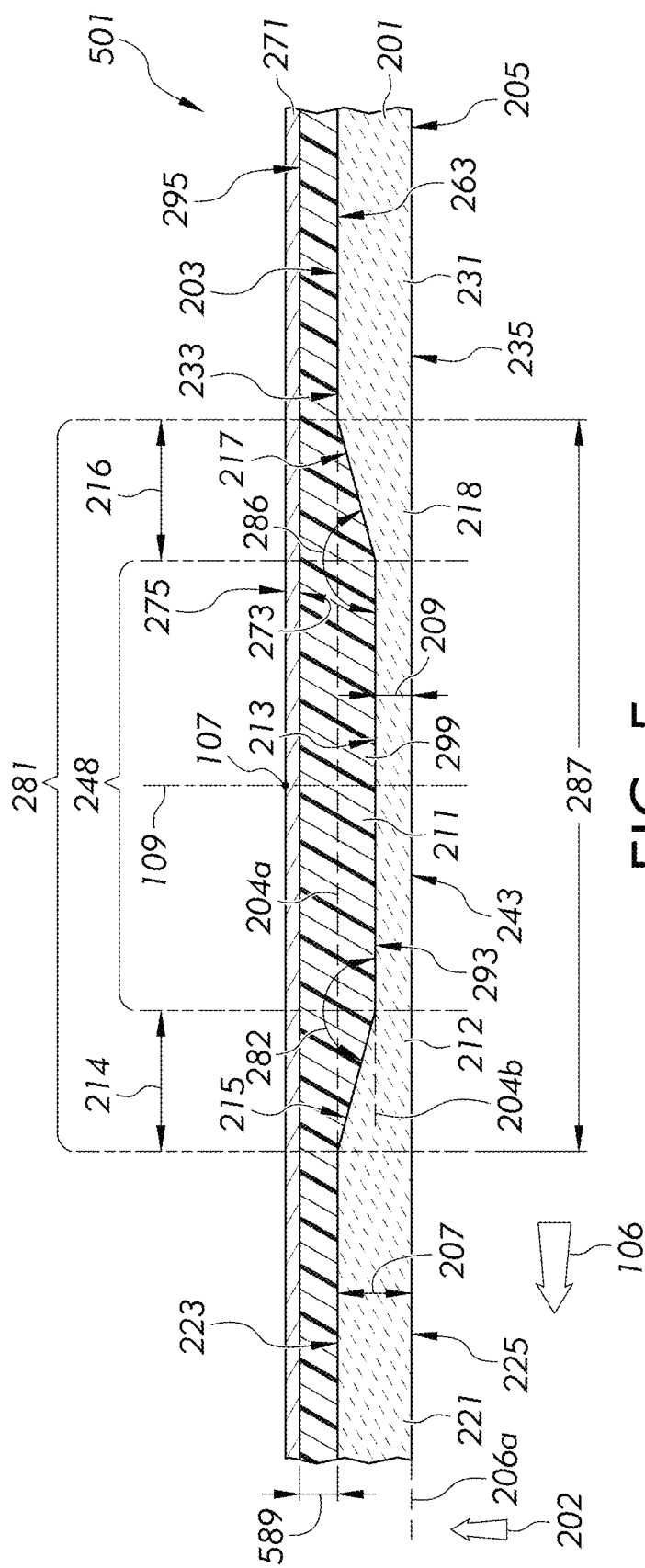

The foldable apparatus 101, 301, 401, 501, and 3301 comprise a first portion 221, a second portion 231, and a central portion 281 positioned between the first portion 221 and the second portion 231. In aspects, as shown in FIGS. 2 and 4-5, the foldable apparatus 101 can comprise a release liner 271 although other substrates (e.g., a glass-based substrate and/or a ceramic-based substrate discussed throughout the application, for example, with reference to FIG. 3) may be used in further aspects rather than with the illustrated release liner 271. In aspects, as shown in FIGS. 2 and 8, the foldable apparatus 101 and 801 can comprise a coating 251. In aspects, as shown in FIG. 3, the foldable apparatus 301 can comprise a cover substrate 351. In aspects, as shown in FIGS. 2 and 4, the foldable apparatus 101 can comprise an adhesive layer 261. In aspects, as shown in FIGS. 2-5 and 7-8, foldable apparatus 101, 301, 401, 601, and 801 can comprise a polymer-based portion 289 and/or 299. As shown in FIGS. 2-5, the foldable substrate 201 can comprise a first recess 211. In aspects, as shown in FIGS. 2-3, the foldable substrate 201 can further comprise a second recess 241. It is to be understood that any of the foldable apparatus of the disclosure can comprise a second substrate (e.g., a glass-based substrate and/or a ceramic-based substrate), a release liner 271, a display device, a coating 251, an adhesive layer 261, and/or a polymer-based portion 289 and/or 299.

Figure 6:
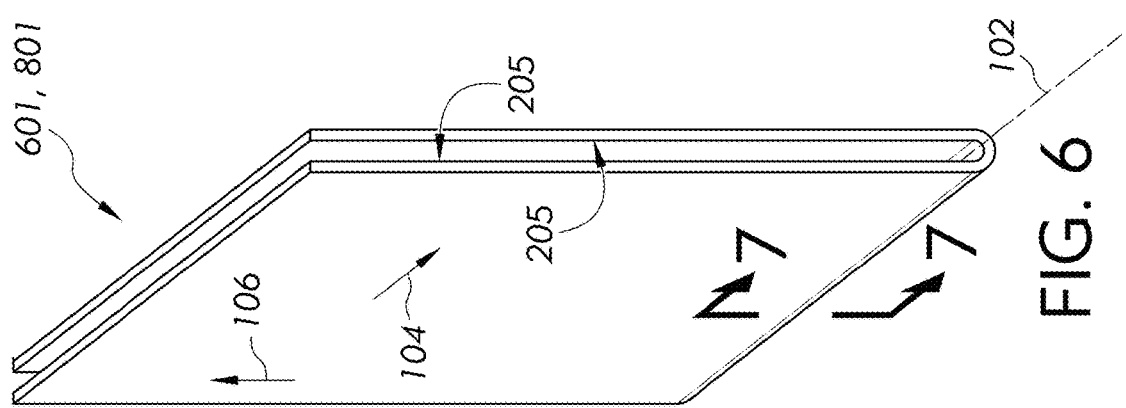
FIG. 6 is a schematic view of example foldable apparatus of aspects of the disclosure in a folded configuration wherein a schematic view of the flat configuration may appear as shown in FIG. 1.

Throughout the disclosure, with reference to FIG. 1, the width 103 of the foldable apparatus 101, 301, 401, 501, 601, and/or 801 is considered the dimension of the foldable apparatus taken between opposed edges of the foldable apparatus in a direction 104 of a fold axis 102 of the foldable apparatus, wherein the direction 104 also comprises the direction of the width 103. Furthermore, throughout the disclosure, the length 105 of the foldable apparatus 101, 301, 401, 501, 601, and/or 801 is considered the dimension of the foldable apparatus 101, 301, 401, 501, 601, and/or 801 taken between opposed edges of the foldable apparatus 101, 301, 401, 501, 601, and/or 801 in a direction 106 perpendicular to the fold axis 102 of the foldable apparatus 101, 301, 401, 501, 601, and/or 801. In aspects, as shown in FIG. 1, the foldable apparatus of any aspects of the disclosure can comprise a fold plane 109 that includes the fold axis 102 when the foldable apparatus is in the flat configuration (e.g., see FIGS. 2 and 4). The fold plane 109 may comprise a central axis 107 of the foldable apparatus. In further aspects, as shown in FIG. 2, the fold plane 109 can extend along the central axis 107 (and/or the fold axis) and in a direction of the substrate thickness 207 when the foldable apparatus is in the flat configuration. In aspects, the foldable apparatus can be folded in a direction 111 (e.g., see FIG. 1) about the fold axis 102 extending in the direction 104 of the width 103 to form a folded configuration (e.g., see FIGS. 6-8). As shown, the foldable apparatus may include a single fold axis to allow the foldable apparatus to comprise a bifold wherein, for example, the foldable apparatus may be folded in half. In further aspects, the foldable apparatus may include two or more fold axes with each fold axis including a corresponding central portion similar or identical to the central portion 281 discussed herein. For example, providing two fold axes can allow the foldable apparatus to comprise a trifold wherein, for example, the foldable apparatus may be folded with the first portion 221, the second portion 231, and a third portion similar or identical to the first portion or second portion with the central portion 281 and another central portion similar to or identical to the central portion positioned between the first portion and the second portion and between the second portion and the third portion, respectively.

The foldable substrate 201 can comprise a glass-based substrate and/or a ceramic-based substrate having a pencil hardness of 8H or more, for example, 9H or more. As used herein, pencil hardness is measured using ASTM D 3363-20 with standard lead graded pencils. Providing a glass-based foldable substrate and/or a ceramic-based foldable substrate can enhance puncture resistance and/or impact resistance.

In aspects, the foldable substrate 201 can comprise a glass-based substrate. As used herein, "glass-based" includes both glasses and glass-ceramics, wherein glass-ceramics have one or more crystalline phases and an amorphous, residual glass phase. A glass-based material (e.g., glass-based substrate) may comprise an amorphous material (e.g., glass) and optionally one or more crystalline materials (e.g., ceramic). Amorphous materials and glass-based materials may be strengthened. As used herein, the term "strengthened" may refer to a material that has been chemically strengthened, for example, through ion exchange of larger ions for smaller ions in the surface of the substrate, as discussed below. However, other strengthening methods, for example, thermal tempering, or utilizing a mismatch of the coefficient of thermal expansion between portions of the substrate to create compressive stress and central tension regions, may be utilized to form strengthened substrates. Exemplary glass-based materials, which may be free of lithia or not, comprise soda lime glass, alkali aluminosilicate glass, alkali-containing borosilicate glass, alkali-containing aluminoborosilicate glass, alkali-containing phosphosilicate glass, and alkali-containing aluminophosphosilicate glass. In aspects, glass-based material can comprise an alkali-containing glass or an alkali-free glass, either of which may be free of lithia or not. In aspects, the glass material can be alkali-free and/or comprise a low content of alkali metals (e.g., $R_2O$ of about 10 mol % or less, wherein $R_2O$ comprises $Li_2O$ $Na_2O$, $K_2O$, or the more expansive list provided below). In one or more aspects, a glass-based material may comprise, in mole percent (mol %): $SiO_2$ in a range from about 40 mol % to about 80%, $Al_2O_3$ in a range from about 5 mol % to about 30 mol %, $B_2O_3$ in a range from 0 mol % to about 10 mol %, $ZrO_2$ in a range from 0 mol % to about 5 mol %, $P_2O_5$ in a range from 0 mol % to about 15 mol %, $TiO_2$ in a range from 0 mol % to about 2 mol %, $R_2O$ in a range from 0 mol % to about 20 mol %, and RO in a range from 0 mol % to about 15 mol %. As used herein, $R_2O$ can refer to an alkali-metal oxide, for example, $Li_2O$, $Na_2O$, $K_2O$, $Rb_2O$, and $Cs_2O$. As used herein, RO can refer to MgO, CaO, SrO, BaO, and ZnO. In aspects, a glass-based substrate may optionally further comprise in a range from 0 mol % to about 2 mol % of each of $Na_2SO_4$, NaCl, NaF, NaBr, $K_2SO_4$, KCl, KF, KBr, $As_2O_3$, $Sb_2O_3$, $SnO_2$, $Fe_2O_3$, MnO, $MnO_2$, $MnO_3$, $Mn_2O_3$, $Mn_3O_4$, $Mn_2O_7$. "Glass-ceramics" include materials produced through controlled crystallization of glass. In aspects, glass-ceramics have about 1% to about 99% crystallinity. Examples of suitable glass-ceramics may include $Li_2O$—$Al_2O_3$—$SiO_2$ system (i.e., LAS-System) glass-ceramics, MgO—$Al_2O_3$—$SiO_2$ system (i.e., MAS-System) glass-ceramics, $ZnO \times Al_2O_3 \times nSiO_2$ (i.e., ZAS system), and/or glass-ceramics that include a predominant crystal phase including β-quartz solid solution, β-spodumene, cordierite, petalite, and/or lithium disilicate. The glass-ceramic substrates may be strengthened using the chemical strengthening processes. In one or more aspects, MAS-System glass-ceramic substrates may be strengthened in $Li_2SO_4$ molten salt, whereby an exchange of $2Li^+$ for $Mg^{2+}$ can occur.

In aspects, the foldable substrate 201 can comprise a ceramic-based substrate. As used herein, "ceramic-based" includes both ceramics and glass-ceramics, wherein glass-ceramics have one or more crystalline phases and an amorphous, residual glass phase. Ceramic-based materials may be strengthened (e.g., chemically strengthened). In aspects, a ceramic-based material can be formed by heating a glass-based material to form ceramic (e.g., crystalline) portions. In further aspects, ceramic-based materials may comprise one or more nucleating agents that can facilitate the formation of crystalline phase(s). In aspects, ceramic-based materials can comprise one or more oxides, nitrides, oxynitrides, carbides, borides, and/or silicides. Example aspects of ceramic oxides include zirconia ($ZrO_2$), zircon ($ZrSiO_4$), an alkali-metal oxide (e.g., sodium oxide ($Na_2O$)), an alkali earth metal oxide (e.g., magnesium oxide (MgO)), titania ($TiO_2$), hafnium oxide ($Hf_2O$), yttrium oxide ($Y_2O_3$), iron oxides, beryllium oxides, vanadium oxide ($VO_2$), fused quartz, mullite (a mineral comprising a combination of aluminum oxide and silicon dioxide), and spinel ($MgAl_2O_4$). Example aspects of ceramic nitrides include silicon nitride ($Si_3N_4$), aluminum nitride (AlN), gallium nitride (GaN), beryllium nitride ($Be_3N_2$), boron nitride (BN), tungsten nitride (WN), vanadium nitride, alkali earth metal nitrides (e.g., magnesium nitride ($Mg_3N_2$)), nickel nitride, and tantalum nitride. Example aspects of oxynitride ceramics include silicon oxynitride, aluminum oxynitride, and a SiAlON (a combination of alumina and silicon nitride and can have a chemical formula, for example, $Si_{12-m-n}Al_{m+n}O_nN_{16-n}$, $Si_{6-n}Al_nO_nN_{8-n}$, or $Si_{2-n}Al_nO_{1+n}N_{2-n}$, where m, n, and the resulting subscripts are all non-negative integers). Example aspects of carbides and carbon-containing ceramics include silicon carbide (SiC), tungsten carbide (WC), an iron carbide, boron carbide ($B_4C$), alkali-metal carbides (e.g., lithium carbide ($Li_4C_3$)), alkali earth metal carbides (e.g., magnesium carbide ($Mg_2C_3$)), and graphite. Example aspects of borides include chromium boride ($CrB_2$), molybdenum boride ($Mo_2B_5$), tungsten boride ($W_2B_5$), iron boride, titanium boride, zirconium boride ($ZrB_2$), hafnium boride ($HfB_2$), vanadium boride ($VB_2$), Niobium boride ($NbB_2$), and lanthanum boride ($LaB_6$). Example aspects of silicides include molybdenum disilicide ($MoSi_2$), tungsten disilicide ($WSi_2$), titanium disilicide ($TiSi_2$), nickel silicide (NiSi), alkali earth silicide (e.g., sodium silicide (NaSi)), alkali-metal silicide (e.g., magnesium silicide ($Mg_2Si$)), hafnium disilicide ($HfSi_2$), and platinum silicide (PtSi).

Throughout the disclosure, a tensile strength, ultimate elongation (e.g., strain at failure), and yield point of a polymeric material (e.g., adhesive, polymer-based portion) is determined using ASTM D638 using a tensile testing machine, for example, an Instron 3400 or Instron 6800, at 23° C. and 50% relative humidity with a type I dogbone shaped sample; an elastic modulus (e.g., Young's modulus) and/or a Poisson's ratio is measured therefrom using ISO 527-1:2019. Throughout the disclosure, the Young's modulus of the glass-based materials and ceramic-based materials are measured using the resonant ultrasonic spectroscopy technique set forth in ASTM E2001-13, titled "Standard Guide for Resonant Ultrasound Spectroscopy for Defect Detection in Both Metallic and Non-metallic Parts." In aspects, the foldable substrate 201 can comprise an elastic modulus of about 1 GigaPascal (GPa) or more, about 3 GPa or more, about 5 GPa or more, about 10 GPa or more, about 100 GPa or less, about 80 GPa or less, about 60 GPa or less, or about 20 GPa or less. In aspects, the foldable substrate 201 can comprise an elastic modulus in a range from about 1 GPa to about 100 GPa, from about 1 GPa to about 80 GPa, from about 3 GPa to about 80 GPa, from about 3 GPa to about 60 GPa, from about 5 GPa to about 60 GPa, from about 5 GPa to about 20 GPa, from about 10 GPa to about 20 GPa, or any range or subrange therebetween. In further aspects, the foldable substrate 201 can comprise a glass-based material or a ceramic-based material comprising an elastic modulus in a range from about 10 GPa to about 100 GPa, from about 40 GPa to about 100 GPa, from about 60 GPa to about 100 GPa, from about 60 GPa to about 80 GPa, from about 80 GPa to about 100 GPa, or any range or subrange therebetween.

In aspects, the foldable substrate 201 can be optically transparent. As used herein, "transparent", "optically transparent", or "optically clear" means an average transmittance of 70% or more in the wavelength range of 400 nm to 700 nm through a 1.0 mm thick piece of a material. In aspects, an "optically transparent material" or an "optically clear material" may have an average transmittance of 75% or more, 80% or more, 85% or more, or 90% or more, 92% or more, 94% or more, 96% or more in the wavelength range of 400 nm to 700 nm through a 1.0 mm thick piece of the material. The average transmittance in the wavelength range of 400 nm to 700 nm is calculated by measuring the transmittance of whole number wavelengths from about 400 nm to about 700 nm and averaging the measurements.

As shown in FIGS. 2-5 and 33, the foldable apparatus 101, 301, 401, 501, and 3301 comprise the foldable substrate 201 comprising a first major surface 203 and a second major surface 205 opposite the first major surface 203. As shown in FIGS. 2-5 and 33, the first major surface 203 can extend along a first plane 204a. The second major surface 205 can extend along a second plane 206a. In aspects, as shown, the second plane 206a can be parallel to the first plane 204a. As used herein, a substrate thickness 207 can be defined between the first major surface 203 and the second major surface 205 as a distance between the first plane 204a and the second plane 206a. In aspects, the substrate thickness 207 can be about 10 micrometers (μm) or more, about 25 μm or more, about 40 μm or more, about 60 μm or more, about 80 μm or more, about 100 μm or more, about 125 μm or more, about 150 μm or more, about 5 millimeters (mm) or less, about 3 mm or less, about 2 mm or less, about 1 mm or less, about 800 μm or less, about 500 μm or less, about 400 μm or less, about 300 μm or less, about 200 μm or less, about 180 μm or less, or about 160 μm or less. In aspects, the substrate thickness 207 can be in a range from about 10 μm to about 5 mm, from about 25 μm to about 5 mm, from about 40 μm to about 5 mm, from about 60 μm to about 5 mm, from about 80 μm to about 5 mm, from about 100 μm to about 3 mm, from about 100 μm to about 2 mm, from about 100 μm to about 1 mm, from about 100 μm to about 800 μm, from about 100 μm to about 500 μm, from about 100 μm to about 400 μm, from about 125 μm to about 300 μm, from about 125 μm to about 200 μm, from about 150 μm to about 200 μm, from about 150 μm to about 160 μm, or any range or subrange therebetween. In exemplary aspects, the substrate thickness 207 can be in a range from about 80 μm to about 5 mm or from about 100 μm to about 400 μm.

As shown in FIGS. 2-5 and 33, the first portion 221 of the foldable substrate 201 can comprise a first surface area 223 and a second surface area 225 opposite the first surface area 223. The first portion 221 will now be described with reference to the foldable apparatus 101 of FIG. 2 with the understanding that such description of the first portion 221, unless otherwise stated, can also apply to any aspects of the disclosure, for example, the foldable apparatus 301, 401, 501, 601, 801, and/or 3301 illustrated in FIGS. 3-5, 7-8, and 33. In aspects, as shown, the first surface area 223 can comprise a planar surface, and/or the second surface area 225 of the first portion 221 can comprise a planar surface. In further aspects, as shown, the second surface area 225 can be parallel to the first surface area 223. In aspects, as shown, the first major surface 203 can comprise the first surface area 223 and the second major surface 205 can comprise the second surface area 225. In further aspects, the first surface area 223 can extend along the first plane 204a. In further aspects, the second surface area 225 can extend along the second plane 206a. In aspects, the substrate thickness 207 can correspond to the distance between the first surface area 223 of the first portion 221 and the second surface area 225 of the first portion 221. In aspects, the substrate thickness 207 can be substantially uniform across the first surface area 223. In aspects, a first thickness defined between the first surface area 223 and the second surface area 225 can be within one or more of the ranges discussed above with regards to the substrate thickness 207. In further aspects, the first thickness can comprise the substrate thickness 207. In further aspects, the first thickness of the first portion 221 may be substantially uniform between the first surface area 223 and the second surface area 225 across its corresponding length (i.e., in the direction 106 of the length 105 of the foldable apparatus) and/or its corresponding width (i.e., in the direction 104 of the width 103 of the foldable apparatus). In further aspects, as shown in FIGS. 2-5 and 33, the first thickness and the second thickness can be substantially equal to the substrate thickness 207.

As shown in FIGS. 2-5 and 33, the second portion 231 of the foldable substrate 201 can comprise a third surface area 233 and a fourth surface area 235 opposite the third surface area 233. The second portion 231 will now be described with reference to the foldable apparatus 101 of FIG. 2 with the understanding that such description of the second portion 231, unless otherwise stated, can also apply to any aspects of the disclosure, for example, the foldable apparatus 301, 401, 501, 601, 801, and/or 3301 illustrated in FIGS. 3-5, 7-8, and 33. In aspects, as shown, the third surface area 233 of the second portion 231 can comprise a planar surface, and/or the fourth surface area 235 of the second portion 231 can comprise a planar surface. In further aspects, the third surface area 233 of the second portion 231 can be in a common plane with the first surface area 223 of the first portion 221. In further aspects, as shown, the fourth surface area 235 can be parallel to the third surface area 233. In further aspects, the fourth surface area 235 of the second portion 231 can be in a common plane with the second surface area 225 of the first portion 221. A second thickness can be defined between the third surface area 233 of the second portion 231 and the fourth surface area 235 of the second portion 231. In aspects, the second thickness can be within the range discussed above with regards to the substrate thickness 207. In further aspects, the second thickness can comprise the substrate thickness 207. In further aspects, as shown, the second thickness can be substantially equal to the substrate thickness 207 (e.g., first thickness). In aspects, the second thickness of the second portion 231 may be substantially uniform between the third surface area 233 and the fourth surface area 235.

As shown in FIGS. 2-5 and 33, the foldable substrate 201 can comprise a central portion 281 positioned between the first portion 221 and the second portion 231. In aspects, the central portion 281 can comprise a first central surface area 213 and a second central surface area 243 opposite the first central surface area 213. As shown, the first central surface area 213 of the central portion 281 can be positioned between the first surface area 223 and the third surface area 233. In further aspects, the first central surface area 213 can correspond to a central region 248 of the central portion 281. In further aspects, as shown, the first central surface area 213 can extend along a third plane 204b when the foldable apparatus 101, 301, and/or 401 is in a flat configuration. A first recess 211 can be defined between the first central surface area 213 (e.g., third plane 204b) and the first plane 204a.

In aspects, the third plane 204b can be substantially parallel to the first plane 204a and/or the second plane 206a. In further aspects, as shown in FIGS. 2-3, the first central surface area 213 can be recessed from the first major surface 203 by a first distance 219 and define the first recess 211. In further aspects, the first distance 219 that the first central surface area 213 is recessed from the first plane 204a can be about 5 μm or more, about 10 μm or more, about 20 μm or more, about 25 μm or more, about 40 μm or more, about 80 μm or more, about 100 μm or more, about 125 μm or more, about 150 μm or more, about 2 mm or less, about 1 mm or less, about 800 μm or less, about 500 μm or less, about 300 μm or less, about 200 μm or less, about 160 μm or less, about 120 μm or less, or about 80 μm or less. In further aspects, the first distance 219 can be in a range from about 5 μm to about 2 mm, from about 5 μm to about 1 mm, from about 10 μm to about 800 μm, from about 20 μm to about 500 μm, from about 25 μm to about 300 μm, from about 40 μm to about 200 μm, from about 80 μm to about 160 μm, from about 100 μm to about 120 μm, or any range or subrange therebetween. In further aspects, the first distance 219 that the first central surface area 213 is recessed from the first plane 204a as a percentage of the substrate thickness 207 can be about 1% or more, about 5% or more, about 10% or more, about 15% or more, about 20% or more, about 25% or more, about 30% or more, about 35% or more, about 40% or more, about 45% or more, about 50% or more, about 55% or more, about 60% or more, about 65% or more, about 70% or more, about 90% or less, about 85% or less, about 80% or less, about 75% or less, about 70% or less, about 65% or less, about 60% or less, about 55% or less, about 50% or less, about 40% or less, about 35% or less, or about 30% or less. In further aspects, the first distance 219 as a percentage of the substrate thickness 207 can be in a range from about 1% to about 90%, from about 5% to about 90%, from about 10% to about 90%, from about 15% to about 85%, from about 20% to about 85%, from about 25% to about 85%, from about 30% to about 85%, from about 40% to about 80%, from about 45% to about 80%, from about 50% to about 80%, from about 55% to about 75%, from about 60% to about 70%, from about 65% to about 70%, or any range or subrange therebetween. In aspects, the first distance 219 as a percentage of the substrate thickness 207 can be in a range from about 1% to about 50%, from about 5% to about 45%, from about 10% to about 40%, from about 15% to about 35%, from about 20% to about 30%, or any range or subrange therebetween. In preferred aspects, the first distance 219 as a percentage of the substrate thickness 207 can be in a range from 1% to 90%, from 20% to 85%, or from 50% to 80%.

As shown in FIGS. 2-5 and 33, the second central surface area 243 of the central portion 281 can be positioned between the second surface area 225 and the fourth surface area 235. In further aspects, as shown in FIGS. 2-3, the second central surface area 243 can extend along a fourth plane 206b when the foldable apparatus 101 and/or 301 is in a flat configuration. In further aspects, as shown in FIGS. 2-3, a second recess 241 can be defined between the second central surface area 243 (e.g., fourth plane 206b) and the second plane 206a. Alternatively, in aspects, as shown in FIG. 4, the second central surface area 243 can extend along the second plane 206a, and/or the second central surface area 243 can be flush with the second major surface 205 (e.g., second surface area 225 and/or fourth surface area 235).

Figure 33:
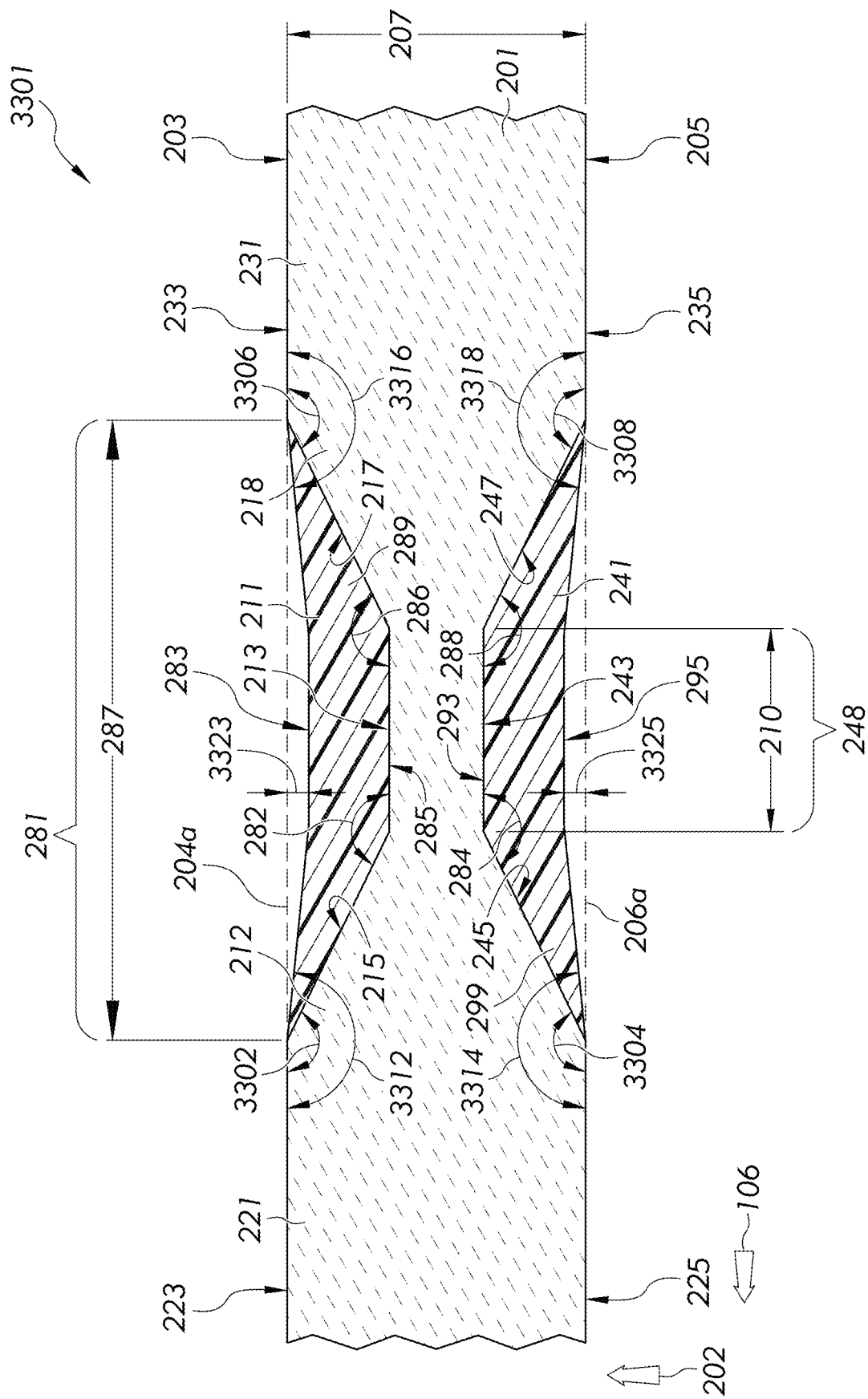
FIG. 33 schematically illustrates a schematic view of example foldable apparatus.

In aspects, as shown in FIGS. 2-3 and 33, the second central surface area 243 can be recessed from the second major surface 205 by a second distance 249 and defined the second recess 241. In further aspects, the second distance 249 can be within one or more of the ranges discussed above for the first distance 219. In further aspects, the first distance can be greater than the second distance. In even further aspects, the second distance 249 that the second central surface area 243 is recessed from the second plane 206a as a percentage of the substrate thickness 207 can be about 1% or more, about 5% or more, about 10% or more, about 12% or more, about 15% or more, about 18% or more, about 20% or more, about 22% or more, about 25% or more, about 27% or more, about 30% or more, about 32% or more, about 35% or more, about 37% or more, about 40% or more, about 50% or less, about 47% or less, about 45% or less, about 42% or less, about 40% or less, about 37% or less, about 35% or less, about 33% or less, about 30% or less, about 25% or less, about 20% or less, about 18% or less, or about 15% or less. In even further aspects, the second distance 249 as a percentage of the substrate thickness 207 can be in a range from about 1% to about 50%, from about 5% to about 50%, from about 10% to about 45%, from about 12% to about 45%, from about 15% to about 45%, from about 18% to about 40%, from about 20% to about 40%, from about 22% to about 37%, from about 25% to about 35%, from about 27% to about 32%, or any range or subrange therebetween. In even further aspects, the second distance 249 as a percentage of the substrate thickness 207 can be in a range from about 1% to about 30%, from about 1% to about 25%, from about 2% to about 25%, from about 5% to about 25%, from about 5% to about 20%, from about 10% to about 20%, from about 10% to about 18%, from about 12% to about 18%, from about 12% to about 15%, or any range or subrange therebetween. In preferred aspects, the second distance 249 that the second central surface area 243 is recessed from the second plane 206a as a percentage of the substrate thickness 207 can be from about 1% to about 50%, from about 20% to about 50%, or from about 30% to about 45%. In further aspects, as shown in FIG. 2, the first distance 219 can be substantially equal to the second distance 249. Providing the first distance substantially equal to the second distance can further reduce the incidence of mechanical instabilities in the central portion, for example, because the foldable substrate is symmetric about a plane comprising a midpoint in the substrate thickness and the central thickness. Alternatively, in further aspects, as shown in FIGS. 4-5, the second central surface area 243 can be coplanar with the second surface area 225 and/or the fourth surface area 235, for example, forming a planar second major surface 205 extending along the second plane 206a.

A central thickness 209 can be defined between the first central surface area 213 and the second central surface area 243, which can be measured as the distance between the third plane 204b and the fourth plane 206b. In aspects, the central thickness 209 can be about 1 μm or more, about 5 μm or more, about 10 μm or more, about 20 μm or more, about 25 μm or more, about 40 μm or more, about 60 μm or more, about 1 mm or less, about 800 μm or less, about 500 μm or less, about 300 μm or less, about 200 μm or less, about 160 μm or less, about 120 μm or less, about 100 μm or less, about 80 μm or less, about 60 μm or less, or about 50 μm or less. In aspects, the central thickness 209 can be in a range from about 1 μm to about 1 mm, from about 5 μm to about 1 mm, from about 10 μm to about 800 μm, from about 10 μm to about 500 μm, from about 20 μm to about 300 μm, from about 20 μm to about 200 μm, from about 25 μm to about 160 μm, from about 25 μm to about 120 μm, from about 25 μm to about 100 μm, from about 25 μm to about 80 μm, from about 40 μm to about 60 μm, or any range or subrange therebetween. In preferred aspects, the central thickness 209 can be in a range from about 10 μm to about 1 mm, from about 20 μm to about 200 μm, or from about 25 μm to about 80 μm. In aspects, the central thickness 209 as a percentage of the substrate thickness 207 can be about 0.5% or more, about 1% or more, about 2% or more, about 5% or more, about 6% or more, about 40% or less, about 35% or less, about 30% or less, about 25% or less, about 20% or less, about 15% or less, about 13% or less, about 10% or less, or about 8% or less. In aspects, the central thickness 209 as a percentage of the substrate thickness 207 can be in a range from about 0.1% to about 40%, from about 0.5% to about 40%, from about 1% to about 35%, from about 2% to about 35%, from about 5% to about 35%, from about 10% to about 30%, from about 13% to about 25%, from about 15% to about 20%, or any range or subrange therebetween. In aspects, the central thickness 209 as a percentage of the substrate thickness 207 can be about 15% or less, for example, in a range from about 0.1% to about 20%, from about 0.5% to about 15%, from about 0.5% to about 13%, from about 1% to about 13%, from about 1% to about 10%, from about 2% to about 10%, from about 2% to about 8%, from about 5% to about 8%, from about 6% to about 8%, or any range or subrange therebetween. In preferred aspects, the central thickness 209 as a percentage of the substrate thickness 207 can be in a range from about 0.5% to about 40%, from about 10% to about 35%, or from about 13% to about 30%. In aspects, the central region 248 of the central portion 281 can correspond to a region comprising the central thickness 209. By providing the first central surface area 213 of the central portion 281 extending along the third plane 204b parallel to the second central surface area 243 of the central portion 281 extending along the fourth plane 206b, a uniform central thickness 209 may extend across the central portion 281 that can provide enhanced folding performance at a predetermined thickness for the central thickness 209. A uniform central thickness 209 across the central portion 281 can improve folding performance by preventing stress concentrations that would occur if a portion of the central portion 281 was thinner than the rest of the central portion 281.

In aspects, as shown in FIGS. 2-5, the central portion 281 of the foldable substrate 201 can comprise a first transition region 212 comprising a first transition surface area 215 extending between the first surface area 223 and the first central surface area 213. In further aspects, as shown, a width (e.g., first transition width 214) of the first transition region 212 can be measured as the minimum distance in a direction 106 of the length 105 (see FIG. 1) between a portion of the first central surface area 213 extending along the third plane 204b and a portion of the first surface area 223. In even further aspects, the first transition width 214 of the first transition region 212 can be about 1.7 mm or more, 2.0 mm or more (e.g., about 2 mm or more), about 2.2 mm or more, about 2.5 mm or more, about 2.7 mm or more, about 3.0 mm or more (e.g., about 3 mm or more), about 3.2 mm or more, about 3.5 mm or more, about 6.0 mm or less (e.g., about 6 mm or less), about 5.5 mm or less, about 5.0 mm or less (e.g., about 5 mm or less), about 4.5 mm or less, about 4.0 mm or less (e.g., about 4 mm or less), about 3.8 mm or less, about 3.5 mm or less, about 3.2 mm or less, about 3.0 mm or less (e.g., about 3 mm or less), about 2.8 mm or less, or about 2.5 mm or less. In even further aspects, the first transition width 214 of the first transition region 212 can be in a range from about 1.7 mm to about 6.0 mm, from about 2.0 mm to about 6.0 mm (e.g., from about 2 mm to about 6 mm), from about 2.0 mm to about 5.5 mm, from about 2.0 mm to about 5.0 mm (e.g., from about 2 mm to about 5 mm), from about 2.0 mm to about 4.5 mm, from about 2.2 mm to about 4.0 mm, about 2.2 mm to about 3.8 mm, from about 2.5 mm to about 3.5 mm, from about 2.5 mm to about 3.2 mm, from about 2.7 mm to about 3.0 mm, or any range or subrange therebetween. In even further aspects, the first transition width 214 of the first transition region 212 can be in a range from about 2.5 mm to about 6.0 mm, from about 2.5 mm to about 5.5 mm, from about 2.5 mm to about 5.0 mm, from about 2.7 mm to about 4.5 mm, from about 3.0 mm to about 4.0 mm, from about 3.0 mm to about 3.7 mm, from about 3.2 mm to about 3.5 mm, or any range or subrange therebetween. In preferred aspects, the first transition width 214 of the first transition region 212 can be in a range from about 2 mm to about 6 mm, from about 2.2 mm to about 4 mm, or from about 2.5 mm to about 3.5 mm. Providing a transition width from about 2 mm to about 6 mm (e.g., from about 2.2 mm to about 4 mm, or from about 2.5 mm to about 3.5 mm) for the first transition region and/or the second transition region can decrease a visibility of the transition region (e.g., enable a lower contrast ratio and/or produce a transition region that is invisible to the naked eye).

In aspects, as shown in FIGS. 2-3 and 33, the first transition region 212 can comprise a second transition surface area 245 extending between the second surface area 225 and the second central surface area 243. In further aspects, a width of the second transition surface area 245 can be measured as the minimum distance in a direction 106 of the length 105 (see FIG. 1) between a portion of the second central surface area 243 extending along the fourth plane 206b and a portion of the second surface area 225. In even further aspects, the width of the second transition surface area 245 can be substantially equal to (e.g., equal to) the first transition width 214 of the first transition region 212. In aspects, as shown in FIG. 4, the portion of the first transition region 212 extending between the second surface area 225 and the second central surface area 243 can be coplanar with one or both surface areas.

In aspects, as shown in FIGS. 2-5 and 33, a thickness of the first transition region 212 can decrease between the substrate thickness 207 of the first portion 221 and the central thickness 209 of the central portion 281. In further aspects, as shown, a thickness of the first transition region 212 can smoothly decrease, monotonically decrease, and/or smoothly and monotonically decrease between the substrate thickness 207 of the first portion 221 and the central thickness 209 of the central portion 281. As used herein, a thickness decreases smoothly if changes in the cross-sectional area are smooth (e.g., gradual) rather than abrupt (e.g., step) changes in thickness. As used herein, a thickness decreases monotonically in a direction if the thickness decreases for a portion and for the rest of the time either stays the same, decreases, or a combination thereof (i.e., the thickness decreases but never increases in the direction). Providing a smooth shape of the first transition region and/or the second transition region can reduce optical distortions. Providing a monotonically decreasing thickness of the first transition region and/or the second transition region can reduce an incidence of mechanical instabilities and/or decrease a visibility of the transition region.

In aspects, as shown in FIGS. 2-5 and 33, the first transition surface area 215 can comprise a linearly inclined surface extending between the first central surface area 213 and the first surface area 223. In aspects, although not shown, the first transition surface area can comprise a concave up shape, for example, with a local slope of the first transition surface area smoothly transitioning to a slope of the first central surface area 213 while a local slope of the first transition surface area is substantially different from a slope of the first surface area 223. In aspects, although not shown, the first transition surface area can comprise a sigmoid shape. In aspects, although not shown, a local slope of the first transition surface area can be greater at a midpoint of the first transition surface area than where the first transition surface area meets the first central surface area 213 and where the first transition surface area meets the first surface area 223. In aspects, although not shown, the first transition surface area can comprise a convex up shape, for example, with a local slope of the first transition surface area smoothly transitioning to a slope of the first surface area 223 while a local slope of the first transition surface area is substantially different from a slope of the first central surface area 213. In aspects, the second transition surface area can comprise one of the shapes or properties discussed above in this paragraph for the first transition surface area. For example, as shown in FIG. 2, the second transition surface area 245 can comprise a linearly inclined surface extending between the second central surface area 243 and the second surface area 225.

In aspects, as shown in FIGS. 2-5 and 33, a thickness of the first transition region 212 can decrease at a constant rate (e.g., linearly change) from the substrate thickness 207 to the central thickness 209. In aspects, although not shown, a thickness of the first transition region can decrease slower where the first transition surface area meets the first central surface area 213 than at a midpoint of the first transition region and/or than where the first transition surface area meets the first surface area 223 (e.g., first portion 221). In aspects, although not shown, a thickness of the first transition region can decrease faster where the first transition surface area meets the first central surface area 213 than at a midpoint of the first transition region and/or than where the first transition surface area meets the first surface area 223. Providing a non-uniform slope of a surface area of the first transition region and/or the second transition region can reduce an amount of the corresponding transition region comprising intermediate thicknesses, for example, comprising a chemical strengthening induced expansion strain less than a portion of the corresponding transition region closer to the first central surface area and/or the second central surface area and/or than the first central surface area and/or the second central surface area.

Throughout the disclosure, an "average angle" of a transition surface area relative to a central surface area is measured as an angle between a transition surface area and a central surface area. An "average angle" is calculated for a location on the corresponding transition surface area relative to the corresponding central surface area with the location of the corresponding central surface area approximated as a plane fitted from measurements at 20 locations evenly spaced over the corresponding central surface area in the direction 106 of the length 105. The "average angle" measured is an external angle for the foldable substrate, meaning that it extends from the plane fitted to the corresponding central surface area to the location on the corresponding transition surface area without passing through the material of the foldable substrate other than an incidental amount at the endpoints.

The average angle is calculated from 10 locations on the corresponding transition surface area that are located in a region comprising 80% of a distance that the corresponding central surface area is recessed from the corresponding major surface with the region centered at the midpoint between the corresponding central surface area and the corresponding major surface in the direction 202 of the thickness (e.g., substrate thickness 207, central thickness 209).

In aspects, as shown in FIGS. 2-5 and 33, the first transition surface area 215 of the first transition region 212 extends between the first surface area 223 and the first central surface area 213 with a first average angle 282 relative to the first central surface area 213. As described above, the first average angle 282 is an external angle because it does not pass through the material of the foldable substrate 201 other than an incidental amount at the endpoints. In further aspects, the first average angle 282 can be about 176.0° or more, about 176.1° or more, about 176.3° or more, about 176.5° or more, about 176.7° or more, about 177.0° or more, about 177.1° or more, 177.2° or more, about 177.3° or more, about 177.4° or more, about 177.5° or more, about 177.6° or more, 177.7° or more, about 177.8° or more, about 179.9° or less, about 179.7° or less, about 179.5° or less, about 179.3° or less, about 179.0° or less, about 178.7° or less, about 178.5° or less, about 178.3° or less, about 178.0° or less, about 177.7° or less, about 177.5° or less, about 177.3° or less, or about 177.0° or less. In further aspects, the first average angle 282 can be in a range from about 176.0° to about 179.9°, from about 176.10 to about 179.9°, from about 176.3° to about 179.7°, from about 176.5° to about 179.7°, from about 176.7° to about 179.5°, from about 177.0° to about 179.5°, from about 177.10 to about 179.3°, from about 177.2° to about 179.3°, from about 177.3° to about 179.0°, from about 177.4° to about 178.7°, from about 177.5° to about 178.5°, from about 177.6° to about 178.3°, from about 177.7° to about 178.0°, or any range or subrange therebetween. In further aspects, the first average angle 282 can be about 177.0° or more, for example in a range from about 177.0° to about 179.9°, from about 177.10 to about 179.7°, from about 177.2° to about 179.5°, from about 177.3° to about 179.3°, from about 177.4° to about 179.0°, from about 177.5° to about 178.7°, from about 177.6° to about 178.5°, from about 177.7° to about 178.3, or any range or subrange therebetween. For example, a first transition surface comprising a linear (e.g., planar) surface area with a first transition width of 1.0 mm and height (i.e., a difference between the first central surface area 213 and the first major surface 203 corresponding to the first distance 219) of 70 µm corresponds to a first average angle of about 176.1°. In further aspects, when the foldable substrate 201 comprises a first recess 211 and a second recess 241 opposite the first recess 211 (see FIGS. 2-3 and 33), the first average angle 282 can be in a range from about 177.0° to about 179.9°, from about 177.10 to 179.5°, or from about 177.2° to about 179.3°. In further aspects, when the foldable substrate 201 comprises a first recess 211 and the second central surface area 243 is flush with the second major surface 205 (see FIGS. 4-5), the first average angle 282 can be in a range from about 176.1° to about 179.9°, from about 176.3° to 179.7°, or from about 176.5° to about 179.5°. As discussed herein, providing a first average angle from about 176.10 to about 179.9° or from about 177.0° to about 179.9° can decrease a visibility of the transition region (e.g., enable a lower contrast ratio and/or produce a transition region that is invisible to the naked eye).

In aspects, as shown in FIGS. 2-3 and 33, the third transition surface area 217 of the second transition region 218 extends between the third surface area 233 and the first central surface area 213 with a third average angle 286 relative to the first central surface area 213. In further aspects, the third average angle 286 can be within one or more of the ranges discussed above for the first average angle 282. In further aspects, the first average angle 282 can be substantially equal to the third average angle 286.

In aspects, as shown in FIGS. 2-5 and 33, the central portion 281 of the foldable substrate 201 can comprise a second transition region 218 comprising a third transition surface area 217 extending between the third surface area 233 and the first central surface area 213. In further aspects, as shown, a width (e.g., second transition width 216) of the second transition region 218 can be measured as the minimum distance in a direction 106 of the length 105 (see FIG. 1) between a portion of the first central surface area 213 extending along the third plane 204*b* and a portion of the third surface area 233. In even further aspects, the second transition width 216 of the second transition region 218 can be within one or more of the ranges discussed above for the first transition width 214. In still further aspects, the second transition width 216 of the second transition region 218 can be substantially equal to (e.g., equal to) the first transition width 214.

In aspects, as shown in FIGS. 2-3 and 33, the second transition region 218 can comprise a fourth transition surface area 247 extending between the fourth surface area 235 and the second central surface area 243. In further aspects, a width of the fourth transition surface area 247 can be measured as the minimum distance in a direction 106 of the length 105 (see FIG. 1) between a portion of the second central surface area 243 extending along the fourth plane 206b and a portion of the fourth surface area 235. In even further aspects, the width of the fourth transition surface area 247 can be substantially equal to (e.g., equal to) the second transition width 216. In aspects, as shown in FIGS. 2-3 and 33, a thickness of the second transition region 218 can decrease between the substrate thickness 207 of the second portion 231 and the central thickness 209 of the central portion 281. In further aspects, as shown, a thickness of the first transition region 212 can smoothly decrease, monotonically decrease, or smoothly and monotonically decrease between the substrate thickness 207 of the second portion 231 and the central thickness 209 of the central portion 281. In aspects, as shown in FIG. 4, the portion of the second transition region 218 extending between the fourth surface area 235 and the second central surface area 243 can be coplanar with one or both surface areas.

In aspects, as shown in FIGS. 2-5 and 33, the third transition surface area 217 can comprise a linearly inclined surface extending between the first central surface area 213 and the third surface area 233. In aspects, the third transition surface area 217 and/or the fourth transition surface area 247 can comprise one of the shapes or properties discussed above with reference to the first transition surface area. In aspects, the fourth transition surface area 247 can comprise one of the shapes or properties discussed above in this paragraph for the first transition surface area. For example, as shown in FIGS. 2-5 and 33, the fourth transition surface area 247 can comprise a linearly inclined surface extending between the second central surface area 243 and the fourth surface area 235. In aspects, as shown in FIGS. 2-5 and 33, a thickness of the second transition region 218 can decrease at a constant rate (e.g., linearly change) from the substrate thickness 207 to the central thickness 209. In aspects, although not shown, a thickness of the second transition region can decrease slower where the third transition surface area meets the first central surface area 213 than at a midpoint of the second transition region and/or than where the third transition surface area meets the third surface area 233 (e.g., first portion 221). In aspects, although not shown, a thickness of the second transition region can decrease faster where the third transition surface area meets the first central surface area 213 than at a midpoint of the second transition region and/or than where the third transition surface area meets the third surface area 233.

In aspects, as shown in FIGS. 2-3 and 33, the second transition surface area 245 of the first transition region 212 extends between the second surface area 225 and the second central surface area 243 with a second average angle 284 relative to the second central surface area 243. In further aspects, the second average angle 284 can be within one or more of the ranges discussed above for the first average angle 282. In further aspects, the first average angle 282 can be substantially equal to the second average angle 284. Providing an average angle within one of the above-mentioned ranges can provide reduced visibility of the transition region.

In aspects, as shown in FIGS. 2-3 and 33, the fourth transition surface area 247 of the second transition region 218 extends between the fourth surface area 235 and the second central surface area 243 with a fourth average angle 288 relative to the second central surface area 243. In further aspects, the fourth average angle 288 can be within one or more of the ranges discussed above for the second average angle 284. In further aspects, the second average angle 284 can be substantially equal to the fourth average angle 288. In further aspects, the first average angle 282 and/or the third average angle 286 can be substantially equal to the fourth average angle 288.

Throughout the disclosure, a "surface angle" of a transition surface area relative to a major surface is measured as an angle between a transition surface area and a central surface area. The "surface angle" is calculated for a location on the corresponding transition surface area relative to the corresponding major surface with the location of the corresponding major surface approximated as a plane fitted from measurements at 20 locations evenly spaced over the corresponding major surface in the direction 106 of the length 105. The "surface angle" measured is an internal angle for the foldable substrate, meaning that it extends from the plane fitted to the corresponding major surface to the location on the corresponding transition surface area without leaving the material of the foldable substrate other than an incidental amount at the endpoints. The average angle is calculated from 10 locations on the corresponding transition surface area that are located in a region comprising 80% of a distance that the corresponding central surface area is recessed from the corresponding major surface with the region centered at the midpoint between the corresponding central surface area and the corresponding major surface in the direction 202 of the thickness (e.g., substrate thickness 207, central thickness 209).

In aspects, as shown in FIG. 33, a first surface angle 3302 is defined between the first transition surface area 215 of the first transition region 212 and the first major surface 203 (e.g., first surface area 223, first plane 204a). In aspects, as shown in FIG. 33, a third surface angle 3306 is defined between the third transition surface area 217 of the second transition region 218 and the first major surface 203 (e.g., third surface area 233, first plane 204a). In aspects, the first surface angle 3302 and/or the third surface angle 3306 can be within one or more of the ranges discussed above for the first average angle 282. In aspects, the first surface angle 3302 can be substantially equal to the first average angle 282. In aspects, the first surface angle 3302 can be substantially equal to the third surface angle 3306.

In aspects, as shown in FIG. 33, a second surface angle 3304 is defined between the second transition surface area 245 of the first transition region 212 and the second major surface 205 (e.g., second surface area 225, second plane 206a). In aspects, as shown in FIG. 33, a fourth surface angle 3308 is defined between the fourth transition surface area 247 of the second transition region 218 and the second major surface 205 (e.g., fourth surface area 235, second plane 206a). In aspects, the second surface angle 3304 and/or the fourth surface angle 3308 can be within one or more of the ranges discussed above for the first average angle 282. In aspects, the second surface angle 3304 can be substantially equal to the first average angle 282. In aspects, the second surface angle 3304 can be substantially equal to the first surface angle 3302. In aspects, the second surface angle 3304 can be substantially equal to the second average angle 284. In aspects, the second surface angle 3304 can be substantially equal to the fourth surface angle 3308.

As used herein, if a first layer and/or component is described as "disposed over" a second layer and/or component, other layers may or may not be present between the first layer and/or component and the second layer and/or component. Furthermore, as used herein, "disposed over" does not refer to a relative position with reference to gravity. For example, a first layer and/or component can be considered "disposed over" a second layer and/or component, for example, when the first layer and/or component is positioned underneath, above, or to one side of a second layer and/or component. As used herein, a first layer and/or component described as "bonded to" a second layer and/or component means that the layers and/or components are bonded to each other, either by direct contact and/or bonding between the two layers and/or components or via an adhesive layer. As used herein, a first layer and/or component described as "contacting" or "in contact with" a second layer and/or components refers to direct contact and includes the situations where the layers and/or components are bonded to each other.

As shown in FIGS. 2 and 4, the foldable apparatus 101 can comprise an adhesive layer 261. As shown, the adhesive layer 261 can comprise a first contact surface 263 and a second contact surface 265 that can be opposite the first contact surface 263. In aspects, as shown in FIGS. 2 and 4, the second contact surface 265 of the adhesive layer 261 can comprise a planar surface. In aspects, as shown in FIGS. 2 and 4, the first contact surface 263 of the adhesive layer 261 can comprise a planar surface. An adhesive thickness 267 of the adhesive layer 261 can be defined as a minimum distance between the first contact surface 263 and the second contact surface 265. In aspects, the adhesive thickness 267 of the adhesive layer 261 can be about 1 μm or more, about 5 μm or more, about 10 μm or more, about 100 μm or less, about 60 μm or less, about 30 μm or less, or about 20 μm or less. In aspects, the adhesive thickness 267 of the adhesive layer 261 can be in a range from about 1 μm to about 100 μm, from about 5 μm to about 100 μm, from about 5 μm to about 60 μm, from about 5 μm to about 30 μm, from about 10 μm to about 30 μm, from about 10 μm to about 20 μm, or any range or subrange therebetween.

In aspects, as shown in FIGS. 2 and 4, the second contact surface 265 of the adhesive layer 261 can face and/or contact the first major surface 273 of a release liner 271 (described below). In aspects, as shown in FIG. 2, the first contact surface 263 of the adhesive layer 261 can face and/or contact the second surface area 225 of the first portion 221. In aspects, as shown in FIG. 2, the first contact surface 263 of the adhesive layer 261 can face and/or contact the fourth surface area 235 of the second portion 231. In aspects, as shown in FIG. 2, the first contact surface 263 of the adhesive layer 261 can face the second central surface area 243 of the central portion 281. In aspects, as shown in FIG. 4, the first contact surface 263 of the adhesive layer 261 can face and/or contact the first surface area 223 of the first portion 221. In aspects, as shown in FIG. 4, the first contact surface 263 of the adhesive layer 261 can face and/or contact the third surface area 233 of the second portion 231. In aspects, as shown in FIG. 4, the first contact surface 263 of the adhesive layer 261 can face the first central surface area 213 of the central portion 281. In aspects, as shown in FIG. 2, the first contact surface 263 of the adhesive layer 261 can face the second central surface area 243 of the central portion 281. In further aspects, although not shown, the first contact surface 263 of the adhesive layer 261 can contact the second central surface area 243 of the central portion 281, for example by filling the region (e.g., second recess 241) indicated as occupied by the second polymer-based portion 299 in FIG. 2. In aspects, although not shown, the second recess may not be totally filled, for example, to leave room for electronic devices and/or mechanical devices. In aspects, although not shown, the foldable substrate 201 of FIG. 4 can be configured with the adhesive layer 261 contacting the second major surface 205 rather than the first major surface 203 while the second polymer-based portion 299 or a coating 251 in place of the second polymer-based portion 299 can be positioned at least partially in the first recess 211.

In aspects, the adhesive layer 261 can comprise one or more of a polyolefin, a polyamide, a halide-containing polymer (e.g., polyvinylchloride or a fluorine-containing polymer), an elastomer, a urethane, phenolic resin, parylene, polyethylene terephthalate (PET), and polyether ether ketone (PEEK). Example aspects of polyolefins include low molecular weight polyethylene (LDPE), high molecular weight polyethylene (HDPE), ultrahigh molecular weight polyethylene (UHMWPE), and polypropylene (PP). Example aspects of fluorine-containing polymers include polytetrafluoroethylene (PTFE), polyvinylfluoride (PVF), polyvinylidene fluoride (PVDF), perfluoropolyether (PFPE), perfluorosulfonic acid (PFSA), a perfluoroalkoxy (PFA), fluorinated ethylene propylene (FEP) polymers, and ethylene tetrafluoro ethylene (ETFE) polymers. Example aspects of elastomers include rubbers (e.g., polybutadiene, polyisoprene, chloroprene rubber, butyl rubber, nitrile rubber) and block copolymers (e.g., styrene-butadiene, high-impact polystyrene, poly(dichlorophosphazene). In further aspects, the adhesive layer 261 can comprise an optically clear adhesive. In even further aspects, the optically clear adhesive can comprise one or more optically transparent polymers: an acrylic (e.g., polymethylmethacrylate (PMMA)), an epoxy, silicone, and/or a polyurethane. Examples of epoxies include bisphenol-based epoxy resins, novolac-based epoxies, cycloaliphatic-based epoxies, and glycidylamine-based epoxies. In even further aspects, the optically clear adhesive can comprise, but is not limited to, acrylic adhesives, for example, 3M 8212 adhesive, or an optically transparent liquid adhesive, for example, a LOCTITE optically transparent liquid adhesive. Exemplary aspects of optically clear adhesives comprise transparent acrylics, epoxies, silicones, and polyurethanes. For example, the optically transparent liquid adhesive could comprise one or more of LOCTITE AD 8650, LOCTITE AA 3922, LOCTITE EA E-05MR, LOCTITE UK U-09LV, which are all available from Henkel.

In aspects, the adhesive layer 261 can comprise an elastic modulus of about 0.001 MegaPascals (MPa) or more, about 0.01 MPa or more, about 0.1 MPa or more, about 1 MPa or less, about 0.5 MPa or less, about 0.1 MPa or less, or about 0.05 MPa or less. In aspects, the adhesive layer 261 can comprise an elastic modulus in a range from about 0.001 MPa to about 1 MPa, from about 0.01 MPa to about 1 MPa, from about 0.01 MPa to about 0.5 MPa, from about 0.05 MPa to about 0.5 MPa, from about 0.1 MPa to about 0.5 MPa, from about 0.001 MPa to about 0.5 MPa, from about 0.001 MPa to about 0.01 MPa, or any range or subrange therebetween. In aspects, the adhesive layer can comprise an elastic modulus within one or more of the ranges discussed below for the elastic modulus of the polymer-based portions 289 and/or 299.

As shown in FIGS. 2-5 and 33, the polymer-based portion 289 and/or 299 of the foldable apparatus 101 can be positioned between the first portion 221 and the second portion 231. In aspects, as shown, the polymer-based portion can comprise a first polymer-based portion 289 at least partially positioned in and/or filling the first recess 211. In aspects, as shown in FIGS. 2-3 and 33, the polymer-based portion can comprise a second polymer-based portion 299 at least partially positioned in and/or filling the second recess 241. In aspects, as shown in FIGS. 4-5, the polymer-based portion can comprise a second polymer-based portion 299 at least partially positioned in and/or filling the first recess 211. In aspects, although not shown, the second recess may not be totally filled, for example, to leave room for electronic devices and/or mechanical devices. In aspects, as shown in FIG. 3 or 5, a portion of the second polymer-based portion 299 can be positioned in the corresponding recess (e.g., first recess 211 in FIG. 5 or second recess 241 in FIG. 3) and another, contiguous portion of the second polymer-based portion 299 can extend beyond the corresponding recess (e.g., the second polymer-based portion 299 further extends beyond the beyond the first plane 204a in FIG. 5 or beyond the second plane 206a in FIG. 3) with additional thickness 399 or 589 disposed over the corresponding major surface (e.g., additional thickness 589 disposed over the first major surface 203 in FIG. 5 or additional thickness 399 disposed over the second major surface 205 in FIG. 3). In aspects, as shown in FIG. 3, a portion of the first polymer-based portion 289 can be positioned in the first recess 211 and another, contiguous portion of the first polymer-based portion 289 can extend beyond the recess (e.g., the first polymer-based portion 289 further extends beyond the first plane 204a) with additional thickness 389 (discussed below) disposed over the first major surface 203.

As shown in FIGS. 2-3 and 33, the first polymer-based portion 289 can comprise a fourth contact surface 285 opposite the third contact surface 283. In aspects, as shown, the third contact surface 283 can comprise a planar surface, for example, substantially coplanar (e.g., extend along a common plane, first plane 204a) with the first surface area 223 and the third surface area 233. In aspects, as shown in FIG. 2, the third contact surface 283 can be substantially flush with the first major surface 203 (e.g., first surface area 223, third surface area 233, and/or first plane 204a). In aspects, as shown in FIG. 33, a distance 3323 (measured in the direction 202) between the third contact surface 283 of the first polymer-based portion 289 and the first major surface 203 (e.g., first surface area 223, third surface area 233, and/or first plane 204a) can be about 5 μm or less, about 4 μm or less, about 3 μm or less, about 2 μm or less, or about 1 μm or less. As discussed herein, a distance between the contact surface of the polymer-based portion and the corresponding major surface of the foldable substrate facilitates a low contrast ratio (e.g., low visibility) of the transition region. In aspects, as shown in FIG. 2, the fourth major surface 255 of the coating 251 can face and/or contact the third contact surface 283 of the first polymer-based portion 289. In aspects, as shown in FIG. 3, the fourth major surface 355 of the cover substrate 351 can face and/or contact the third contact surface 283 of the first polymer-based portion 289. In aspects, as shown in FIGS. 2-3, the fourth contact surface 285 can comprise a planar surface, for example, substantially coplanar (e.g., extend along a common plane, third plane 204b) with the first central surface area 213. In further aspects, the fourth contact surface 285 can contact the first central surface area 213, the first transition surface area 215, and/or the third transition surface area 217. In further aspects, as shown in FIG. 3, the portion of the first polymer-based portion 289 extending beyond the first recess 211 (e.g., extending beyond the first plane 204a) can comprise an additional thickness 389 of about 1 μm or more, about 5 μm or more, about 10 μm or more, about 100 μm or less, about 60 μm or less, about 30 μm or less, or about 20 μm or less. In aspects, the additional thickness 389 can be in a range from about 1 μm to about 100 μm, from about 5 μm to about 100 μm, from about 5 μm to about 60 μm, from about 5 μm to about 30 μm, from about 10 μm to about 30 μm, from about 10 μm to about 20 μm, or any range or subrange therebetween.

As shown in FIGS. 2-5 and 33, the second polymer-based portion 299 can comprise a fourth contact surface 295 opposite the third contact surface 293. In further aspects, as shown in FIGS. 2-3 and 33, the third contact surface 293 can contact the second central surface area 243, the second transition surface area 245, and/or the fourth transition surface area 247. In aspects, as shown in FIGS. 2-3, the third contact surface 293 can comprise a planar surface, for example, being substantially coplanar (e.g., extend along a common plane with the fourth plane 206b) with the second central surface area 243. In aspects, as shown in FIG. 33, a distance 3325 (measured in the direction 202) between the fourth contact surface 295 of the second polymer-based portion 299 and the second major surface 205 (e.g., second surface area 225, fourth surface area 235, and/or second plane 206a) can be about 5 μm or less, about 4 μm or less, about 3 μm or less, about 2 μm or less, or about 1 μm or less.

In aspects, as shown in FIGS. 2 and 4, the third contact surface 283 can be substantially flush with the corresponding major surface of the foldable substrate 201—the second major surface 205 (e.g., second surface area 225, fourth surface area 235, and/or second plane 206a) for foldable apparatus 101 shown in FIG. 2 or the first major surface 203 (e.g., first surface area 223, third surface area 233, and/or first plane 204a) for the foldable apparatus 401 shown in FIG. 4. For example, as distance (measured in the direction 202) between the third contact surface 283 of the first polymer-based portion 289 and the corresponding major surface of the foldable substrate can be about 5 μm or less, about 4 μm or less, about 3 μm or less, about 2 μm or less, or about 1 μm or less. As discussed herein, a distance between the contact surface of the polymer-based portion and the corresponding major surface of the foldable substrate facilitates a low contrast ratio (e.g., low visibility) of the transition region. In aspects, as shown in FIG. 2, the fourth contact surface 295 can comprise a planar surface, for example, being substantially coplanar (e.g., extend along a common plane with the second plane 206a) with the second surface area 225 and the fourth surface area 235.

Throughout the disclosure, an average angle of a contact surface of a polymer-based portion relative to a major surface is measured as an angle between a contact surface of the polymer-based portion and a major surface of the foldable substrate. An angle is calculated for a location on the corresponding contact surface relative to the corresponding central surface area with the location of the corresponding major surface approximated as a plane fitted from measurements at 20 locations evenly spaced over the corresponding major surface in the direction 106 of the length 105. The angle measured is an internal angle for the foldable substrate, meaning that it extends from the plane fitted to the corresponding major surface to the location on the corresponding contact surface without leaving the foldable apparatus other than an incidental amount at the endpoints. The average angle is calculated from 10 locations on the corresponding contact surface that are located in a region comprising 33% of the width 287 of the central portion 281 closest to the corresponding major surface.

In aspects, as shown in FIG. 33, the third contact surface 283 of the first polymer-based portion 289 can be non-planar (e.g., comprise portions that are not parallel to the first plane 204*a*). For example, as shown, a shape of the third contact surface 283 (e.g., relative to the first plane 204*a*) can be proportional to a shape of the first transition surface area 215, first central surface area 213, and third transition surface area 217 relative to a common reference (e.g., relative to the first plane 204*a*). In aspects, the third contact surface 283 of the first polymer-based portion 289 can form a first polymer angle 3312 with the first major surface 203 (e.g., first plane 204*a* and/or first surface area 223) of the foldable substrate 201, and/or the third contact surface 283 of the first polymer-based portion 289 can form a third polymer angle 3316 with the first major surface 203 (e.g., first plane 204*a* and/or third surface area 233) of the foldable substrate 201. In aspects, the third contact surface 283 of the first polymer-based portion 289 can form a first polymer angle 3312 with the first major surface 203 (e.g., first plane 204*a* and/or first surface area 223) of the foldable substrate 201, and/or the third contact surface 283 of the first polymer-based portion 289 can form a third polymer angle 3316 with the first major surface 203 (e.g., first plane 204*a* and/or third surface area 233) of the foldable substrate 201. Without wishing to be bound by theory, a shape of the third contact surface of the polymer-based portion can reflect a degree of shrinkage in the polymer-based portion as a result of curing, with deeper recesses, steeper transition angles (e.g., first average angle discussed above), and polymers with greater cure-induced shrinkage exhibiting more pronounced deviations (e.g., distance 3323 and/or first polymer angle 3312) from the first major surface 203 (e.g., first plane 204*a*). As described above, the first polymer angle 3312 is an internal angle because it does not leave a combined region of the foldable substrate 201 and the first polymer-based portion 289 other than an incidental amount at the endpoints. In further aspects, the first polymer angle 3312 can be about 1780 or more, about 178.3° or more, about 178.4° or more, about 178.5° or more, about 178.6° or more, about 178.7° or more, about 178.8° or more, 178.9° or more, about 179.0° or more, about 179.10 or more, about 179.2° or more, about 179.3° or more, 179.4° or more, about 179.5° or more, about 179.9° or less, about 179.8° or less, about 179.7° or less, about 179.6° or less, about 179.5° or less, about 179.4° or less, about 179.3° or less, about 179.2° or less, about 179.10 or less, about 179.0° or less, or about 178.9° or less. In further aspects, the first polymer angle 3312 can be in a range from about 178.0° to about 179.9°, from about 178.3° to about 179.9°, from about 178.3° to about 179.8°, from about 178.4° to about 179.7°, from about 178.4° to about 179.6°, from about 178.5° to about 179.5°, from about 178.5° to about 179.4°, from about 178.6° to about 179.3°, from about 178.6° to about 179.2°, from about 178.7° to about 179.2°, from about 178.7° to about 179.1°, from about 178.8° to about 179.0°, from about 179.8° to about 178.9°, or any range or subrange therebetween. In further aspects, the first polymer angle 3312 can be about 179.0° or more, for example in a range from about 179.0° to about 179.9°, from about 179.1° to about 179.9°, from about 179.1° to about 179.8°, from about 179.2° to about 179.7°, from about 179.2° to about 179.6°, from about 179.3° to about 179.5°, from about 179.4° to about 179.5°, or any range or subrange therebetween. In further aspects, when the foldable substrate 201 comprises a first recess 211 and a second recess 241 opposite the first recess 211 (see FIGS. 2-3 and 33), the first polymer angle 3312 can be in a range from about 178.3° to about 179.9°, from about 178.5° to 179.5°, or from about 179.1° to about 179.4°. In further aspects, when the foldable substrate 201 comprises a first recess 211 and the second central surface area 243 is flush with the second major surface 205 (see FIGS. 4-5), the first polymer angle 3312 can be in a range from about 179.1° to about 179.9°, from about 179.2° to 179.7°, or from about 179.3° to about 179.5°. As discussed herein, providing a first average angle from about 178.3° to about 179.9° or from about 179.10 to about 179.9° can decrease a visibility of the transition region (e.g., enable a lower contrast ratio and/or produce a transition region that is invisible to the naked eye). In further aspects, the third polymer angle 3316 can be within one or more of the ranges discussed above for the first polymer angle 3312. In further aspects, the first polymer angle 3312 can be substantially equal to the third polymer angle 3316.

In aspects, as shown in FIG. 33, the fourth contact surface 295 of the second polymer-based portion 299 can be non-planar (e.g., comprise portions that are not parallel to the second plane 206*a*). For example, as shown, a shape of the fourth contact surface 295 (e.g., relative to the second plane 206*a*) can be proportional to a shape of the second transition surface area 245, second central surface area 243, and fourth transition surface area 247 relative to a common reference (e.g., relative to the second plane 206*a*). In aspects, the fourth contact surface 295 of the second polymer-based portion 299 can form a second polymer angle 3314 with the second major surface 205 (e.g., second plane 206*a* and/or second surface area 225) of the foldable substrate 201, and/or the fourth contact surface 295 of the second polymer-based portion 299 can form a fourth polymer angle 3318 with the second major surface 205 (e.g., second plane 206*a* and/or fourth surface area 235) of the foldable substrate 201. In further aspects, the second polymer angle 3314 can be within one or more of the ranges discussed above for the first polymer angle 3312. In further aspects, the first polymer angle 3312 can be substantially equal to the second polymer angle 3314. In further aspects, the fourth polymer angle 3318 can be within one or more of the ranges discussed above for the first polymer angle 3312. In further aspects, the first polymer angle 3312 and/or the second polymer angle 3314 can be substantially equal to the fourth polymer angle 3318.

In aspects, as shown in FIGS. 4-5, the third contact surface 293 can contact the first central surface area 213, the first transition surface area 215, and/or the third transition surface area 217. In aspects, as shown in FIGS. 4-5, the third contact surface 293 can comprise a planar surface, for example, being substantially coplanar (e.g., extend along a common plane with the third plane 204*b*) with the first central surface area 213. In aspects, as shown, the third contact surface 293 can comprise a planar surface, for example, substantially coplanar (e.g., extend along a common plane with the third plane 204*b*) with the first central surface area 213. In aspects, as shown in FIGS. 4-5, the fourth contact surface 295 can be coplanar (e.g., extend along a common plane with the first plane 204*a*) with the first surface area 223 and the third surface area 233. In aspects, as shown in FIGS. 2 and 4, the first contact surface 263 of the adhesive layer 261 can face and/or contact the fourth contact surface 295 of the second polymer-based portion 299.

In further aspects, as shown in FIGS. 3 and 5, the second polymer-based portion 299 can comprise a portion within the corresponding recess (e.g., second recess 241 in FIG. 3 or first recess 211 in FIG. 5) in addition to another portion further extending beyond the corresponding plane with an additional thickness 399 or 589. In even further aspects, as shown in FIG. 3, the portion of the second polymer-based portion 299 extending beyond the second recess 241 (e.g., extending beyond the second plane 206*a*) can comprise an additional thickness 399 can be within one or more of the ranges discussed above with reference to the additional thickness 389. In even further aspects, as shown in FIG. 5, the portion of the first polymer-based portion 289 extending beyond the first recess 211 (e.g., extending beyond the first plane 204*a*) can comprise an additional thickness 589 that can be within one or more of the ranges discussed above with reference to the additional thickness 389.

In aspects, the polymer-based portion 289 and/or 299 comprises a polymer (e.g., optically transparent polymer). In further aspects, the polymer-based portion 289 and/or 299 can comprise one or more of an optically transparent: an acrylic (e.g., polymethylmethacrylate (PMMA)), an epoxy, a silicone, and/or a polyurethane. Examples of epoxies include bisphenol-based epoxy resins, novolac-based epoxies, cycloaliphatic-based epoxies, and glycidylamine-based epoxies. In further aspects, the polymer-based portion 289 and/or 299 comprise one or more of a polyolefin, a polyamide, a halide-containing polymer (e.g., polyvinylchloride or a fluorine-containing polymer), an elastomer, a urethane, a phenolic resin, parylene, polyethylene terephthalate (PET), and polyether ether ketone (PEEK). Example aspects of polyolefins include low molecular weight polyethylene (LDPE), high molecular weight polyethylene (HDPE), ultra-high molecular weight polyethylene (UHMWPE), and polypropylene (PP). Example aspects of fluorine-containing polymers include polytetrafluoroethylene (PTFE), polyvinylfluoride (PVF), polyvinylidene fluoride (PVDF), perfluoropolyether (PFPE), perfluorosulfonic acid (PFSA), a perfluoroalkoxy (PFA), fluorinated ethylene propylene (FEP) polymers, and ethylene tetrafluoro ethylene (ETFE) polymers. Example aspects of elastomers include rubbers (e.g., polybutadiene, polyisoprene, chloroprene rubber, butyl rubber, nitrile rubber) and block copolymers (e.g., styrene-butadiene, high-impact polystyrene, poly(dichlorophosphazene), for example, comprising one or more of polystyrene, polydichlorophosphazene, and poly(5-ethylidene-2-norbornene). In aspects, the polymer-based portion can comprise a sol-gel material. Example aspects of polyurethanes comprise thermoset polyurethanes, for example, Dispurez 102 available from Incorez and thermoplastic polyurethanes, for example, KrystalFlex PE505 available from Huntsman. In even further aspects, the second portion can comprise an ethylene acid copolymer. An exemplary aspect of an ethylene acid copolymer includes SURLYN available from Dow (e.g., Surlyn PC-2000, Surlyn 8940, Surlyn 8150). An additional exemplary aspect for the second portion comprises Eleglass w802-GLO44 available from Axalta with from 1 wt % to 2 wt % cross-linker. In aspects, the polymer-based portion 289 and/or 299 can further comprise nanoparticles, for example, carbon black, carbon nanotubes, silica nanoparticles, or nanoparticles comprising a polymer. In aspects, the polymer-based portion can further comprise fibers to form a polymer-fiber composite.

In aspects, the polymer-based portion 289 and/or 299 can comprise an elastic modulus of about 0.001 MegaPascals (MPa) or more, about 0.01 MPa or more, about 1 MPa or more, about 10 MPa or more, about 20 MPa or more, about 100 MPa or more, about 200 MPa or more, about 1,000 MPa or more, about 5,000 MPa or less, about 3,000 MPa or less, about 1,000 MPa or less, about 500 MPa or less, or about 200 MPa or less. In aspects, the polymer-based portion 289 and/or 299 can comprise an elastic modulus in a range from about 0.001 MPa to about 5,000 MPa, from about 0.01 MPa to about 3,000 MPa, from about 0.01 MPa to about 1,000 MPa, from about 0.01 MPa to about 500 MPa, from about 0.01 MPa to about 200 MPa, from about 1 MPa to about 200 MPa, from about 10 MPa to about 200 MPa, from about 100 MPa to about 200 MPa, or any range or subrange therebetween. In aspects, the polymer-based portion 289 and/or 299 can comprise an elastic modulus in a range from about 1 MPa to about 5,000 MPa, from about 10 MPa to about 5,000 MPa, from about 10 MPa to about 1,000 MPa, from about 20 MPa to about 1,000 MPa, from about 20 MPa to about 200 MPa, or any range or subrange therebetween. In aspects, the elastic modulus of the polymer-based portion 289 and/or 299 can be in a range from about 1 GPa to about 20 GPa, from about 1 GPa to about 18 GPa, from about 1 GPa to about 10 GPa, from about 1 GPa to about 5 GPa, from about 1 GPa to about 3 GPa, or any range or subrange therebetween. By providing a polymer-based portion 289 and/or 299 with an elastic modulus in a range from about 0.001 MPa to about 5,000 MPa (e.g., in a range from about 10 MPa to about 3 GPa), folding of the foldable apparatus without failure can be facilitated. In aspects, the adhesive layer 261 comprises an elastic modulus greater than the elastic modulus of the polymer-based portion 289 and/or 299, which arrangement provides improved performance in puncture resistance. In aspects, the elastic modulus of the polymer-based portion 289 and/or 299 can be less than the elastic modulus of the foldable substrate 201. In aspects, the adhesive layer 261 may comprise an elastic modulus within the ranges listed above in this paragraph. In further aspects, the adhesive layer 261 may comprise substantially the same elastic modulus as the elastic modulus of the polymer-based portion 289 and/or 299. In further aspects, the elastic modulus of the adhesive layer 261 can be in a range from about 1 GPa to about 20 GPa, from about 1 GPa to about 18 GPa, from about 1 GPa to about 10 GPa, from about 1 GPa to about 5 GPa, from about 1 GPa to about 3 GPa, or any range or subrange therebetween. In aspects, the elastic modulus of the polymer-based portion 289 and/or 299 can be less than the elastic modulus of the foldable substrate 201.

In aspects, as shown in FIGS. 2-3, a coating 251 can be disposed over the first major surface 203 of the foldable substrate 201. In further aspects, the coating 251 can be disposed over the first portion 221, the second portion 231, and the central portion 281. In aspects, the coating 251 can comprise a third major surface 253 and a fourth major surface 255 opposite the third major surface 253. In further aspects, as shown in FIG. 2, the coating 251 (e.g., fourth major surface 255) can contact the foldable substrate 201 (e.g., first major surface 203). In further aspects, at least a part of the coating 251 can be positioned in the first recess 211. In further aspects, the coating 251 can comprise a coating thickness 257 defined between the third major surface 253 and the fourth major surface 255. In further aspects, the coating thickness 257 can be about 0.1 μm or more, about 1 μm or more, about 5 μm or more, about 10 μm or more, about 15 μm or more, about 20 μm or more, about 25 μm or more, about 40 μm or more, about 50 μm or more, about 60 μm or more, about 70 μm or more, about 80 μm or more, about 90 μm or more, about 200 μm or less, about 100 μm or less, or about 50 μm or less, about 30 μm or less, about 25 μm or less, about 20 μm or less, about 20 μm or less, about 15 μm or less, or about 10 μm or less. In aspects, the coating thickness 257 can be in a range from about 0.1 μm to about 200 μm, from about 1 μm to about 200 μm, from about 10 μm to about 200 μm, from about 50 μm to about 200 µm, from about 0.1 µm to about 100 µm, from about 1 µm to about 100 µm, from about 10 µm to about 100 µm, from about 20 µm to about 100 µm, from about 30 µm to about 100 µm, from about 40 µm to about 100 µm, from about 50 µm to about 100 µm, from about 60 µm to about 100 µm, from about 70 µm to about 100 µm, from about 80 µm to about 100 µm, from about 90 µm to about 100 µm, from about 0.1 µm to about 50 µm, from about 1 µm to about 50 µm, from about 10 µm to about 50 µm, or any range or subrange therebetween. In further aspects, the coating thickness 257 can be in a range from about 0.1 µm to about 50 µm, from about 0.1 µm to about 30 µm, from about 0.1 µm to about 25 µm, from about 0.1 µm to about 20 µm, from about 0.1 µm to about 15 µm, from about 0.1 µm to about 10 µm, from about 1 µm to about 30 µm, from about 1 µm to about 25 µm, from about 1 µm to about 20 µm, from about 1 µm to about 15 µm, from about 1 µm to about 10 µm, from about 5 µm to about 30 µm, from about 5 µm to about 25 µm, from about 5 µm to about 20 µm, from about 5 µm to about 15 µm, from about 5 µm to about 10 µm, from about 10 µm to about 30 µm, from about 10 µm to about 25 µm, from about 10 µm to about 20 µm, from about 10 µm to about 15 µm, from about 15 µm to about 30 µm, from about 15 µm to about 25 µm, from about 15 µm to about 20 µm, from about 20 µm to about 30 µm, from about 20 µm to about 25 µm, or any range or subrange therebetween.

In aspects, the coating 251 can comprise a polymeric hard coating. In further aspects, the polymeric hard coating can comprise one or more of an ethylene-acid copolymer, a polyurethane-based polymer, an acrylate resin, and a mercapto-ester resin. Example aspects of ethylene-acid copolymers include ethylene-acrylic acid copolymers, ethylene-methacrylic acid copolymers, and ethylene-acrylic-methacrylic acid terpolymers (e.g., Nucrel, manufactured by DuPont), ionomers of ethylene acid copolymers (e.g., Surlyn, manufactured by DuPont), and ethylene-acrylic acid copolymer amine dispersions (e.g., Aquacer, manufactured by BYK). Example aspects of polyurethane-based polymers include aqueous-modified polyurethane dispersions (e.g., Eleglas®, manufactured by Axalta). Example aspects of acrylate resins that can be UV curable include acrylate resins (e.g., Uvekol® resin, manufactured by Allinex), cyanoacrylate adhesives (e.g., Permabond® UV620, manufactured by Krayden), and UV radical acrylic resins (e.g., Ultrabond windshield repair resin, for example, Ultrabond (45CPS)). Example aspects of mercapto-ester resins include mercapto-ester triallyl isocyanurates (e.g., Norland optical adhesive NOA 61). In further aspects, the polymeric hard coating can comprise ethylene-acrylic acid copolymers and ethylene-methacrylic acid copolymers, which may be ionomerized to form ionomer resins through neutralization of the carboxylic acid residue with typically alkali-metal ions, for example, sodium and potassium, and also zinc. Such ethylene-acrylic acid and ethylene-methacrylic acid ionomers may be dispersed in water and coated onto the substrate to form an ionomer coating. Alternatively, such acid copolymers may be neutralized with ammonia which, after coating and drying liberates the ammonia to reform the acid copolymer as the coating. By providing a coating comprising a polymeric coating, the foldable apparatus can comprise low-energy fracture.

In aspects, the coating can comprise a polymeric hard coating comprising an optically transparent polymeric hard-coat layer. Suitable materials for an optically transparent polymeric hard-coat layer include but are not limited to a cured acrylate resin material, an inorganic-organic hybrid polymeric material, an aliphatic or aromatic hexafunctional urethane acrylate, a siloxane-based hybrid material, and a nanocomposite material, for example, an epoxy and urethane material with nanosilicate. In aspects, an optically transparent polymeric hard-coat layer may consist essentially of one or more of these materials. In aspects, an optically transparent polymeric hard-coat layer may consist of one or more of these materials. As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example, inorganic particulates dispersed within an organic matrix. More specifically, suitable materials for an optically transparent polymeric (OTP) hard-coat layer include, but are not limited to, a polyimide, a polyethylene terephthalate (PET), a polycarbonate (PC), a poly methyl methacrylate (PMMA), organic polymer materials, inorganic-organic hybrid polymeric materials, and aliphatic or aromatic hexafunctional urethane acrylates. In aspects, an OTP hard-coat layer may consist essentially of an organic polymer material, an inorganic-organic hybrid polymeric material, or aliphatic or aromatic hexafunctional urethane acrylate. In aspects, an OTP hard-coat layer may consist of a polyimide, an organic polymer material, an inorganic-organic hybrid polymeric material, or aliphatic or aromatic hexafunctional urethane acrylate. In aspects, an OTP hard-coat layer may include a nanocomposite material. In aspects, an OTP hard-coat layer may include a nano-silicate at least one of epoxy and/or urethane materials. Suitable compositions for such an OTP hard-coat layer are described in U.S. Pat. Pub. No. 2015/0110990, which is hereby incorporated by reference in its entirety by reference thereto. As used herein, "organic polymer material" means a polymeric material comprising monomers with only organic components. In aspects, an OTP hard-coat layer may comprise an organic polymer material manufactured by Gunze Limited and having a hardness of 9H, for example Gunze's "Highly Durable Transparent Film." As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example, inorganic particulates dispersed within an organic matrix. In aspects, the inorganic-organic hybrid polymeric material may include polymerized monomers comprising an inorganic silicon-based group, for example, a silsesquioxane polymer. A silsesquioxane polymer may be, for example, an alkyl-silsesquioxane, an aryl-silsesquioxane, or an aryl alkyl-silsesquioxane having the following chemical structure: $(RSiO_{1.5})_n$, where R is an organic group for example, but not limited to, methyl or phenyl. In aspects, an OTP hard-coat layer may comprise a silsesquioxane polymer combined with an organic matrix, for example, SILPLUS manufactured by Nippon Steel Chemical Co., Ltd. In aspects, an OTP hard-coat layer may comprise 90 wt % to 95 wt % aromatic hexafunctional urethane acrylate (e.g., PU662NT (Aromatic hexafunctional urethane acrylate) manufactured by Miwon Specialty Chemical Co.) and 10 wt % to 5 wt % photo-initiator (e.g., Darocur 1173 manufactured by Ciba Specialty Chemicals Corporation) with a hardness of 8H or more. In aspects, an OTP hard-coat layer composed of an aliphatic or aromatic hexafunctional urethane acrylate may be formed as a stand-alone layer by spin-coating the layer on a polyethylene terephthalate (PET) substrate, curing the urethane acrylate, and removing the urethane acrylate layer from the PET substrate. In aspects, an OTP hard-coat layer may be an aliphatic or aromatic hexafunctional urethane acrylate material layer having a thickness within one or more of the thickness ranges discussed above for the coating thickness 257.

In aspects, the coating 251, if provided, may also comprise one or more of an easy-to-clean coating, a low-friction coating, an oleophobic coating, a diamond-like coating, a scratch-resistant coating, or an abrasion-resistant coating. A scratch-resistant coating may comprise an oxynitride, for example, aluminum oxynitride or silicon oxynitride with a thickness of about 500 micrometers or more. In such aspects, the abrasion-resistant layer may comprise the same material as the scratch-resistant layer. In aspects, a low friction coating may comprise a highly fluorinated silane coupling agent, for example, an alkyl fluorosilane with oxymethyl groups pendant on the silicon atom. In such aspects, an easy-to-clean coating may comprise the same material as the low friction coating. In other aspects, the easy-to-clean coating may comprise a protonatable group, for example an amine, for example, an alkyl aminosilane with oxymethyl groups pendant on the silicon atom. In such aspects, the oleophobic coating may comprise the same material as the easy-to-clean coating. In aspects, a diamond-like coating comprises carbon and may be created by applying a high voltage potential in the presence of a hydrocarbon plasma.

In aspects, as shown in FIG. 3, the foldable apparatus 301 can comprise a cover substrate 351 instead of the coating 251 discussed above, although both a coating and a cover substrate can be provided in other aspects. In further aspects, the cover substrate 371 can comprise a glass-based material, a ceramic-based material, and/or sapphire. In further aspects, as shown, the cover substrate 351 can comprise at third major surface 353 and a fourth major surface 355 opposite the third major surface 353. In further aspects, as shown, a cover thickness 359 of the cover substrate 351 is defined between the third major surface 353 and the fourth major surface 355. In even further aspects, the cover thickness 359 can be within one or more of the ranges discussed above for the coating thickness 257. In further aspects, as shown, the fourth major surface 356 can face and/or be disposed over the first major surface 203, first central surface area 213, and/or the first polymer-based portion 239. In even further aspects, as shown, the fourth major surface 355 can contact the third contact surface 283 of the first polymer-based portion 289, although an adhesive layer (e.g., similar to or identical to adhesive layer 261) can be positioned therebetween.

Providing a first recess opposite a second recess can reduce a bend-induced strain of a material positioned in the first recess and/or second recess compared to a single recess with a surface recessed by the sum of the first distance and the second distance. Providing a reduced bend-induced strain of a material positioned in the first recess and/or the second recess can enable the use of a wider range of materials because of the reduced strain requirements for the material. For example, stiffer and/or more rigid materials (e.g., coating 251, first polymer-based portion 289) can be positioned in the first recess, which can improve impact resistance, puncture resistance, abrasion resistance, and/or scratch resistance of the foldable apparatus. Additionally, controlling properties of a first material (e.g., coating 251, first polymer-based portion 289) positioned in a first recess and a second material positioned in a second recess can control the position of a neutral axis of the foldable apparatus and/or foldable substrates, which can reduce (e.g., mitigate, eliminate) the incidence of mechanical instabilities, apparatus fatigue, and/or apparatus failure. Providing a first recess opposite a second recess can reduce the strain encountered by the polymer-based portion or other material (e.g., adhesive layer) in the recess (e.g., from 0% to 50% reduction). Consequently, requirements for a strain at yield of the polymer-based portion can be relaxed. In aspects, a strain at yield of the polymer-based portion and/or adhesive layer can be about 3% or more, about 4% or more, about 5% or more, about 6% or more, about 7% or more, about 500% or less, about 100% or less, about 50% or less, about 20% or less, about 15% or less, about 10% or less, about 9% or less, or about 8% or less. In aspects, the strain at yield of the polymer-based portion and/or adhesive layer can be in a range from about 1% to about 500%, from about 1% to about 100%, from about 2% to about 100%, from about 2% to about 50%, from about 3% to about 50%, from about 3% to about 20%, from about 4% to about 20%, from about 4% to about 15%, from about 5% to about 15%, from about 5% to about 10%, from about 5% to about 9%, from about 6% to about 9%, from about 6% to about 8%, from about 7% to about 8% or any range or subrange therebetween.

In aspects, as shown in FIGS. 2 and 4-5, the foldable apparatus 101, 401, or 501 can comprise the release liner 271 although other substrates (e.g., glass-based substrate and/or ceramic-based substrate discussed throughout the application) may be used in further aspects rather than the illustrated release liner 271. In further aspects, as shown in FIGS. 2 and 4, the release liner 271, or another substrate, can be disposed over the adhesive layer 261. In even further aspects, as shown, the release liner 271, or another substrate, can directly contact the second contact surface 265 of the adhesive layer 261. In further aspects, as shown in FIG. 5, the release liner 271, or another substrate, can be disposed over and/or contact the corresponding polymer-based portion (e.g., fourth contact surface 295 of the second polymer-based portion 299). The release liner 271, or another substrate, can comprise a first major surface 273 and a second major surface 275 opposite the first major surface 273. As shown, the release liner 271, or another substrate, can be disposed on the adhesive layer 261 by attaching the second contact surface 265 of the adhesive layer 261 to the first major surface 273 of the release liner 271, or another substrate. In aspects, as shown, the first major surface 273 of the release liner 271, or another substrate, can comprise a planar surface. In aspects, as shown, the second major surface 275 of the release liner 271, or another substrate, can comprise a planar surface. A substrate comprising the release liner 271 can comprise a paper and/or a polymer. Exemplary aspects of paper comprise kraft paper, machine-finished paper, poly-coated paper (e.g., polymer-coated, glassine paper, siliconized paper), or clay-coated paper. Exemplary aspects of polymers comprise polyesters (e.g., polyethylene terephthalate (PET)) and polyolefins (e.g., low-density polyethylene (LDPE), high-density polyethylene (HDPE), polypropylene (PP)).

In aspects, as shown in FIG. 3, the foldable apparatus 301 can comprise an additional substrate 371 instead of the release liner 271 discussed above. In further aspects, the additional substrate 371 can comprise a glass-based material, a ceramic-based material, a stiff polymer-based portion (e.g., PET, PMMA, PI), a display device, and/or a touch sensor. In further aspects, as shown, the additional substrate 371 can comprise at third major surface 373 and a fourth major surface 375 opposite the third major surface 373. In further aspects, as shown, the third major surface 373 can face and/or be disposed over the second major surface 205, second central surface area 243, and/or the second polymer-based portion 299. In even further aspects, as shown, the third major surface 373 can contact the fourth contact surface 295 of the second polymer-based portion 299, although an adhesive layer (e.g., similar to or identical to adhesive layer 261) can be positioned therebetween.

Aspects of the disclosure can comprise a consumer electronic product. The consumer electronic product can comprise a front surface, a back surface, and side surfaces. The consumer electronic product can further comprise electrical components at least partially within the housing. The electrical components can comprise a controller, a memory, and a display. The display can be at or adjacent to the front surface of the housing. The display can comprise liquid crystal display (LCD), an electrophoretic displays (EPD), an organic light-emitting diode (OLED) display, or a plasma display panel (PDP). The consumer electronic product can comprise a cover substrate disposed over the display. In aspects, at least one of a portion of the housing or the cover substrate comprises the foldable apparatus discussed throughout the disclosure. The consumer electronic product can comprise a portable electronic device, for example, a smartphone, a tablet, a wearable device, or a laptop.

Figure 9:
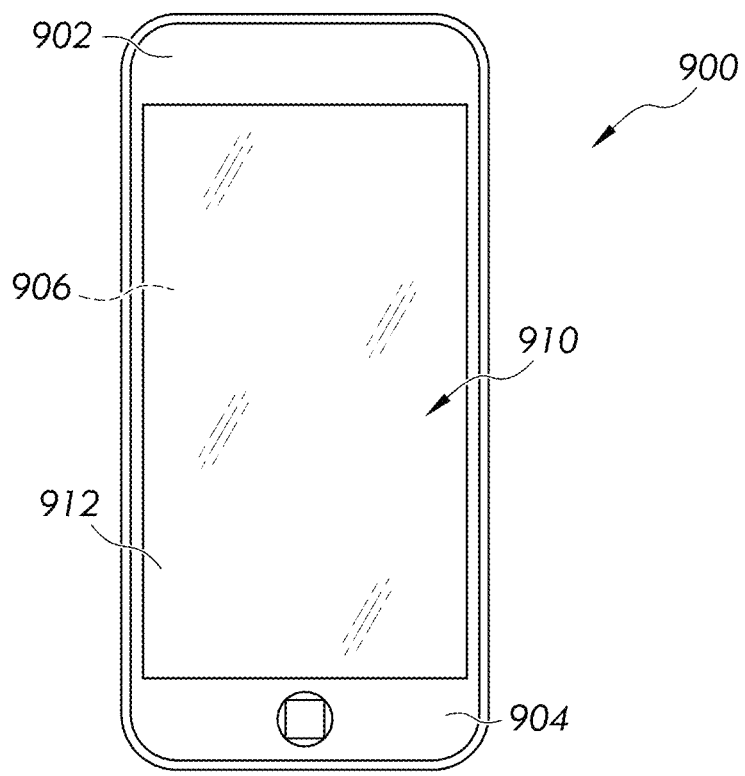
FIG. 9 is a schematic plan view of an example consumer electronic device according to aspects.
Figure 10:
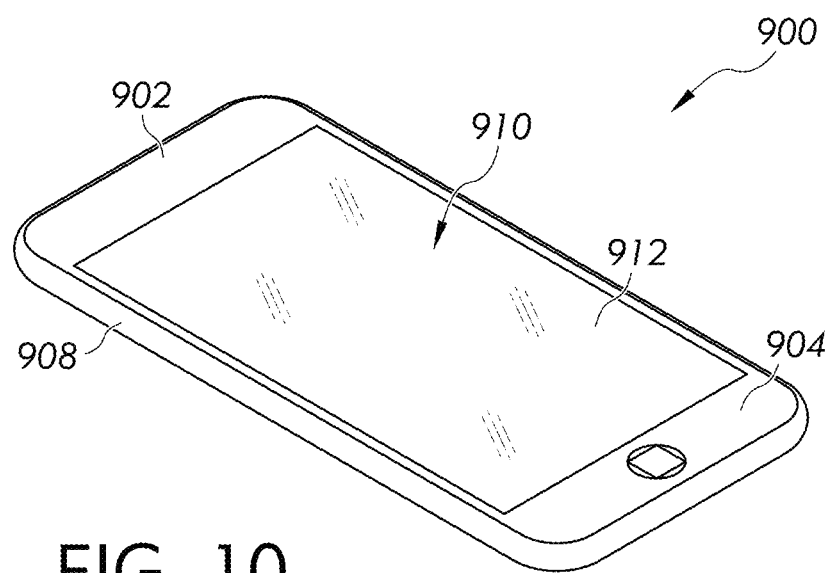
FIG. 10 is a schematic perspective view of the example consumer electronic device of FIG. 9.

The foldable apparatus disclosed herein may be incorporated into another article, for example, an article with a display (or display articles) (e.g., consumer electronics, including mobile phones, tablets, computers, navigation systems, wearable devices (e.g., watches), and the like), architectural articles, transportation articles (e.g., automotive, trains, aircraft, sea craft, etc.), appliance articles, or any article that may benefit from some transparency, scratch-resistance, abrasion resistance or a combination thereof. An exemplary article incorporating any of the foldable apparatus disclosed herein is shown in FIGS. 9-10. Specifically, FIGS. 9-10 show a consumer electronic device 900 including a housing 902 having front 904, back 906, and side surfaces 908. Although not shown, the consumer electronic device can comprise electrical components that are at least partially inside or entirely within the housing. For example, electrical components include at least a controller, a memory, and a display. As shown in FIGS. 9-10, the display 910 can be at or adjacent to the front surface of the housing 902. The consumer electronic device can comprise a cover substrate 912 at or over the front surface of the housing 902 such that it is over the display 910. In aspects, at least one of the cover substrate 912 or a portion of housing 902 may include any of the foldable apparatus disclosed herein, for example, the foldable substrate.

In aspects, the foldable substrate 201 can comprise a glass-based substrate and/or a ceramic-based substrate, and the first portion 221, the second portion 231, and/or the central portion 281 can comprise one or more compressive stress regions. In aspects, a compressive stress region may be created by chemically strengthening. Chemically strengthening may comprise an ion exchange process, where ions in a surface layer are replaced by—or exchanged with—larger ions having the same valence or oxidation state. Methods of chemically strengthening will be discussed later. Without wishing to be bound by theory, chemically strengthening the first portion 221, the second portion 231, and/or the central portion 281 can enable good impact and/or puncture resistance (e.g., resists failure for a pen drop height of about 15 centimeters (cm) or more, about 20 cm or more, about 50 cm or more). Without wishing to be bound by theory, chemically strengthening the first portion 221, the second portion 231, and/or the central portion 281 can enable small (e.g., smaller than about 10 mm or less) bend radii because the compressive stress from the chemical strengthening can counteract the bend-induced tensile stress on the outermost surface of the substrate. A compressive stress region may extend into a portion of the first portion and/or the second portion for a depth called the depth of compression. As used herein, depth of compression means the depth at which the stress in the chemically strengthened substrates and/or portions described herein changes from compressive stress to tensile stress. Depth of compression may be measured by a surface stress meter or a scattered light polariscope (SCALP, wherein values reported herein were made using SCALP-5 made by Glasstress Co., Estonia) depending on the ion exchange treatment and the thickness of the article being measured. Where the stress in the substrate and/or portion is generated by exchanging potassium ions into the substrate, a surface stress meter, for example, the FSM-6000 (Orihara Industrial Co., Ltd. (Japan)), is used to measure depth of compression. Unless specified otherwise, compressive stress (including surface CS) is measured by surface stress meter (FSM) using commercially available instruments, for example the FSM-6000, manufactured by Orihara. Surface stress measurements rely upon the accurate measurement of the stress optical coefficient (SOC), which is related to the birefringence of the glass. Unless specified otherwise, SOC is measured according to Procedure C (Glass Disc Method) described in ASTM standard C770-16, entitled "Standard Test Method for Measurement of Glass Stress-Optical Coefficient," the contents of which are incorporated herein by reference in their entirety. Where the stress is generated by exchanging sodium ions into the substrate, and the article being measured is thicker than about 400 μm, SCALP is used to measure the depth of compression and central tension (CT). Where the stress in the substrate and/or portion is generated by exchanging both potassium and sodium ions into the substrate and/or portion, and the article being measured is thicker than about 400 μm, the depth of compression and CT are measured by SCALP. Without wishing to be bound by theory, the exchange depth of sodium may indicate the depth of compression while the exchange depth of potassium ions may indicate a change in the magnitude of the compressive stress (but not the change in stress from compressive to tensile). The refracted near-field (RNF; the RNF method is described in U.S. Pat. No. 8,854,623, entitled "Systems and methods for measuring a profile characteristic of a glass sample", which is incorporated herein by reference in its entirety) method also may be used to derive a graphical representation of the stress profile. When the RNF method is utilized to derive a graphical representation of the stress profile, the maximum central tension value provided by SCALP is utilized in the RNF method. The graphical representation of the stress profile derived by RNF is force balanced and calibrated to the maximum central tension value provided by a SCALP measurement. As used herein, "depth of layer" (DOL) means the depth that the ions have exchanged into the substrate and/or portion (e.g., sodium, potassium). Through the disclosure, when the maximum central tension cannot be measured directly by SCALP (as when the article being measured is thinner than about 400 μm) the maximum central tension can be approximated by a product of a maximum compressive stress and a depth of compression divided by the difference between the thickness of the substrate and twice the depth of compression, wherein the compressive stress and depth of compression are measured by FSM.

In aspects, the first portion 221 comprising the glass-based portion and/or ceramic-based portion may comprise a first compressive stress region at the first surface area 223 that can extend to a first depth of compression from the first surface area 223. In aspects, the first portion 221 comprising a first glass-based and/or ceramic-based portion may comprise a second compressive stress region at the second surface area 225 that can extend to a second depth of compression from the second surface area 225. In aspects, the first depth of compression and/or the second depth of compression as a percentage of the substrate thickness 207 can be about 1% or more, about 5% or more, about 10% or more, about 30% or less, about 25% or less, or about 20% or less. In aspects, the first depth of compression and/or the second depth of compression as a percentage of the substrate thickness 207 can be in a range from about 1% to about 30%, from about 5% to about 30%, from about 5% to about 25%, from about 5% to about 20%, from about 10% to about 30%, from about 10% to about 25%, from about 10% to about 20%, or any range or subrange therebetween. In further aspects, the first depth of compression and/or the second depth of compression as a percentage of the substrate thickness 207 can be about 10% or less, for example, from about 1% to about 10%, from about 1% to about 8%, from about 3% to about 8%, from about 5% to about 8%, or any range or subrange therebetween. In further aspects, the first depth of compression can be substantially equal to the second depth of compression. In aspects, the first depth of compression and/or the second depth of compression can be about 1 μm or more, about 10 μm or more, about 30 μm or more, about 50 μm or more, about 200 μm or less, about 150 μm or less, about 100 μm or less, or about 60 μm or less. In aspects, the first depth of compression and/or the second depth of compression can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween. By providing a first portion comprising a first glass-based and/or ceramic-based portion comprising a first depth of compression and/or a second depth of compression in a range from about 1% to about 30% of the first thickness (e.g., substrate thickness), good impact and/or puncture resistance can be enabled.

In aspects, the first compressive stress region can comprise a maximum first compressive stress. In aspects, the second compressive stress region can comprise a maximum second compressive stress. In further aspects, the maximum first compressive stress and/or the maximum second compressive stress can be about 100 MegaPascals (MPa) or more, about 300 MPa or more, about 500 MPa or more, about 600 MPa or more, about 700 MPa or more, about 1,500 MPa or less, about 1,200 MPa or less, about 1,000 MPa or less, or about 800 MPa or less. In further aspects, the maximum first compressive stress and/or the maximum second compressive stress can be in a range from about 100 MPa to about 1,500 MPa, from about 100 MPa to about 1,200 MPa, from about 300 MPa to about 1,200 MPa, from about 300 MPa to about 1,000 MPa, from about 500 MPa to about 1,000 MPa, from about 600 MPa to about 1,000 MPa, from about 600 MPa to about 1,000 MPa, from about 700 MPa to about 1,000 MPa, from about 700 MPa to about 800 MPa, from about 500 MPa to about 800 MPa, or any range or subrange therebetween. By providing a maximum first compressive stress and/or a maximum second compressive stress in a range from about 100 MPa to about 1,500 MPa, good impact and/or puncture resistance can be enabled.

In aspects, the first portion 221 can comprise a first depth of layer of one or more alkali-metal ions associated with the first compressive stress region. In aspects, the first portion 221 can comprise a second depth of layer of one or more alkali-metal ions associated with the second compressive stress region and the second depth of compression. As used herein, the one or more alkali-metal ions of a depth of layer of one or more alkali-metal ions can include sodium, potassium, rubidium, cesium, and/or francium. In aspects, the one or more alkali ions of the first depth of layer of the one or more alkali ions and/or the second depth of layer of the one or more alkali ions comprises potassium. In aspects, the first depth of layer and/or the second depth of layer as a percentage of the substrate thickness 207 can be about 1% or more, about 5% or more, about 10% or more, about 40% or less, about 35% or less, about 30% or less, about 25% or less, or about 20% or less. In aspects, the first depth of layer and/or the second depth of layer as a percentage of the substrate thickness 207 can be in a range from about 1% to about 40%, from about 1% to about 35%, from about 1% to about 30%, from about 1% to about 25%, from about 1% to about 20%, from about 5% to about 30%, from about 5% to about 25%, from about 5% to about 20%, from about 10% to about 30%, from about 10% to about 25%, from about 10% to about 20%, or any range or subrange therebetween. In further aspects, the first depth of layer of the one or more alkali-metal ions and/or the second depth of layer of the one or more alkali-metal ions as a percentage of the substrate thickness 207 can be about 10% or less, for example, from about 1% to about 10%, from about 1% to about 8%, from about 3% to about 8%, from about 5% to about 8%, or any range or subrange therebetween. In aspects, the first depth of layer of the one or more alkali-metal ions and/or the second depth of layer of the one or more alkali-metal ions can be about 1 μm or more, about 10 μm or more, about 30 μm or more, about 50 μm or more, about 200 μm or less, about 150 μm or less, about 100 μm or less, or about 60 μm or less. In aspects, the first depth of layer of the one or more alkali-metal ions and/or the second depth of layer of the one or more alkali-metal ions can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween.

In aspects, the first portion 221 may comprise a first tensile stress region. In aspects, the first tensile stress region can be positioned between the first compressive stress region and the second compressive stress region. In aspects, the first tensile stress region can comprise a maximum first tensile stress. In further aspects, the maximum first tensile stress can be about 10 MPa or more, about 20 MPa or more, about 30 MPa or more, about 100 MPa or less, about 80 MPa or less, or about 60 MPa or less. In further aspects, the maximum first tensile stress can be in a range from about 10 MPa to about 100 MPa, from about 10 MPa to about 80 MPa, from about 10 MPa to about 60 MPa, from about 20 MPa to about 100 MPa, from about 20 MPa to about 80 MPa, from about 20 MPa to about 60 MPa, from about 30 MPa to about 100 MPa, from about 30 MPa to about 80 MPa, from about 30 MPa to about 60 MPa, or any range or subrange therebetween. Providing a maximum first tensile stress in a range from about 10 MPa to about 100 MPa can enable good impact and/or puncture resistance while providing low-energy fractures, as discussed below.

In aspects, the second portion 231 comprising a second glass-based and/or ceramic-based portion may comprise a third compressive stress region at the third surface area 233 that can extend to a third depth of compression from the third surface area 233. In aspects, the second portion 231 comprising a second glass-based and/or ceramic-based portion may comprise a fourth compressive stress region at the fourth surface area 235 that can extend to a fourth depth of compression from the fourth surface area 235. In aspects, the third depth of compression and/or the fourth depth of compression as a percentage of the substrate thickness 207 can be about 1% or more, about 5% or more, about 10% or more, about 30% or less, about 25% or less, or about 20% or less. In aspects, the third depth of compression and/or the fourth depth of compression as a percentage of the substrate thickness 207 can be within one or more of the ranges discussed above for the first depth of compression and/or the second depth of compression as a percentage of the substrate thickness 207. In further aspects, the third depth of compression can be substantially equal to the fourth depth of compression. In aspects, the third depth of compression and/or the fourth depth of compression can be within one or more of the ranges discussed above for the first depth of compression and/or the second depth of compression. By providing a second portion comprising a glass-based and/or ceramic-based portion comprising a third depth of compression and/or a fourth depth of compression in a range from about 1% to about 30% of the substrate thickness, good impact and/or puncture resistance can be enabled.

In aspects, the third compressive stress region can comprise a maximum third compressive stress. In aspects, the fourth compressive stress region can comprise a maximum fourth compressive stress. In further aspects, the maximum third compressive stress and/or the maximum fourth compressive stress can be within one or more of the ranges discussed above for the maximum first compressive stress and/or the maximum second compressive stress. By providing a maximum third compressive stress and/or a maximum fourth compressive stress in a range from about 100 MPa to about 1,500 MPa, good impact and/or puncture resistance can be enabled.

In aspects, the second portion 231 can comprise a third depth of layer of one or more alkali-metal ions associated with the third compressive stress region and the third depth of compression. In aspects, the second portion 231 can comprise a fourth depth of layer of one or more alkali-metal ions associated with the fourth compressive stress region and the fourth depth of compression. In aspects, the one or more alkali ions of the third depth of layer of the one or more alkali ions and/or the fourth depth of layer of the one or more alkali ions comprises potassium. In aspects, the third depth of layer and/or the fourth depth of layer as a percentage of the substrate thickness 207 can be within one or more of the ranges discussed above for the first depth of layer and/or the second depth of layer as a percentage of the substrate thickness 207. In aspects, the third depth of layer of the one or more alkali-metal ions and/or the fourth depth of layer of the one or more alkali-metal ions can be the first depth of layer and/or the second depth of layer.

In aspects, the second portion 231 may comprise a second tensile stress region. In aspects, the second tensile stress region can be positioned between the third compressive stress region and the fourth compressive stress region. In aspects, the second tensile stress region can comprise a maximum second tensile stress. In further aspects, the maximum second tensile stress can be within one or more of the ranges discussed above for the maximum first tensile stress. In aspects, the maximum first tensile stress can be substantially equal to the maximum second tensile stress. Providing a maximum second tensile stress in a range from about 10 MPa to about 100 MPa can enable good impact and/or puncture resistance while providing low-energy fractures, as discussed below.

In aspects, the first depth of compression can be substantially equal to the third depth of compression. In aspects, the second depth of compression can be substantially equal to the fourth depth of compression. In aspects, the maximum first compressive stress can be substantially equal to the maximum third compressive stress. In aspects, the maximum second compressive stress can be substantially equal to the maximum fourth compressive stress. In aspects, the first depth of layer of one or more alkali-metal ions can be substantially equal to the third depth of layer of one or more alkali-metal ions. In aspects, the second depth of layer of one or more alkali-metal ions can be substantially equal to the fourth depth of layer of one or more alkali-metal ions.

In aspects, the central portion 281 can comprise a first central compressive stress region at the first central surface area 213 that can extend to a first central depth of compression from the first central surface area 213. In aspects, the central portion 281 can comprise a second central compressive stress region at the second central surface area 243 that can extend to a second central depth of compression from the second central surface area 243. In further aspects, the first central compressive stress region and/or the second compressive stress region can be within the central region 248 of the central portion 281 (e.g., coextensive with the first central surface area 213 and/or the second central surface area 243). In further aspects, the first central depth of compression and/or the second central depth of compression as a percentage of the central thickness 209 can be within one or more of the ranges discussed above for the first depth of compression and/or the second depth of compression as a percentage of the substrate thickness 207. In further aspects, the first central depth of compression and/or the second central depth of compression as a percentage of the central thickness 209 can be about 10% or more, for example, from about 10% to about 30%, from about 10% to about 25%, from about 15% to about 25%, from about 15% to about 20%, or any range or subrange therebetween. In further aspects, the first central depth of compression can be substantially equal to the second central depth of compression. In aspects, the first central depth of compression and/or the second central depth of compression can be within one or more of the ranges discussed above for the first depth of compression and/or the second depth of compression. By providing a central portion comprising a glass-based and/or ceramic-based portion comprising a first central depth of compression and/or a second central depth of compression in a range from about 1% to about 30% of the central thickness, good impact and/or puncture resistance can be enabled.

In aspects, the first central compressive stress region can comprise a maximum first central compressive stress. In aspects, the second central compressive stress region can comprise a maximum second central compressive stress. In further aspects, the maximum first central compressive stress and/or the maximum second central compressive stress can be within one or more of the ranges discussed above for the maximum first compressive stress and/or the maximum second compressive stress. By providing a maximum first central compressive stress and/or a maximum second central compressive stress in a range from about 100 MPa to about 1,500 MPa, good impact and/or puncture resistance can be enabled.

In aspects, the central portion 281 can comprise a first central depth of layer of one or more alkali-metal ions associated with the first central compressive stress region and the first central depth of compression. In aspects, the central portion 281 can comprise a second central depth of layer of one or more alkali-metal ions associated with the second central compressive stress region and the second central depth of compression. In aspects, the one or more alkali ions of the first central depth of layer of the one or more alkali ions and/or the second central depth of layer of the one or more alkali ions comprises potassium. In aspects, the first central depth of layer and/or the second central depth of layer as a percentage of the central thickness 209 can be within one or more of the ranges discussed above for the first depth of layer and/or the second depth of layer as a percentage of the substrate thickness 207. In aspects, the first central depth of layer of the one or more alkali-metal ions and/or the second central depth of layer of the one or more alkali-metal ions can be within one or more of the ranges discussed above for the first depth of layer and/or the second depth of layer. In aspects, the first depth of compression and/or the third depth of compression can be greater than the first central depth of compression. In aspects, the second depth of compression and/or the fourth depth of compression can be greater than the second central depth of compression. In aspects, the first depth of layer and/or the third depth of layer can be greater than the first central depth of layer. In aspects, the second depth of layer and/or the fourth depth of layer can be greater than the second central depth of layer.

In aspects, the central portion 281 may comprise a central tensile stress region. In aspects, the central tensile stress region can be positioned between the first central compressive stress region and the second central compressive stress region. In aspects, the central tensile stress region can comprise a maximum central tensile stress. In further aspects, the maximum central tensile stress can be about 125 MPa or more, about 150 MPa or more, about 200 MPa or more, about 375 MPa or less, about 300 MPa or less, or about 250 MPa or less. In further aspects, the maximum central tensile stress can be in a range from about 125 MPa to about 375 MPa, from about 125 MPa to about 300 MPa, from about 125 MPa to about 250 MPa, from about 150 MPa to about 375 MPa, from about 150 MPa to about 300 MPa, from about 150 MPa to about 250 MPa, from about 200 MPa to about 375 MPa, from about 200 MPa to about 300 MPa, from about 200 MPa to about 250 MPa, or any range or subrange therebetween. Providing a maximum central tensile stress in a range from about 125 MPa to about 375 MPa can enable low minimum bend radii.

Throughout the disclosure, a refractive index is measured in accordance with ASTM E1967-19 using light comprising an optical wavelength of 589 nm. In aspects, a substrate refractive index of the foldable substrate 201 can be about 1.4 or more, about 1.45 or more, about 1.47 or more, about 1.49 or more, about 1.5 or more, about 1.53 or more, about 1.55 or more, about 1.6 or less, about 1.58 or less, about 1.56 or less, about 1.55 or less, about 1.54 or less, about 1.53 or less, about 1.52 or less, or about 1.51 or less. In aspects, a substrate refractive index of the foldable substrate 201 can be in a range from about 1.4 to about 1.6, from about 1.45 to about 1.58, from about 1.47 to about 1.56, from about 1.49 to about 1.55, from about 1.5 to about 1.54, from about 1.51 to about 1.53, or any range or subrange therebetween. In aspects, the foldable substrate 201 can be optically clear.

In aspects, the polymer-based portion 289 and/or 299 can be optically clear. In aspects, a first refractive index of the polymer-based portion 289 and/or 299 may be about 1.3 or more, about 1.4 or more, about 1.45 or more, about 1.47 or more, about 1.49 or more, about 1.5 or more, about 1.53 or more, about 1.55 or more, about 1.7 or less, about 1.6 or less, about 1.58 or less, about 1.56 or less, about 1.55 or less, about 1.54 or less, about 1.53 or less, about 1.52 or less, about 1.51 or less, or about 1.5 or less. In aspects, the first refractive index of the polymer-based portion 289 and/or 299 can be in a range from about 1.3 to about 2 from about 1.4 to about 1.6, from about 1.45 to about 1.58, from about 1.45 to about 1.56, from about 1.47 to about 1.55, from about 1.47 to about 1.54, from about 1.49 to about 1.53, from about 1.5 to about 1.52, from about 1.5 to about 1.51, or any range or subrange therebetween.

In aspects, a differential equal to the absolute value of the difference between the substrate refractive index of the foldable substrate 201 and the first refractive index of the polymer-based portion 289 and/or 299 can be about 0.1 or less, about 0.07 or less, about 0.05 or less, about 0.02 or less, about 0.01 or less, about 0.001 or more, about 0.005 or more, about 0.01 or more, or about 0.02 or more. In aspects, the differential can be in a range from about 0.001 to about 0.1, from about 0.001 to about 0.07, from about 0.005 to about 0.05, from about 0.005 to about 0.02, from about 0.005 to about 0.01, or any range or subrange therebetween. In aspects, the differential can be in a range from about 0.01 to about 0.1, from about 0.01 to about 0.07, from about 0.02 to about 0.05, or any range or subrange therebetween. In aspects, the substrate refractive index of the foldable substrate 201 may be greater than the first refractive index of the polymer-based portion 289 and/or 299. In aspects, the substrate refractive index of the foldable substrate 201 may be less than the first refractive index of the polymer-based portion 289 and/or 299.

In aspects, the adhesive layer 261 can comprise a third refractive index that can be within one or more of the ranges discussed above with regards to the first refractive index of the polymer-based portion 289 and/or 299. In aspects, a differential equal to the absolute value of the difference between the third refractive index of the adhesive layer 261 and the first refractive index of the polymer-based portion 289 and/or 299 can be about 0.1 or less, about 0.07 or less, about 0.05 or less, about 0.02 or less, about 0.01 or less, about 0.001 or more, about 0.005 or more, about 0.01 or more, or about 0.02 or more. In aspects, the differential can be in a range from about 0.001 to about 0.1, from about 0.001 to about 0.07, from about 0.005 to about 0.05, from about 0.005 to about 0.02, from about 0.005 to about 0.01, or any range or subrange therebetween. In aspects, the differential can be in a range from about 0.01 to about 0.1, from about 0.01 to about 0.05, from about 0.02 to about 0.05, or any range or subrange therebetween. In aspects, the third refractive index of the adhesive layer 261 may be greater than the first refractive index of the polymer-based portion 289 and/or 299. In aspects, the third refractive index of the adhesive layer 261 may be less than the first refractive index of the polymer-based portion 289 and/or 299.

In aspects, a differential equal to the absolute value of the difference between the third refractive index of the adhesive layer 261 and the substrate refractive index of the foldable substrate 201 can be about 0.1 or less, about 0.07 or less, about 0.05 or less, about 0.02 or less, about 0.01 or less, about 0.001 or more, about 0.005 or more, about 0.01 or more, or about 0.02 or more. In aspects, the differential can be in a range from about 0.001 to about 0.1, from about 0.001 to about 0.07, from about 0.005 to about 0.05, from about 0.005 to about 0.02, from about 0.005 to about 0.01, or any range or subrange therebetween. In aspects, the differential can be in a range from about 0.01 to about 0.1, from about 0.01 to about 0.07, from about 0.02 to about 0.05, or any range or subrange therebetween. In aspects, the third refractive index of the adhesive layer 261 may be greater than the substrate refractive index of the foldable substrate 201. In aspects, the third refractive index of the adhesive layer 261 may be less than the substrate refractive index of the foldable substrate 201.

In aspects, the coating 251, the cover substrate 351, and/or the additional substrate 371 can comprise a fourth refractive index that can be within one or more of the ranges discussed above with regards to the first refractive index of the polymer-based portion 289 and/or 299. In aspects, a differential equal to the absolute value of the difference between the fourth refractive index of the coating 251 and the first refractive index of the polymer-based portion 289 and/or 299 can be about 0.1 or less, about 0.07 or less, about 0.05 or less, about 0.02 or less, about 0.01 or less, about 0.001 or more, about 0.005 or more, about 0.01 or more, or about 0.02 or more. In aspects, the differential can be in a range from about 0.001 to about 0.1, from about 0.001 to about 0.07, from about 0.005 to about 0.05, from about 0.005 to about 0.02, from about 0.005 to about 0.01, or any range or subrange therebetween. In aspects, the differential can be in a range from about 0.01 to about 0.1, from about 0.01 to about 0.07, from about 0.02 to about 0.05, or any range or subrange therebetween. In aspects, the fourth refractive index of the coating 251 may be greater than the first refractive index of the polymer-based portion 289 and/or 299. In aspects, the fourth refractive index of the coating 251 may be less than the first refractive index of the polymer-based portion 289 and/or 299.

FIGS. 7-8 schematically illustrate aspects of a foldable apparatus 601 and/or 801 in accordance with aspects of the disclosure in a folded configuration. As shown in FIG. 7, the foldable apparatus 601 is folded such that the second major surface 205 of the foldable substrate 201 is on the inside of the folded foldable apparatus 501. In this case, for example, a display would be located on the side of the second major surface 205, and a viewer would view the display from the side of the first major surface 203. As shown in FIG. 8, the foldable apparatus 101 shown in FIG. 1 can be modified (as described herein) and folded to form folded foldable apparatus 801 such that the first major surface 203 of the foldable substrate 201 is on the inside of the folded foldable apparatus 801. In FIG. 8, a user would view a display device in place of the PET sheet 707 through the foldable substrate 201 and, thus, would be positioned on the side of the first major surface 203. In aspects, as shown in FIG. 8, the foldable apparatus 801 can comprise a coating 251 disposed over the foldable apparatus 801 (e.g., first major surface 203). In further aspects, a user would view a display device in place of the PET sheet 707 through the coating 251. In aspects, as shown in FIG. 8, the polymer-based portion 289 and/or 299 can be disposed over the foldable substrate 201. In further aspects, although not shown, an additional substrate (e.g., glass-based substrate and/or ceramic-based substrate in place of release liner 271 or PET sheet 707), and the additional substrate can be disposed over a display device.

As used herein, "foldable" includes complete folding, partial folding, bending, flexing, or multiple capabilities. As used herein, the terms "fail," "failure" and the like refer to breakage, destruction, delamination, or crack propagation. Likewise, a foldable apparatus achieves a parallel plate distance of "X," or has a parallel plate distance of "X," or comprises a parallel plate distance of "X" if it resists failure when the foldable apparatus is held at a parallel plate distance of "X" for 24 hours at about 85° C. and about 85% relative humidity.

As used herein, the "parallel plate distance" of a foldable apparatus is measured with the following test configuration and process using a parallel plate apparatus 701 (see FIGS. 7-8) that comprises a pair of parallel rigid stainless-steel plates 703, 705 comprising a first rigid stainless-steel plate 703 and a second rigid stainless-steel plate 705. When measuring the "parallel plate distance" for a foldable apparatus resembling the foldable apparatus 101 shown in FIG. 2, the adhesive layer 261 is removed and is replaced by a test adhesive layer 709 comprises a thickness of 50 μm. Further, the test is conducted with a 100 μm thick sheet 707 of polyethylene terephthalate (PET) rather than with the release liner 271 of FIG. 2. Thus, during the test to determine the "parallel plate distance" of a configuration of a foldable apparatus, the foldable apparatus 601 is produced by using the 100 μm thick sheet 707 of polyethylene terephthalate (PET) rather than with the release liner 271 of FIG. 2. Consequently, the foldable apparatus 101 shown in FIG. 1 can be modified (as described herein) and folded to form folded foldable apparatus 801 shown in FIG. 8.

When measuring a "parallel plate distance" of a foldable substrate, the foldable apparatus 601 is formed by disposing the test adhesive layer 709 with the thickness of 50 μm and the 100 μm thick sheet 707 of polyethylene terephthalate (PET) attached to the test adhesive layer 709 in an identical manner that the release liner 271 is attached to the second contact surface 265 of the adhesive layer 261 as shown in FIG. 2. To test the foldable apparatus 601 of FIG. 7, the test adhesive layer 709 and the PET sheet 707 can likewise be installed as shown in the configuration of FIG. 7 to conduct the test on the foldable apparatus 601. The foldable apparatus 601 is placed between the pair of parallel rigid stainless-steel plates 703 and 705 such that the foldable substrate 201 will be on the inside of the bend, similar to the configuration shown in FIG. 7. Similarly, foldable apparatus 401 shown in FIG. 4 would be prepared for testing by replacing the adhesive layer 261 and the release liner 271 with the test adhesive layer 709 and the 100 μm thick sheet 707 of PET. For determining a "parallel plate distance", the distance between the parallel plates is reduced at a rate of 50 μm/second until the parallel plate distance 711 is equal to the "parallel plate distance" to be tested. Then, the parallel plates are held at the "parallel plate distance" to be tested for 24 hours at about 85° C. and about 85% relative humidity. As used herein, the "minimum parallel plate distance" is the smallest parallel plate distance that the foldable apparatus can withstand without failure under the conditions and configuration described above.

In aspects, the foldable apparatus 101, 301, 401, 501, 601, 801, and/or 3301 and/or foldable substrate 201 can achieve a parallel plate distance of 100 mm or less, 50 mm or less, 20 mm or less, 10 mm or less, 5 mm or less, or 3 mm or less. In further aspects, the foldable apparatus 101, 301, 401, 501, 601, 801, and/or 3301 and/or foldable substrate 201 can achieve a parallel plate distance of 50 millimeters (mm), or 20 mm, or 10 mm, of 5 mm, or 3 mm. In aspects, the foldable apparatus 101, 301, 401, 501, 601, 801, and/or 3301 and/or foldable substrate 201 can comprise a minimum parallel plate distance of about 40 mm or less, about 20 mm or less, about 10 mm or less, about 5 mm or less, about 3 mm or less, about 1 mm or less, about 1 mm or more, about 3 mm or more, about 5 mm or more, or about 10 mm or more. In aspects, the foldable apparatus 101, 301, 401, 501, 601, 801, and/or 3301 and/or foldable substrate 201 can comprise a minimum parallel plate distance in a range from about 1 mm to about 40 mm, from about 1 mm to about 20 mm, from about 1 mm to about 10 mm, from about 1 mm to about 5 mm, from about 1 mm to about 3 mm. In aspects, the foldable apparatus 101, 301, 401, 501, 601, 801, and/or 3301 and/or foldable substrate 201 can achieve a minimum parallel plate distance in a range from about 2 mm to about 40 mm, from about 2 mm to about 20 mm, from about 2 mm to about 10 mm, from about 3 mm to about 10 mm, from about 3 mm to about 5 mm, from about 5 mm to about 10 mm, or any range or subrange therebetween.

A width 287 of the central portion 281 of the foldable substrate 201 is defined between the first portion 221 and the second portion 231 in the direction 106 of the length 105. In aspects, the width 287 of the central portion 281 of the foldable substrate 201 can extend from the first portion 221 to the second portion 231. A width 210 of the first central surface area 213 and the second central surface area 243 of the foldable substrate 201 is defined between the first transition region 212 and the second transition region 218, for example, as the portion comprising the central thickness 209, in the direction 106 of the length 105. In aspects, the width 287 of the central portion 281 of the foldable substrate 201 and/or the width 210 of the first central surface area 213 of the foldable substrate 201 can be about 1.4 times or more, about 1.6 times or more, about 2 times or more, about 2.2 times or more, about 3 times or less, or about 2.5 times or less the minimum parallel plate distance. In aspects, the width 287 of the central portion 281 of the foldable substrate 201 and/or the width 210 of the first central surface area 213 of the foldable substrate 201 as a multiple of the minimum parallel plate distance can be in a range from about 1.4 times to about 3 times, from about 1.6 times to about 3 times, from about 1.6 times to about 2.5 times, from about 2 times to about 2.5 times, from about 2.2 times to about 2.5 times, from about 2.2 times to about 3 times, or any range or subrange therebetween. Without wishing to be bound by theory, the length of a bent portion in a circular configuration between parallel plates can be about 1.6 times the parallel plate distance 711. Without wishing to be bound by theory, the length of a bend portion in an elliptical configuration between parallel plates can be about 2.2 times the parallel plate distance 711. In aspects, the width 287 of the central portion 281 of the foldable substrate 201 and/or the width 210 of the first central surface area 213 of the foldable substrate 201 can be about 1 mm or more, about 3 mm or more, about 5 mm or more, about 8 mm or more, about 10 mm or more, about 15 mm or more, about 20 mm or more, about 100 mm or less, about 60 mm or less, about 50 mm or less, about 40 mm or less, about 35 mm or less, about 30 mm or less, or about 25 mm or less. In aspects, the width 287 of the central portion 281 of the foldable substrate 201 and/or the width 210 of the first central surface area 213 of the foldable substrate 201 can be in a range from about 1 mm to about 100 mm, from about 3 mm to about 100 mm, from about 3 mm to about 60 mm, from about 5 mm to about 60 mm, from about 5 mm to about 50 mm, from about 8 mm to about 50 mm, from about 8 mm to about 40 mm, from about 10 mm to about 40 mm, from about 10 mm to about 35 mm, from about 15 mm to about 35 mm, from about 15 mm to about 30 mm, from about 20 mm to about 30 mm, from about 20 mm to about 25 mm, or any range of subrange therebetween. In aspects, the width 287 of the central portion 281 of the foldable substrate 201 and/or the width 210 of the first central surface area 213 of the foldable substrate 201 can be about 2.8 mm or more, about 6 mm or more, about 9 mm or more, about 60 mm or less, about 40 mm, or less, or about 24 mm or less. In aspects, the width 287 of the central portion 281 of the foldable substrate 201 and/or the width 210 of the first central surface area 213 of the foldable substrate 201 can be in a range from about 2.8 mm to about 60 mm, from about 2.8 mm to about 40 mm, from about 2.8 mm to about 24 mm, from about 6 mm to about 60 mm, from about 6 mm to about 40 mm, from about 6 mm to about 24 mm, from about 9 mm to about 60 mm, from about 9 mm to about 40 mm, from about 9 mm to about 24 mm, or any range of subrange therebetween. By providing a width within the above-noted ranges for the central portion (e.g., between the first portion and the second portion), folding of the foldable apparatus without failure can be facilitated.

The foldable apparatus 101, 301, 401, 501, 601, 801, and/or 3301 may have an impact resistance defined by the capability of a region of the foldable apparatus (e.g., a region comprising the first portion 221, a region comprising the second portion 231, a region comprising the polymer-based portion 289 and/or 299 and/or central portion 281) to avoid failure at a pen drop height (e.g., 5 centimeters (cm) or more, 10 centimeters or more, 20 cm or more), when measured according to the "Pen Drop Test." As used herein, the "Pen Drop Test" is conducted such that samples of foldable apparatus are tested with the load (i.e., from a pen dropped from a certain height) imparted to an outer major surface (e.g., first major surface 203 of the foldable substrate 201 for foldable apparatus 101 or 301 shown in FIGS. 2-3, second major surface 205 of the foldable substrate 201 for foldable apparatus 301, 401, or 501 shown in FIGS. 3-5) with the foldable apparatus configured as in the parallel plate test with 100 μm thick sheet 707 of PET attached to the test adhesive layer 709 having a thickness of 50 μm instead of the release liner 271 shown in FIG. 2. As such, the PET layer in the Pen Drop Test is meant to simulate a foldable electronic display device (e.g., an OLED device). During testing, the foldable apparatus bonded to the PET layer is placed on an aluminum plate (6063 aluminum alloy, as polished to a surface roughness with 400 grit paper) with the PET layer in contact with the aluminum plate. No tape is used on the side of the sample resting on the aluminum plate.

A tube is used for the Pen Drop Test to guide a pen to an outer surface of the foldable apparatus. For the foldable apparatus 101, 301, 401, 501, 601, 801, and/or 3301 in FIGS. 2-5, 7-8, and 33, the pen is guided to the outer major surface (e.g., first major surface 203 of the foldable substrate 201 for foldable apparatus 101 or 301 shown in FIGS. 2-3, second major surface 205 of the foldable substrate 201 for foldable apparatus 301, 401, or 501 shown in FIGS. 3-5), and the tube is placed in contact with the second major surface 205 of the foldable substrate 201 so that the longitudinal axis of the tube is substantially perpendicular to the outer major surface with the longitudinal axis of the tube extending in the direction of gravity. The tube has an outside diameter of 1 inch (2.54 cm), an inside diameter of nine-sixteenths of an inch (1.4 cm), and a length of 90 cm. An acrylonitrile butadiene (ABS) shim is employed to hold the pen at a predetermined height for each test. After each drop, the tube is relocated relative to the sample to guide the pen to a different impact location on the sample. The pen employed in Pen Drop Test is a BIC Easy Glide Pen, Fine, having a tungsten carbide ballpoint tip of 0.7 mm (0.68 mm) diameter, and a weight of 5.73 grams (g) including the cap (4.68 g without the cap).

For the Pen Drop Test, the pen is dropped with the cap attached to the top end (i.e., the end opposite the tip) so that the ballpoint can interact with the test sample. In a drop sequence according to the Pen Drop Test, one pen drop is conducted at an initial height of 1 cm, followed by successive drops in 0.5 cm increments up to 20 cm, and then after 20 cm, 2 cm increments until failure of the test sample. After each drop is conducted, the presence of any observable fracture, failure, or other evidence of damage to the sample is recorded along with the particular pen drop height. Using the Pen Drop Test, multiple samples can be tested according to the same drop sequence to generate a population with improved statistical accuracy. For the Pen Drop Test, the pen is to be changed to a new pen after every 5 drops, and for each new sample tested. In addition, all pen drops are conducted at random locations on the sample at or near the center of the sample, with no pen drops near or on the edge of the samples.

For purposes of the Pen Drop Test, "failure" means the formation of a visible mechanical defect in a laminate. The mechanical defect may be a crack or plastic deformation (e.g., surface indentation). The crack may be a surface crack or a through crack. The crack may be formed on an interior or exterior surface of a laminate. The crack may extend through all or a portion of the foldable substrate 201 and/or coating. A visible mechanical defect has a minimum dimension of 0.2 mm or more.

In aspects, the foldable apparatus can resist failure for a pen drop in a region comprising the first portion 221 or the second portion 231 at a pen drop height of 10 centimeters (cm), 12 cm, 14 cm, 16 cm, or 20 cm. In aspects, a maximum pen drop height that the foldable apparatus can withstand without failure over a region comprising the first portion 221 or the second portion 231 may be about 10 cm or more, about 12 cm or more, about 14 cm or more, about 16 cm or more, about 40 cm or less, or about 30 cm or less, about 20 cm or less, about 18 cm or less. In aspects, a maximum pen drop height that the foldable apparatus can withstand without failure over a region comprising the first portion 221 or the second portion 231 can be in a range from about 10 cm to about 40 cm, from about 12 cm to about 40 cm, from about 12 cm to about 30 cm, from about 14 cm to about 30 cm, from about 14 cm to about 20 cm, from about 16 cm to about 20 cm, from about 18 cm to about 20 cm, or any range or subrange therebetween.

In aspects, the foldable apparatus can resist failure for a pen drop in a region (e.g., central portion 281) comprising the polymer-based portion 289 and/or 299 between the first portion 221 and the second portion 231 at a pen drop height of 1 cm, 2 cm, 3 cm, 4 cm, 5 cm, or more. In aspects, a maximum pen drop height that the foldable apparatus can withstand without failure over a region comprising the polymer-based portion 289 and/or 299 between the first portion 221 and the second portion 231 may be about 1 cm or more, about 2 cm or more, about 3 cm or more, about 4 cm or more, about 20 cm or less, about 10 cm or less, about 8 cm or less, or about 6 cm or less. In aspects, a maximum pen drop height that the foldable apparatus can withstand without failure over a region comprising the polymer-based portion 289 and/or 299 between the first portion 221 and the second portion 231 can be in a range from about 1 cm to about 20 cm, from about 2 cm to about 20 cm, from about 2 cm to about 10 cm, from about 3 cm to about 10 cm, from about 3 cm to about 8 cm, from about 4 cm to about 8 cm, from about 4 cm to about 6 cm, or any range or subrange therebetween. In aspects, a maximum pen drop height that the foldable apparatus can withstand without failure of a region comprising the polymer-based portion 289 and/or 299 between the first portion 221 and the second portion 231 can be in a range from about 1 cm to about 10 cm, from about 1 cm to about 8 cm, from about 1 cm to about 5 cm, from about 2 cm to about 5 cm, from about 3 cm to about 5 cm, from about 4 cm to about 5 cm, or any range or subrange therebetween.

In aspects, the foldable substrate 201 and/or the foldable apparatus 101, 301, 401, 501, 601, 801, and/or 3301 can comprise a contrast ratio, as determined in the Contrast Test defined herein (see discussion below with reference to FIGS. 26 and 28). Throughout the disclosure, the "contrast ratio" (C) is defined as a difference between a maximum fractional intensity (max) and a minimum fractional intensity (min) divided by the sum of the maximum fractional intensity and the minimum fractional intensity (i.e., C=(max−min)/(max+min)). As discussed below, the maximum fractional intensity and minimum fractional intensity are determined by processing a signal (e.g., image) from imaging the foldable substrate and/or foldable apparatus under brightfield transmission conditions. Without wishing to be bound by theory, the contrast ratio can be related to a visibility (e.g., optical distortions) of the transition region to the naked eye (e.g., user) with lower contrast ratios associated with less visibility. As discussed in the Examples with reference to FIG. 29, a contrast ratio of about 0.27 or less, about 0.26 or less, or about 0.25 or less can be invisible to the naked eye (e.g., user). In aspects, the contrast ratio of the foldable substrate 201 and/or the foldable apparatus 101, 301, 401, 501, 601, 801, and/or 3301 can be about 0.25 or less, about 0.24 or less, about 0.23 or less, about 0.22 or less, about 0.21 or less, about 0.20 or less, about 0.18 or less, about 0.15 or less, about 0.12 or less, or about 0.10 or less. In aspects, the contrast ratio of the foldable substrate 201 and/or the foldable apparatus 101, 301, 401, 501, 601, 801, and/or 3301 can be in a range from about 0.01 to about 0.27, from about 0.01 to about 0.26, from about 0.01 to about 0.25, from about 0.03 to about 0.24, from about 0.05 to about 0.23, from about 0.07 to about 0.22, from about 0.10 to about 0.21, from about 0.12 to about 0.20, from about 0.15 to about 0.18, or any range or subrange therebetween.

Methods of determining the contrast ratio (e.g., using the Contrast Test) and contrast apparatus 2601 that can be used therein will be discussed with reference to FIGS. 26-28 and 30. In aspects, as shown in FIG. 26, the contrast apparatus 2601 comprises a sample holder 2641 (e.g., clamps 2643a and 2643b) defining a cavity 2651 configured to receive a transparent apparatus (e.g., foldable substrate 201 and/or the foldable apparatus 101, 301, 401, 501, 601, and/or 801) to be measured. In aspects, as shown, the contrast apparatus 2601 comprises a light source 2611 configured to emit a light beam (e.g., first beam 2605a) along optical axis 2603 in direction 2602. In aspects, as shown, the light beam travelling along the optical axis 2603 can be collimated to produce a collimated beam 2605c, for example, by impinging the light beam (e.g., first beam 2605a) on a pinhole aperture (e.g., optical device 2621 with a pinhole aperture 2623) and subsequently impinging the light beam (e.g., second beam 2605b) on a spatial filter optical aperture (e.g., optical device 2631). As shown, the collimated beam 2605c travelling along the optical axis 2603 is configured to impinge the central portion 281 (e.g., including transition regions discussed above with reference to FIGS. 2-5) of the sample positioned in the cavity 2651 of the sample holder 2641.

After impinging the sample and/or cavity 2651, the collimated beam 2605c has become a measurement beam 2605d with information about optical distortions associated with the transition regions of the sample (discussed below with reference to FIG. 27). In aspects, the measurement beam 2605d can be focused on a detector 2683 (e.g., detecting surface and/or pixels) of an optical detector 2681, for example, using optical devices 2661 and/or 2671. The optical detector 2681 can be configured to generate a signal corresponding to an image associated with the optical distortions produced by the sample (e.g., central portion 281 and/or transition region(s)), which can be processed to determine the contrast ratio.

Figure 27:
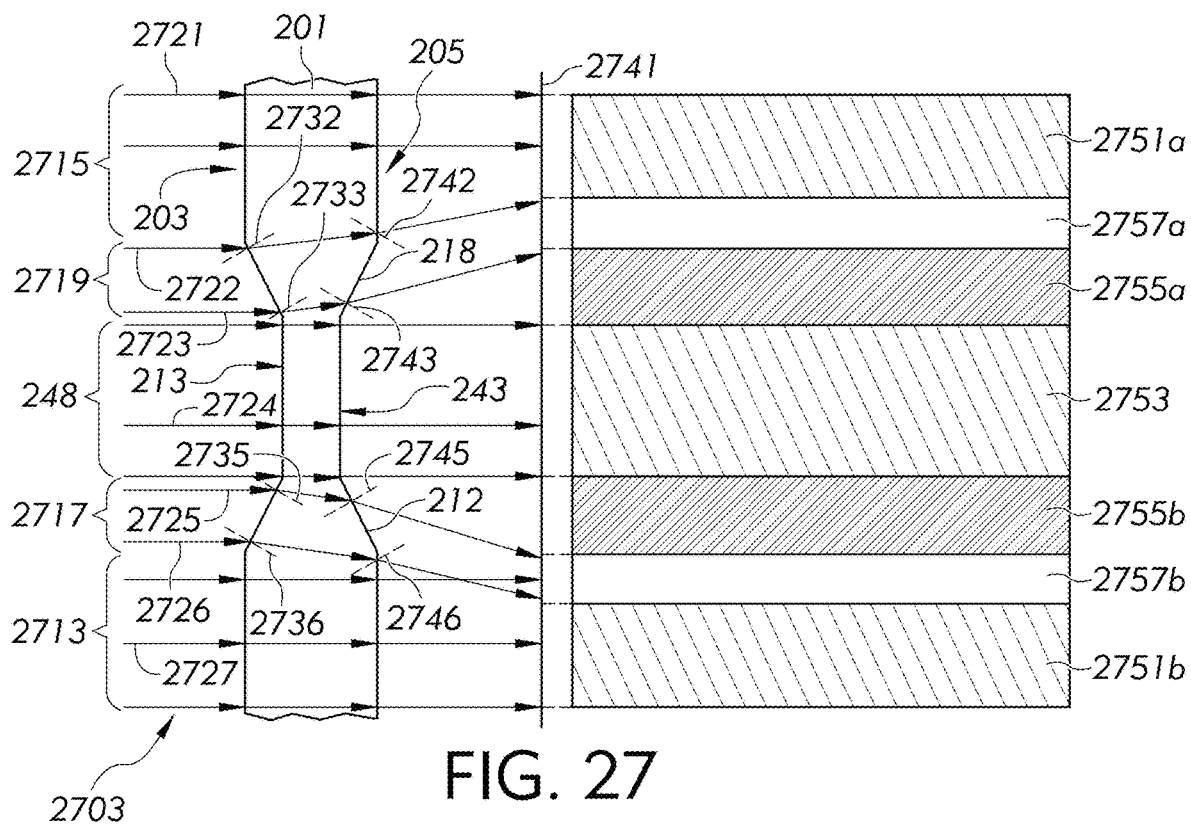
FIG. 27 schematically illustrates ray-tracing demonstrating how a central portion of a foldable apparatus can distort light passing therethrough.

With reference to FIG. 27, the ray tracing (left) will be used to explain the optical distortions (right) that can be associated with transition regions (e.g., first transition region 212 and/or second transition region 218). For simplicity, foldable substrate 201 from FIGS. 2-3 is shown by itself with the understanding that additional materials (e.g., first polymer-based portion, second polymer-based portion) can be present but would further complicate the explanation. An incident light beam is represented by a plurality of rays 2703 that will be discussed based on the portion of the foldable substrate impinged. In FIG. 27, rays (e.g., ray 2727) in a first portion 2713 pass through the first portion (e.g., first portion 221 in FIGS. 2-3) of the foldable substrate 201 unmodified (e.g., when the rays are at an angle of incidence normal to the first major surface 203). Similarly, rays (e.g., ray 2721) in a second portion 2715 also pass through the second portion (e.g., second portion 231 in FIGS. 2-3) unmodified as do rays (e.g., ray 2724) impinging the central region 248 (e.g., first central surface area 213). However, as shown, rays 2725 and 2726 in a third portion 2717 impinging the first transition region 212 and/or rays 2722 and 2723 in a fourth portion 2719 impinging the second transition region 218 are distorted relative to the other rays. As shown by normal lines 2732, 2733, 2735, and 2736 extending in a direction normal to the corresponding transition surface area (e.g., of the first transition region 212 or the second transition region 218), rays 2722, 2723, 2725, and 2726, respectively, impinge the corresponding transition surface at a non-zero angle of incidence relative to the corresponding normal line 2732, 2733, 2735, and 2736. This non-normal incidence causes refraction of the corresponding rays that orients the rays away from the central region 248 due to the inclination of the corresponding transition region. At the other end of the transition region, the rays are still at a non-zero angle of incidence relative to normal lines 2742, 2743, 2745, and 2746. As depicted in FIG. 27, the path of rays 2722, 2723, 2725, and 2726 after impinging (and travelling through) the transition regions (e.g., first transition region 212 and/or second transition region 218) assumes that there is another material disposed thereon that closely matches the refractive index of the foldable substrate 201, which is why the corresponding rays are not substantially modified when leaving the transition regions. However, even if an index-matching material was not disposed on the second major surface 205 and/or the second central surface area 243, the position of rays 2722, 2723, 2725, and 2726 would still be shifted (e.g., vertically as shown in FIG. 27—distorted) relative to rays 2721, 2724, and 2727 based on the refracted propagation of rays 2722, 2723, 2725, and 2726 in the transition regions (e.g., first transition region 212 and/or second transition region 218). Consequently, rays 2725 and 2726 are distorted towards the first portion 2713, and rays 2722 and 2723 are shifted (e.g., distorted) towards the second portion 2715.

Figure 30:
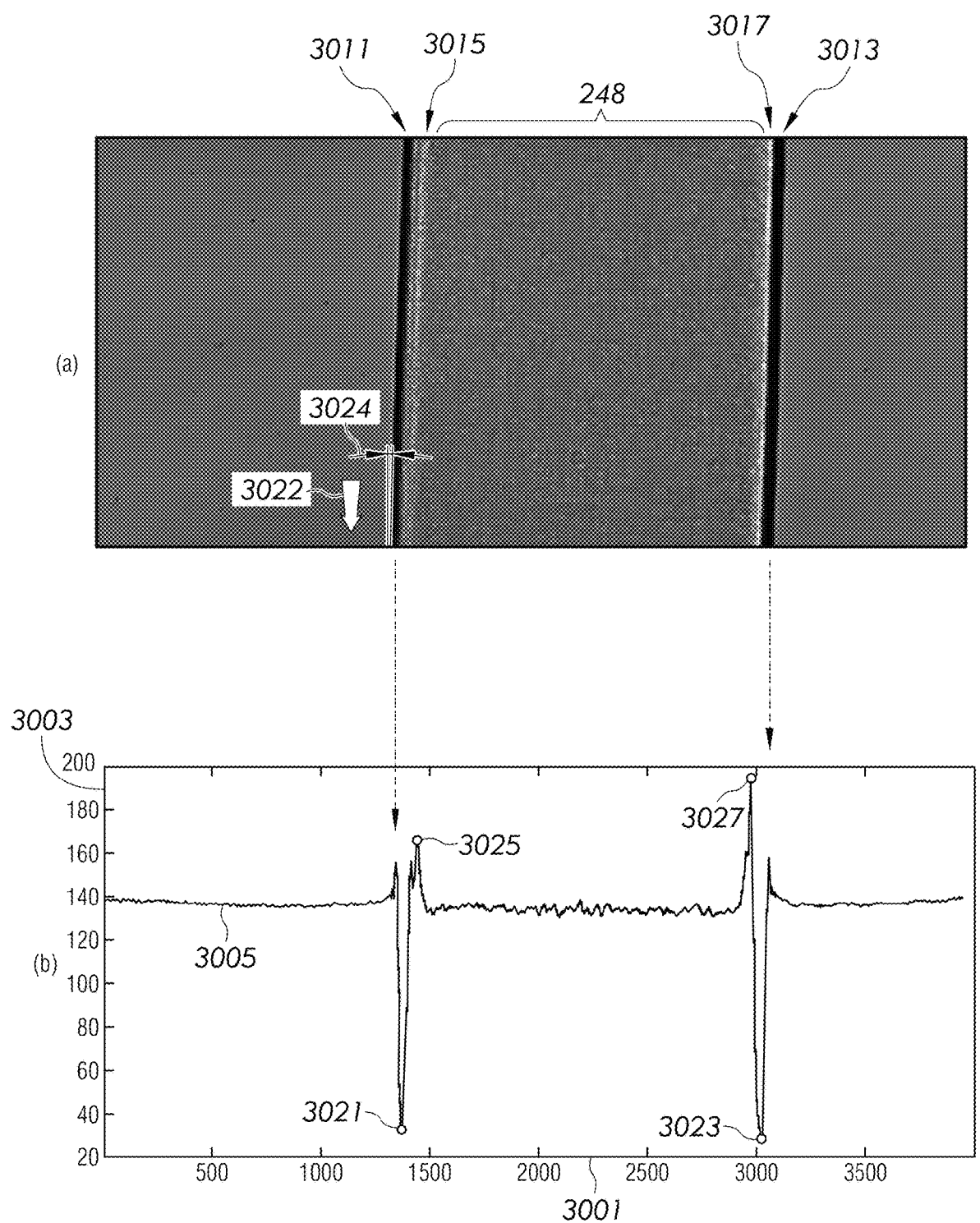
FIG. 30 illustrates methods of calculating a contrast ratio from the experimental measurement for Example A.

The right side of FIG. 27 schematically depicts how the shift of rays in the third portion 2717 and the fourth portion 2719 impacts the intensity of light incident on viewing screen 2741, which can be a stand-in for the detector 2683 or a user's eye. As shown, regions 2751a, 2751b, and 2753 have substantially the same intensity. Relatively bright region 2757a has higher intensity than region 2751a due to the shift (e.g., distortion) of rays 2725 and 2726 towards (and perhaps into the second portion 2715). Consequently, the shift of rays 2725 and 2726 away from the central region 248 (and lack of corresponding shift of rays in the central region 248) produces a relatively dark region 2755a with lower intensity than regions 2751a, 2751b, and 2753. Similarly, relatively bright region 2757b has higher intensity than region 2751b due to the shift (e.g., distortion) of rays 2722 and 2723 towards (and perhaps into the first portion 2713). Consequently, the shift of rays 2722 and 2723 away from the central region 248 (and lack of corresponding shift of rays in the central region 248) produces a relatively dark region 2755b with lower intensity than regions 2751a, 2751b, and 2753. Taken together, a pair of relatively bright (e.g., high intensity) and relatively dark (e.g., low intensity) regions are produced for each transition region. The visibility of (e.g., ability of a user to discern) the presence of this optical distortion is a function of how different the relatively bright regions 2757a and 2757b are from the adjacent relatively dark regions 2755a and 2755b. As discussed below with reference to FIG. 30, the image of FIG. 30(a) is processed to arrive at the graph shown in FIG. 30(b), from which the minima 3021 and 3023 and the maxima 3025 and 3027 are extracted and used to calculate the contrast ratio. Without wishing to be bound by theory, there is a threshold difference in intensity below which humans cannot visually detect (e.g., discern) with the naked eye. If the difference in intensity (as quantified by the contrast ratio) is below this threshold, then the presence of the transition regions cannot be detected (e.g., the central portion 281—see FIGS. 2-5) and appears to be invisible. As discussed herein, a contrast ratio of 0.25 or less is substantially invisible to the human eye.

Figure 28:
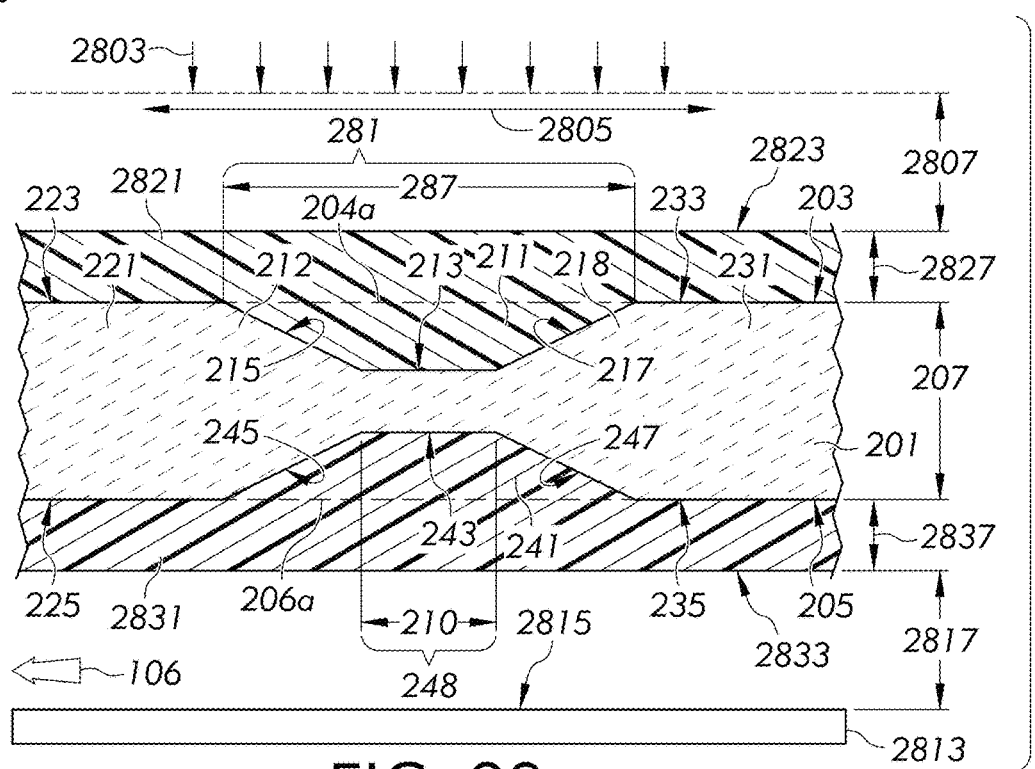
FIG. 28 schematically shows a method of measuring the contrast ratio of a foldable apparatus.

FIG. 28 schematically illustrates general conditions for imaging the central portion 281 to measure a contrast ratio. As shown, the central portion 281 (e.g., first transition region 212 and/or second transition region 218) is imaged using brightfield transmission, where a light beam 2803 is incident at 0° relative to a direction normal to a third contact surface 2823 of the first polymer-based portion 2821 of the test sample or a first major surface 203 of the foldable substrate 201 of the reference sample. The test sample is positioned such that a beam width 2805 of the light beam 2803 from a beam source covers the width 287 of the central portion 281. A first beam spacing 2807 between a location where the light beam 2803 is collimated and the third contact surface 2823 of the first polymer-based portion 2821 of the test sample or the first major surface 203 of the foldable substrate 201 is at least 1 mm. The test sample can comprise a portion of the first polymer-based portion 2821 extending a first distance 2827 beyond the first major surface 203 of the foldable substrate 201, and/or the test sample can comprise a portion of the second polymer-based portion 2831 extending a second distance 2837 beyond the second major surface 205 of the foldable substrate 201. A photodetector 2813 is positioned such that a second beam spacing 3817 comprising a distance of at least 400 μm (measured in a direction 0° relative to a direction normal to the second major surface 205) from a fourth contact surface 2833 of the second polymer-based portion 2831 of the test sample to the corresponding surface to a detecting surface 2815 of the photodetector 2813. The intensity of light measured by the photodetector 2813 is measured as a function of the direction 106. Then, the fractional intensity as a function of distance along the direction 106 is processed, as discussed herein (above in the previous paragraph and in the following paragraphs), to determine the contrast ratio.

Figure 26:
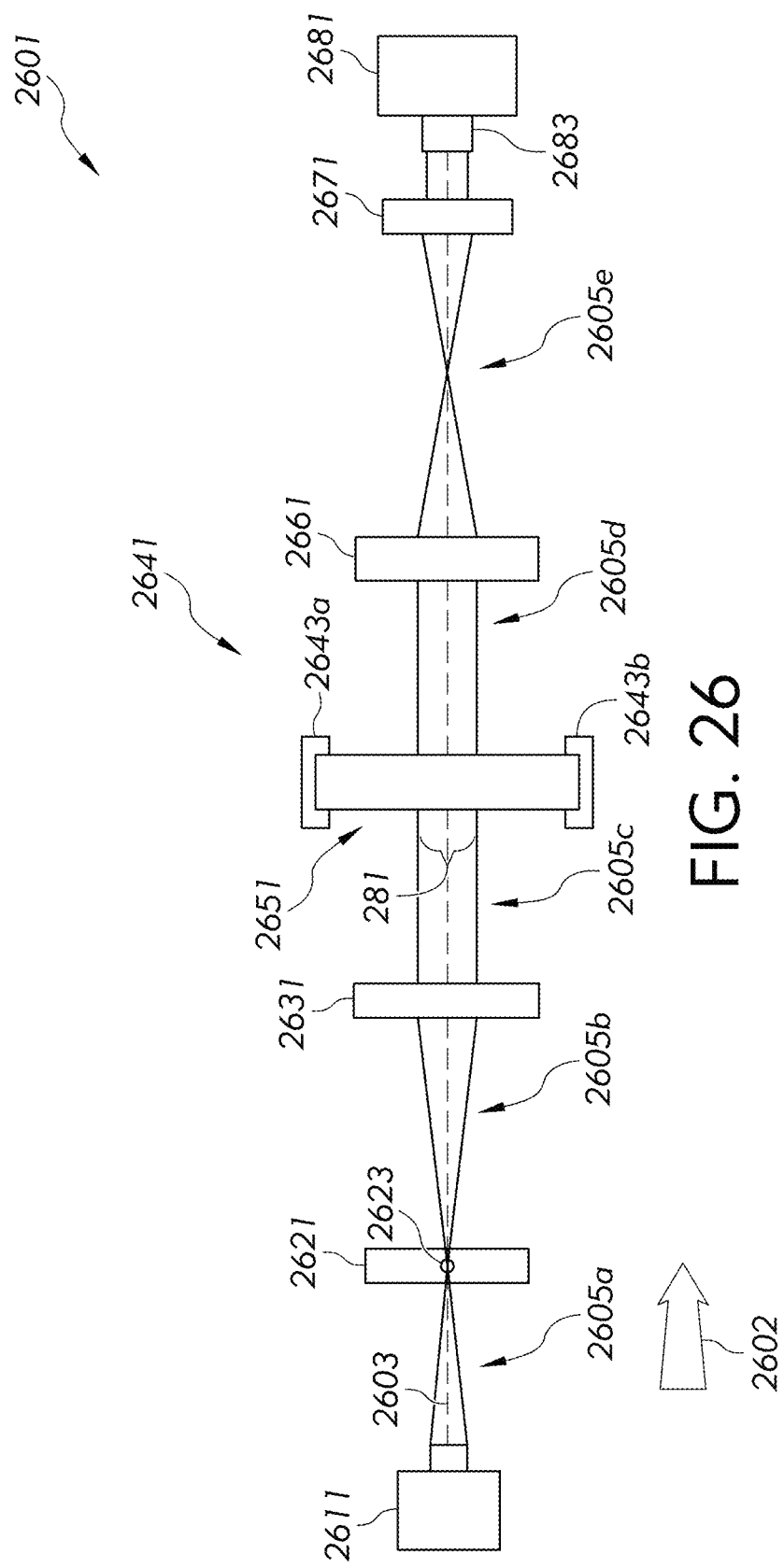
FIG. 26 schematically illustrates a measurement apparatus used in methods of determining a contrast ratio.

With reference to FIG. 26, methods of measuring a contrast ratio of a transparent apparatus (e.g., test sample in FIG. 28 and/or foldable apparatus 101, 301, 401, and/or 501) with at least one recess (e.g., first recess 211 and/or second recess 241) comprises positioning the transparent apparatus in the sample holder 2641 (e.g., in the cavity 2651 between clamps 2643a and 2643b). Methods further comprise generating a collimated beam 2605c from a light source 2611. In aspects, generating the collimated beam can comprise emitting a light beam (e.g., first beam 2605a) towards the sample holder 2641 (e.g., along optical axis 2603 in direction 2602) that is subsequently transmitted through a pinhole aperture 2623 to form a second beam 2605b that is, in turn, transmitted through a spatial filter optical aperture (e.g., optical device 2631) to form the collimated beam 2605c. In aspects, the light source 2611 can be configured to emit the first beam 2605a and/or the collimated beam 2605c comprising substantially monochromatic light. In further aspects, the substantially monochromatic light can comprise an optical wavelength of about 300 nanometers (nm) or more, about 350 nm or more, about 400 nm or more, about 450 nm or more, about 500 nm or more, about 550 nm or more, about 600 nm or more, about 650 nm or more, about 700 nm or less, about 650 or less, about 600 nm or less, about 550 nm or less, about 500 nm or less, about 450 nm or less, about 400 nm or less, or about 350 nm or less. In further aspects, the substantially monochromatic light can comprise an optical wavelength in a range from about 300 nm to about 700 nm, from about 350 nm to about 650 nm, from about 400 nm to about 650 nm, from about 450 nm to about 600 nm, from about 500 nm to about 550 nm, or any range or subrange therebetween. For example, the light source 2611 can be configured to emit substantially monochromatic light comprising an optical wavelength of about 450 nm, about 510 nm, about 590 nm (e.g., 589 nm), about 620 nm, or about 640 nm. Providing a substantially monochromatic light beam (e.g., collimated light beam) can enable sharper imaging of the test sample to determine the contrast ratio (e.g., not affected by chromatic aberrations) compared to non-monochromatic light.

Further, with reference to FIG. 26, methods of measuring the contrast ratio can comprise impinging the transparent apparatus (e.g., test sample in FIG. 28 and/or foldable apparatus 101, 301, 401, and/or 501) positioned in the cavity 2651 with the collimated beam 2605c to form a measurement beam 2605d, which can contain information about the optical distortions from the central portion 281 discussed above with reference to FIG. 27. Methods can further comprise focusing the measurement beam 2605d on the surface (e.g., detector 2683) of an optical detector 2681. In aspects, focusing the measurement beam 2605d can comprise transmitting the measurement beam 2605d through an optical device 2661 (e.g., converging optic) to form a converging beam 2605e that can, in turn, be transmitted through optical device 2671 (e.g., focusing optic) to focus the resulting beam on the surface (e.g., detector 2683) of an optical detector 2681. In aspects, the surface of the detector 2683 can comprise a plurality of pixels. The optical detector 2681 can be configured to generate and transmit a signal corresponding to the measurement beam detected by the optical detector 2681.

Further, with reference to FIG. 30, methods can comprise processing the signal (from the optical detector 2681) to determine a location associated with the at least one recess of the central portion 281. In aspects, methods can comprise removing background noise based on a reference sign detected (by the optical detector 2681) when the cavity 2651 of the sample holder 2641 is empty (e.g., the transparent apparatus is not in the sample holder 2641). In aspects, the processing can comprise rotating an image (see FIG. 30(a)) associated with the signal so that portion of the signal associated with the at least one recess is aligned along an axis. For example, as shown in FIG. 30(a), the signal (e.g., image) can be rotated by angle 3024 so that the dark regions 3011 and 3013 (e.g., lines) are aligned along an axis 3022 (e.g., vertical in FIG. 30(a)). In aspects, determining the location associated with at least one recess can comprise averaging the signal (e.g., rotated signal or rotated image) in a direction (e.g., perpendicular to the axis). For example, as shown in FIG. 30(b), the signal (e.g., rotated image in terms of grayscale values) can be averaged in a direction of the axis 3022 (e.g., collapsing the image in FIG. 30(a) by averaging all values at a given distance in the horizontal distance) to determine curve 3005. In FIG. 30(b), the horizontal axis 3001 corresponds to a position perpendicular to the axis 3022 (e.g., corresponding to pixels of the optical detector), and the vertical axis 3003 corresponds to an average intensity (e.g., grayscale value between 0 and 255). In curve 3005 shown in FIG. 30(b), the dark regions 3011 and 3013 in FIG. 30(a) correspond to minima 3021 and 3023, respectively, of curve 3005 in FIG. 30(b). Between dark regions 3011 and 3013, the light regions 3015 and 3017 of FIG. 30(a) correspond to maxima 3025 and 3027 of curve 3005 in FIG. 30(b). The pairs of minima 3021 and 3023 and maxima 3025 and 3027 are used to determine the location of the recess (e.g., transition regions bracketing the central region 248) and calculate the contrast ratio. As defined above, the "contrast ratio" (C) is defined as a difference between a maximum fractional intensity (max) and a minimum fractional intensity (min) divided by the sum of the maximum fractional intensity and the minimum fractional intensity (i.e., C=(max−min)/(max+min)). With reference to FIG. 30(b), the minima 3021 and 3023 are averaged to determine the minimum value (min), and the maxima 3025 and 3027 are averaged to determine the maximum value (max).

Throughout the disclosure, the Contrast Test for determining the contrast ratio of a transparent apparatus comprising at least one recess involves placing the transparent apparatus in the cavity 2651 of the contrast apparatus 2601 discussed above with reference to FIG. 26. The light source 2611 emits a light beam of monochromatic light with an optical wavelength of 450 nm that is collimating using the pinhole aperture 2623 and the spatial filter optical aperture (e.g., optical device 2631) so that a width of collimated beam is greater than the width 287 (see FIGS. 2, 4-5, and 28) of the central portion 281 of the transparent apparatus. Unless otherwise indicated, with reference to FIG. 28, the first distance 2827 (and the second distance 2837 when the foldable substrate 201 comprises a second recess 241 opposite the first recess is substantially 0 (e.g., within 5 μm, including from 5 μm to −5 μm, where −5 μm means the fourth contact surface 2833 is 5 μm closer to the second central surface area 243 than the second plane 206a with reference to the second polymer-based portion 2831), as achieved by curing a precursor liquid disposed in the corresponding recess to form the corresponding polymer-based portion.

Figure 29:
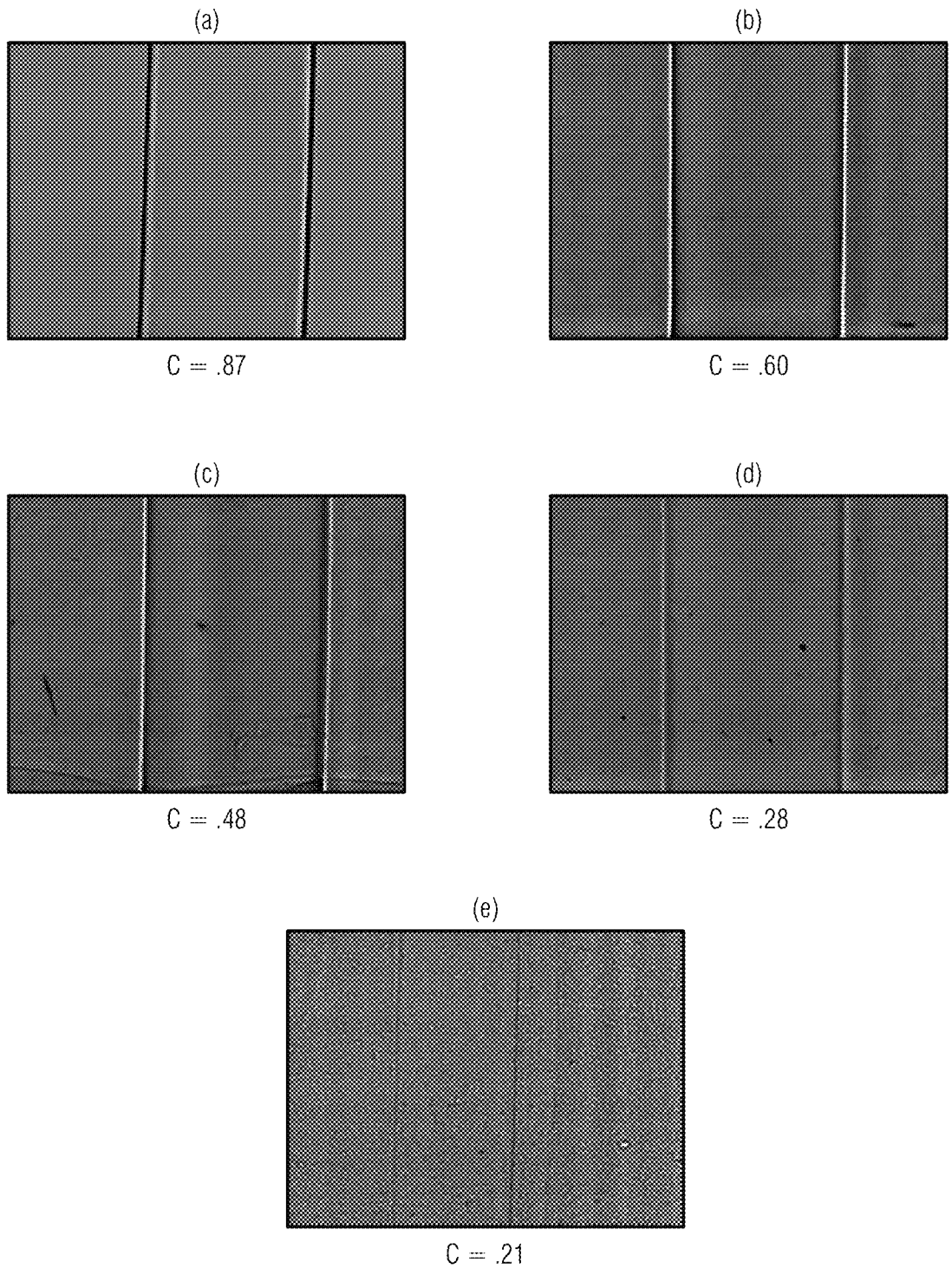
FIG. 29 shows experimental measurements used to determine the contrast ratio of Examples A-E.

As discussed below in the Examples, FIG. 29 shows images of experimental measurements used to determine the contrast ratio of Examples A-E for FIGS. 29(a)-29(e). As shown in FIGS. 29(a)-29(c), the optical distortions associated with the recess (e.g., transition regions) is visible with high contrast, specifically, contrast ratios of 0.87, 0.60, and 0.48, respectively. The optical distortions shown in FIG. 29(d) are less stark than in FIGS. 29(a)-29(c) with the image shown in FIG. 29(d) having a contrast ratio of 0.28. The optical distortions shown in FIG. 29(e) is not clearly discernable (note that the scale in FIGS. 29(a)-29(e) are the same) such that a viewer would not be able to notice the optical distortions specifically associated with the central portion (e.g., transition regions), and the image shown in FIG. 29(e) has a contrast ratio of 0.21. Based on these measurements and additional work, it is believed that a contrast ratio of about 0.25 or less can be invisible to the naked eye (e.g., user), although the contrast ratio can be about 0.27 or less, about 0.26, or less, about 0.24 or less, about 0.23 or less, or 0.22 or less in further aspects.

Aspects of methods of making the foldable apparatus and/or foldable substrate in accordance with aspects of the disclosure will be discussed with reference to the flow charts in FIG. 11-12 and example method steps illustrated in FIGS. 13-25.

Example aspects of making the foldable apparatus 101, 301, 401, 501, 601, and/or 801 and/or foldable substrate 201 illustrated in FIGS. 2-5 and 7-8 will now be discussed with reference to FIGS. 13-21 and the flow chart in FIG. 11. In a first step 1101 of methods of the disclosure, methods can start with providing a foldable substrate 1305 (see FIGS. 13 and 16-17). In aspects, the foldable substrate 1305 may be provided by purchase or otherwise obtaining a substrate or by forming the foldable substrate. In aspects, the foldable substrate 1305 can comprise a glass-based substrate and/or a ceramic-based substrate. In further aspects, glass-based substrates and/or ceramic-based substrates can be provided by forming them with a variety of ribbon forming processes, for example, slot draw, down-draw, fusion down-draw, up-draw, press roll, redraw, or float. In further aspects, ceramic-based substrates can be provided by heating a glass-based substrate to crystallize one or more ceramic crystals. The foldable substrate 1305 may comprise an initial second major surface 1315 (see FIGS. 13 and 17) that can extend along a plane. The initial second major surface 1315 can be opposite an initial first major surface 1313. In aspects, as shown in FIG. 16, in step 1101, the foldable substrate 1305 can comprise an existing first central surface area 1343 that is coplanar with a first surface area 1323 and/or a third surface area 1333, for example, the initial first major surface 1313 can comprise the existing first central surface area 1343, the first surface area 1323, and the third surface area 1333. In aspects, as shown in FIG. 17, in step 1101, the foldable substrate 1305 can comprise an existing second central surface area 1345 that is coplanar with a second surface area 1325 and/or a fourth surface area 1335, for example, the initial second major surface 1315 can comprise the existing second central surface area 1345, the second surface area 1325, and the fourth surface area 1335.

Figure 13:
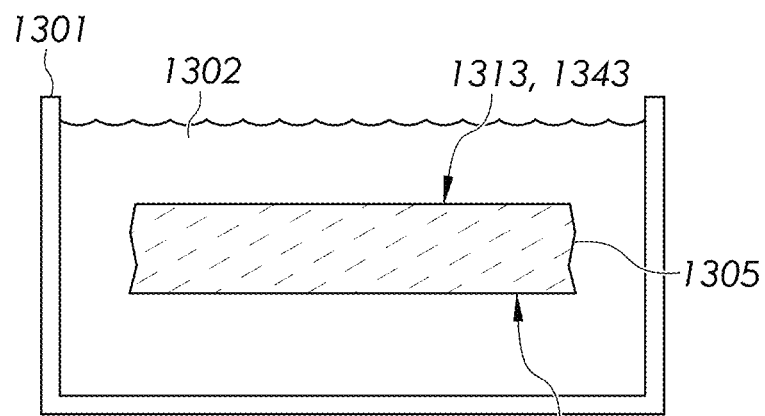

After step 1101, as shown in FIG. 13, methods can proceed to step 1103 comprising initially chemically strengthening the foldable substrate 1305. In aspects, the foldable substrate 1305 can be substantially unstrengthened before the chemically strengthening of step 1103. In aspects, as shown, chemically strengthening the foldable substrate 1305 can comprise contacting at least a portion of a foldable substrate 1305 comprising lithium cations and/or sodium cations in a salt solution 1302 (e.g., contained in a salt bath 1301). Chemically strengthening a foldable substrate 1305 (e.g., glass-based substrate, ceramic-based substrate) by ion exchange can occur when a first cation within a depth of a surface of a foldable substrate 1305 is exchanged with a second cation within a molten salt or salt solution 1302 that has a larger radius than the first cation. For example, a lithium cation within the depth of the surface of the foldable substrate 1305 can be exchanged with a sodium cation or potassium cation within a salt solution 1302. Consequently, the surface of the foldable substrate 1305 is placed in compression and thereby chemically strengthened by the ion exchange process since the lithium cation has a smaller radius than the radius of the exchanged sodium cation or potassium cation within the salt solution 1302. Chemically strengthening the foldable substrate 1305 can comprise contacting at least a portion of a foldable substrate 1305 comprising lithium cations and/or sodium cations with a salt bath 1301 comprising salt solution 1302 comprising potassium nitrate, potassium phosphate, potassium chloride, potassium sulfate, sodium chloride, sodium sulfate, sodium nitrate, and/or sodium phosphate, whereby lithium cations and/or sodium cations diffuse from the foldable substrate 1305 to the salt solution 1302 contained in the salt bath 1301. In aspects, the temperature of the salt solution 1302 can be about 300° C. or more, about 360° C. or more, about 400° C. or more, about 500° C. or less, about 460° C. or less, or about 420° C. or less. In aspects, the temperature of the salt solution 1302 can be in a range from about 300° C. to about 500° C., from about 360° C. to about 500° C., from about 400° C. to about 500° C., from about 300° C. to about 460° C., from about 360° C. to about 460° C., from about 400° C. to about 460° C., from about 400° C. to about 420° C., from about 300° C. to about 400° C., from about 360° C. to about 420° C., or any range or subrange therebetween. In aspects, the foldable substrate 1305 can be in contact with the salt solution 1302 for about 5 minutes or more, about 30 minutes or more, about 1 hour or more, about 3 hours or more, about 48 hours or less, about 24 hours or less, or about 8 hours or less. In aspects, the foldable substrate 1305 can be in contact with the salt solution 1302 for a time in a range from about 5 minutes to about 48 hours, from about 30 minutes to about 48 hours, from about 30 minutes to about 24 hours, from about 1 hour to about 24 hours, from about 3 hours to about 24 hours, from about 3 hours to about 8 hours, or any range or subrange therebetween. In aspects, the foldable substrate 1305 can be in contact with the salt solution 1302 for a time in a range from about 5 minutes to about 8 hours, from about 30 minutes to about 8 hours, from about 1 hour to about 8 hours, or any range or subrange therebetween.

In aspects, chemically strengthening the foldable substrate 1305 in step 1103 can comprise chemically strengthening the initial first major surface 1313 to form an initial first compressive stress region extending to an initial first depth of compression from the initial first major surface 1313. In aspects, chemically strengthening the foldable substrate 1305 in step 1103 can comprise chemically strengthening the initial second major surface 1315 to form an initial second compressive stress region extending to an initial second depth of compression from the initial second major surface 1315. The initial first compressive stress region and/or the initial second compressive stress region can extend across portions of the foldable substrate 1305 corresponding to the first portion, the second portion, and the central portion. For example, the initial first compressive stress region can extend from a first surface area 1323 and/or a third surface area 1333, and/or the initial second compressive stress region can extend from a second surface area 1325 and/or a fourth surface area 1335. In aspects, the initial first depth of compression and/or the initial second depth of compression, as a percentage of the substrate thickness 207 (see FIGS. 2-5), can be about 5% or more, 10% or more, about 12% or more, about 14% or more, about 25% or less, about 20% or less, about 18% or less, or about 16% or less. In aspects, the initial first depth of compression and/or the initial second depth of compression, as a percentage of the substrate thickness 207 (see FIGS. 2-5), can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In aspects, an initial first depth of layer of one or more alkali-metal ions associated with the initial first compressive stress region and/or an initial second depth of layer of one or more alkali-metal ions associated with the initial second compressive stress region, as a percentage of the substrate thickness 207 (see FIGS. 2-5), can be about 5% or more, 10% or more, about 12% or more, about 14% or more, about 25% or less, about 20% or less, about 18% or less, or about 16% or less. In aspects, an initial first depth of layer of one or more alkali-metal ions associated with the initial first compressive stress region and/or an initial second depth of layer of one or more alkali-metal ions associated with the initial second compressive stress region, as a percentage of the substrate thickness 207 (see FIGS. 2-5), can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In aspects, the initial first depth of compression can be less than the first distance 219 of the resulting foldable substrate 201 and/or the initial second depth of compression can be less than the second distance 249 of the resulting foldable substrate 201, which can enable the entire initial first depth of compression and/or the second depth of compression to be removed from the central portion 281 (e.g., central region 248) of the foldable substrate 1305 during etching in step 1107 (see FIG. 18). In aspects, before step 1103, the foldable substrate 1305 can be substantially unstrengthened (e.g., unstressed, not chemically strengthened, not thermally strengthened). As used herein, substantially unstrengthened refers to a substrate comprising either no depth of layer or a depth of layer in a range from 0% to about 5% of the substrate thickness.

Figure 16:
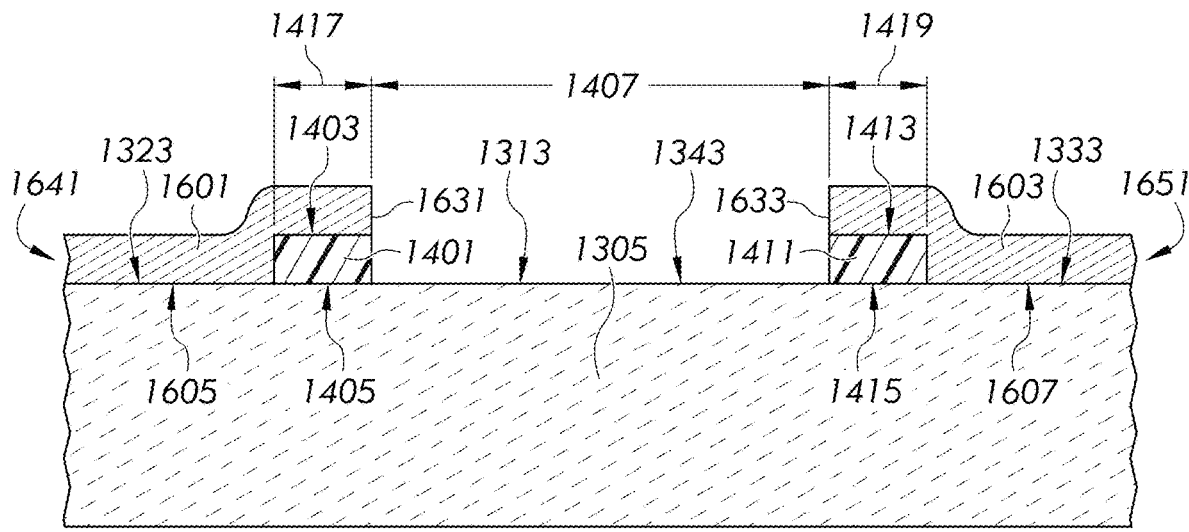
Figure 17:
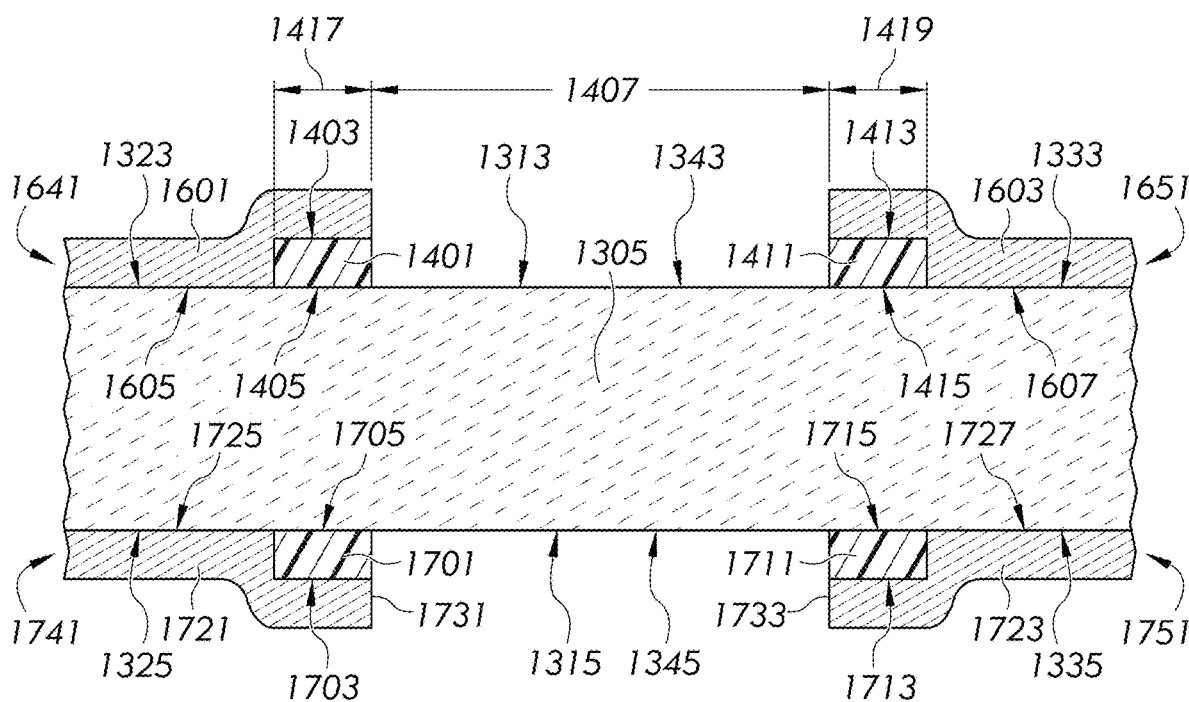

After step 1101 or 1103, as shown in FIGS. 16-17, methods can proceed to step 1105 comprising disposing an etch mask over the initial first major surface 1313 of the foldable substrate 1305. In aspects, as shown in FIGS. 16-17, the etch mask can comprise a first portion 1641 comprising a first polymer layer 1401 and a second portion 1651 comprising a second polymer layer 1411. In aspects, as shown in FIGS. 16-17, step 1105 can comprise disposing the first polymer layer 1401 over the initial first major surface 1313 and disposing the second polymer layer 1411 over the initial first major surface 1313. In further aspects, as shown, the first polymer layer 1401 can comprise a second contact surface 1405 facing the initial first major surface 1313. In even further aspects, as shown, the first polymer layer 1401 can comprise a first width 1417. In further aspects, as shown, the second polymer layer 1411 can comprise a fourth contact surface 1415 facing the initial first major surface 1313. In even further aspects, as shown, the second polymer layer 1411 can comprise a second width 1419.

Figure 15:
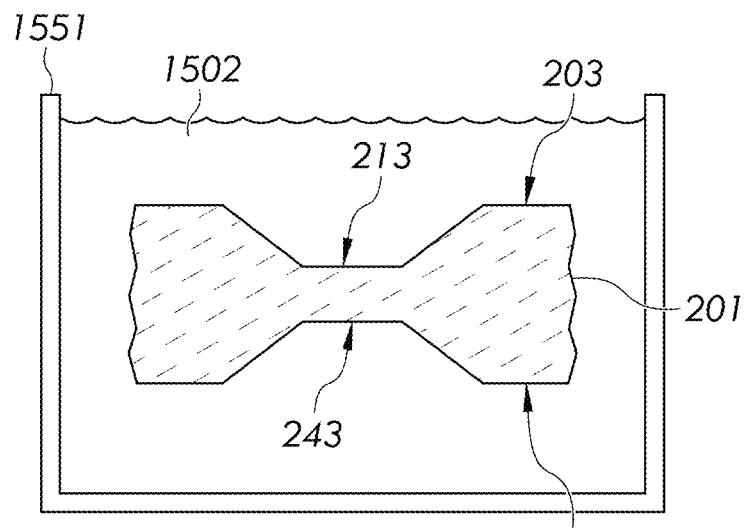

In aspects, as shown in FIG. 15, the first polymer layer 1401 and the second polymer layer 1411 can comprise the first width 1417 and the second width 1419, respectively, when the polymer layers are disposed on the initial first major surface 1313. In further aspects, the first width 1417 and/or the second width 1419 can be about 1.5 mm or more, about 1.6 mm or more, about 1.7 mm or more, about 1.8 mm or more, about 1.9 mm or more, about 2.0 mm or more (e.g., about 3 mm or more), 2.1 mm or more, 2.2 mm or more, 2.3 mm or more, 2.4 mm or more, 2.5 mm or more, 2.7 mm or more, 3.0 mm or more (e.g., about 3 mm or more), 3.2 mm or more, 3.5 mm or more, about 4.0 mm or less (e.g., about 4 mm or less), about 3.8 mm or less, about 3.6 mm or less, about 3.4 mm or less, about 3.2 mm or less, about 3.0 mm or less (e.g., about 3 mm or less), about 2.8 mm or less, about 2.6 mm or less, about 2.5 mm or less, about 2.4 mm or less, about 2.3 mm or less, about 2.2 mm or less, about 2.1 mm or less, or about 2.0 mm or less (about 2 mm or less). In further aspects, the first width 1417 and/or the second width 1419 can be in a range from about 1.5 mm to about 4.0 mm, from about 1.6 mm to about 3.8 mm, from about 1.7 mm to about 3.6 mm, from about 1.8 mm to about 3.4 mm, from about 1.9 mm to about 3.2 mm, from about 2.0 mm to about 3.0 mm (e.g., from about 2 mm to about 3 mm), from about 2.1 mm to about 2.8 mm, from about 2.2 mm to about 2.6 mm, from about 2.3 mm to about 2.5 mm, or any range or subrange therebetween. In preferred aspects, the first width 1417 and/or the second width 1419 can be in a range from about 1.5 mm to about 4 mm, from about 1.7 mm to about 3 mm, or from about 2 mm to about 2.8 mm. In further aspects, the first width 1417 can be substantially equal to the second width 1419. Providing a width of the polymer layers of 1.5 mm or more can produce a first transition width and/or first average angle within one or more of the ranges discussed herein, which can facilitate decreased visibility of the central region (e.g., optical distortions associated with the transition regions). In further aspects, the first width 1417 can be equal to or less than the first transition width 214 of the first transition region 212 of the resulting foldable apparatus (see FIGS. 2-5). In further aspects, the second width 1419 can be equal to or less than the second transition width 216 of the second transition region 218 of the resulting foldable apparatus (see FIGS. 2-5). Providing a first width and/or a second width within one of the above-mentioned ranges can enable formation of a transition region by controlling access of the etchant to a portion of the foldable substrate corresponding to the first width and/or second width of the first polymer portion and/or the second polymer portion, for example, by limiting diffusion of the etchant to the corresponding portion. Without wishing to be bound by theory, the gap can enable the etchant to contact a portion of the foldable substrate, but the diffusion of the etchant to the additional portion is limited, which limits the extent of etching of the additional portion, producing a transition region. The first polymer layer and/or the second polymer layer can be deflected away from the foldable substrate during etching to enable the etchant access to an additional portion of the foldable substrate that the polymer layer could otherwise be in contact with, which enables a further reduced diffusion of the etchant and enabling longer transition regions.

In aspects, although not shown, the first polymer layer 1401 and the second polymer layer 1411 can be disposed on the initial first major surface 1313 in step 1105 by trimming a polymer sheet. In further aspects, although now shown, step 1105 can comprise disposing a tape over the initial first major surface 1313 from which a first section comprising the first width 1417 is removed to create a space (e.g., corresponding to where the first polymer layer 1401 will be) and from which as second section comprising the second width 1419 is removed to create a second space (e.g., corresponding to where the second polymer layer 1411 will be). Consequently, the tape can be segmented into three portions and a polymer sheet can be disposed thereon and cut flush with the tape to form the first polymer layer 1401 and/or the second polymer layer 1411. Then, the tape can be removed, leaving the first polymer layer 1401 and/or the second polymer layer 1411. The first barrier layer 1601 and/or the second barrier layer 1603 can be disposed thereon to form the first portion 1641 and/or the second portion 1651 show in FIGS. 16-17. Consequently, as shown, a portion of the first barrier layer 1601 and/or the second barrier layer 1603 can contact the initial first major surface 1313, and the first barrier layer 1601 and/or the second barrier layer 1603 can be at least partially adhered to the initial first major surface 1313. As used herein, a first layer is partially adhered to a second layer if a portion of the first layer is adhered to the second layer but an entire surface of the first layer is not necessarily adhered to the second layer. For example, a first surface area 1605 of the first barrier layer 1601 can contact and/or be adhered to a portion of the initial first major surface 1313 comprising the first surface area 1323, and/or a second surface area 1607 of the second barrier layer 1603 can contact and/or be adhered to a portion of the initial first major surface 1313 comprising the third surface area 1333.

In further aspects, as shown in FIGS. 16-17, the first portion 1641 can comprise the first polymer layer 1401 positioned between the first barrier layer 1601 and the initial first major surface 1313. In even further aspects, a first surface area 1403 of the first polymer layer 1401 can contact and/or be adhered to the first barrier layer 1601 (e.g., first surface area 1605). In even further aspects, the first polymer layer 1401 can be positioned at a first peripheral portion 1631 of the first barrier layer 1601. For example, as shown, an inner peripheral surface of the first polymer layer 1401 can be flush with the first peripheral portion 1631 of the first barrier layer 1601. For example, as shown, the first peripheral portion 1631 of the first barrier layer 1601 can be the portion of the first barrier layer 1601 closest to the second barrier layer 1603. In further aspects, as shown in FIGS. 16-17, the second portion 1651 can comprise the second polymer layer 1411 positioned between the second barrier layer 1603 and the first major surface. In even further aspects, a third contact surface 1413 of the second polymer layer 1411 can contact and/or be adhered to the second barrier layer 1603 (e.g., second surface area 1607). In even further aspects, the second polymer layer 1411 can be positioned at a second peripheral portion 1633 of the second barrier layer 1603. For example, as shown, the inner peripheral surface of the second polymer layer 1411 can be flush with the second peripheral portion 1633 of the second barrier layer 1603. For example, as shown, the second peripheral portion 1633 of the second barrier layer 1603 can be the portion of the second barrier layer 1603 closest to the first barrier layer 1601 (e.g., first peripheral portion 1631).

In aspects, as shown in FIGS. 16-17, a minimum distance 1407 can be defined between the first peripheral portion 1631 and the second peripheral portion 1633 as a minimum distance between the first polymer layer 1401 and the second polymer layer 1411. In further aspects, the minimum distance 1407 can be about 1 mm or more, about 2 mm or more, about 5 mm or more, about 10 mm or more, about 15 mm or more, about 20 mm or more, about 50 mm or less, about 40 mm or less, about 35 mm or less, about 30 mm or less, about 25 mm or less, or about 20 mm or less. In further aspects, the minimum distance 1407 can be in a range from about 1 mm to about 50 mm, from about 1 mm to about 40 mm, from about 2 mm to about 40 mm, from about 5 mm to about 35 mm, from about 10 mm to about 30 mm, from about 15 mm to about 25 mm, from about 15 mm to about 20 mm, or any range or subrange therebetween. In further aspects, the minimum distance 1407 can be within one or more of the ranges discussed above for the width 287 of the central portion 281, for example, in terms of absolute distance and/or as a multiple of the minimum parallel plate distance. In further aspects, the minimum distance 1407 can be less than the width 287 of the central portion 281 of the resulting foldable apparatus (see FIGS. 2 and 4). In further aspects, the minimum distance 1407 can be substantially equal to the width 210 of the first central surface area 213 (e.g., central region 248).

In aspects, the first polymer layer 1401 and/or the second polymer layer 1411 can comprise one or more of a polyolefin, a polyamide, a halide-containing polymer (e.g., polyvinylchloride or a fluorine-containing polymer), an elastomer, a urethane, phenolic resin, parylene, polyethylene terephthalate (PET), and polyether ether ketone (PEEK). Example aspects of polyolefins include low molecular weight polyethylene (LDPE), high molecular weight polyethylene (HDPE), ultrahigh molecular weight polyethylene (UHMWPE), and polypropylene (PP). Example aspects of fluorine-containing polymers include polytetrafluoroethylene (PTFE), polyvinylfluoride (PVF), polyvinylidene fluoride (PVDF), perfluoropolyether (PFPE), perfluorosulfonic acid (PFSA), a perfluoroalkoxy (PFA), fluorinated ethylene propylene (FEP) polymers, and ethylene tetrafluoro ethylene (ETFE) polymers. Example aspects of elastomers include rubbers (e.g., polybutadiene, polyisoprene, chloroprene rubber, butyl rubber, nitrile rubber) and block copolymers (e.g., styrene-butadiene, high-impact polystyrene, poly(dichlorophosphazene). An exemplary aspect of a polymer for the first polymer layer 1401 and/or the second polymer layer 1411 is poly(ethylene terephthalate). In aspects, there may not be an adhesive layer of the first polymer layer 1401 and/or the second polymer layer 1411 contacting the initial first major surface 1313 of the foldable substrate 1305.

In aspects, the first barrier layer 1601 and/or the second barrier layer 1603 can comprise a polymeric tape, for example, comprising a polymeric film and an adhesive film. In further aspects, the polymeric film can comprise one or more of the materials discussed above for the first polymer layer 1401. An exemplary aspect of the polymeric film is polyimide. In further aspects, the adhesive film can comprise a pressure-sensitive adhesive. In further aspects, the adhesive film can comprise a silicone-based polymer, an acrylate-based polymer, an epoxy-based polymer, a polyimide-based material, or a polyurethane. In even further aspects, the adhesive film can comprise an ethylene acid copolymer. An exemplary aspect of an ethylene acid copolymer includes SURLYN available from Dow (e.g., Surlyn PC-2000, Surlyn 8940, Surlyn 8150). Examples of epoxies include bisphenol-based epoxy resins, novolac-based epoxies, cycloaliphatic-based epoxies, and glycidylamine-based epoxies. An exemplary aspect of the adhesive film is a silicone-based polymer (e.g., silicone). Consequently, an exemplary aspect of the first barrier layer 1601 and/or the second barrier layer 1603 is a polymeric tape comprising a polymeric film comprising a polyimide and an adhesive film comprises a silicone. The first barrier layer 1601 and the second barrier layer 1603 is resistant to an etchant (e.g., acid) that can be used to etch the foldable substrate. In aspects, although not shown, the barrier layers (e.g., first barrier layer 1601, second barrier layer 1603) can be adhered to the foldable substrate 1305 (e.g., initial first major surface 1313) through an adhesive layer of the corresponding barrier layer. In aspects, although not shown, the barrier layers (e.g., first barrier layer 1601, second barrier layer 1603) can be adhered to the corresponding polymer layer (e.g., first polymer layer 1401, second polymer layer 1411) by an adhesive layer of the corresponding barrier layer and/or an adhesive layer of the corresponding polymer layer, for example, Maxi 689BL-003 (Maxi Adhesive Products, Inc.) or JVCC EGPF-01 (J.V. Converting Company, Inc.).

In aspects, as shown in FIG. 17 (e.g., relative to FIG. 16), step 1105 can further comprise disposing a third portion 1741 and/or a fourth portion 1751 of the etch mask over the initial second major surface 1315. In further aspects, as shown, the third portion 1741 can comprise a third polymer layer 1701 with a third width. In even further aspects, the third width can be within one or more of the ranges discussed above for the first width 1417 of the first polymer layer 1401. In still further aspects, the third width can be substantially equal to the first width 1417. In even further aspects, the third polymer layer 1701 can comprise the third width before it is disposed over the initial second major surface 1315. In even further aspects, the third polymer layer 1701 can be formed from a polymer sheet analogous to or identical to the portion of step 1105 discussed above for the first polymer layer 1401. In even further aspects, a sixth contact surface 1705 of the third polymer layer 1701 can contact a portion of the initial second major surface 1315 comprising the second surface area 1325. In even further aspects, as shown, the third portion 1741 can comprise a third barrier layer 1721 disposed over the initial second major surface 1315. In still further aspects, the third polymer layer 1701 can be positioned between the third barrier layer 1721 and the initial second major surface 1315. In even further aspects, at least a portion of a third surface area 1725 of the third barrier layer 1721 can contact and/or be adhered to the initial second major surface 1315 comprising the second surface area 1325. In even further aspects, a fifth contact surface 1703 of the third polymer layer 1701 can contact and/or be adhered to the third barrier layer 1721 (e.g., third surface area 1725). In even further aspects, the third polymer layer 1701 can be positioned at a third peripheral portion 1731 of the third barrier layer 1721. For example, as shown, an inner peripheral surface of the third polymer layer 1701 can be flush with the third peripheral portion 1731 of the third barrier layer 1721. In further aspects, as shown, the third portion 1741 can be a mirror image of the first portion 1641.

In further aspects, as shown in FIG. 17, the fourth portion 1751 can comprise a fourth polymer layer 1711 with a fourth width. In even further aspects, the fourth width can be within one or more of the ranges discussed above for the first width 1417 of the first polymer layer 1401. In still further aspects, the third width can be substantially equal to the first width 1417 and/or the second width 1419. In even further aspects, the fourth polymer layer 1711 can comprise the fourth width before it is disposed over the initial second major surface 1315. In even further aspects, the fourth polymer layer 1711 can be formed from a polymer sheet analogous to or identical to the portion of step 1105 discussed above. In even further aspects, an eighth contact surface 1715 of the fourth polymer layer 1711 can contact a portion of the initial second major surface 1315 comprising the fourth surface area 1727. In even further aspects, as shown, the fourth portion 1751 can comprise a fourth barrier layer 1723 disposed over the initial second major surface 1315. In still further aspects, the fourth polymer layer 1711 can be positioned between the fourth barrier layer 1723 and the initial second major surface 1315. In even further aspects, at least a portion of a fourth surface area 1727 of the fourth barrier layer 1723 can contact and/or be adhered to the initial second major surface 1315 comprising the fourth surface area 1335. In even further aspects, a seventh contact surface 1713 of the fourth polymer layer 1711 can contact and/or be adhered to the fourth barrier layer 1723 (e.g., fourth surface area 1727). In even further aspects, the fourth polymer layer 1711 can be positioned at a fourth peripheral portion 1733 of the fourth barrier layer 1723. For example, as shown, an inner peripheral surface of the fourth polymer layer 1711 can be flush with the fourth peripheral portion 1733 of the fourth barrier layer 1723. In further aspects, as shown, the fourth portion 1751 can be a mirror image of the second portion 1651. In even further aspects, a minimum distance between the third portion 1741 and the fourth portion 1751 can be within one or more of the ranges discussed above for the minimum distance 1407. In still further aspects, the minimum distance between the third portion 1741 and the fourth portion 1751 can be substantially equal to the minimum distance 1407. Alternatively, although not shown, a uniform layer (e.g., of the material of the first barrier layer 1601) can be disposed over the entire initial second major surface 1315 (e.g., including the existing second central surface area 1345) from the structure shown in FIG. 16 instead of the third portion 1741 and fourth portion 1751 shown in FIG. 17, for example, to produce the foldable substrate 201 shown in FIGS. 4-5.

Figure 18:
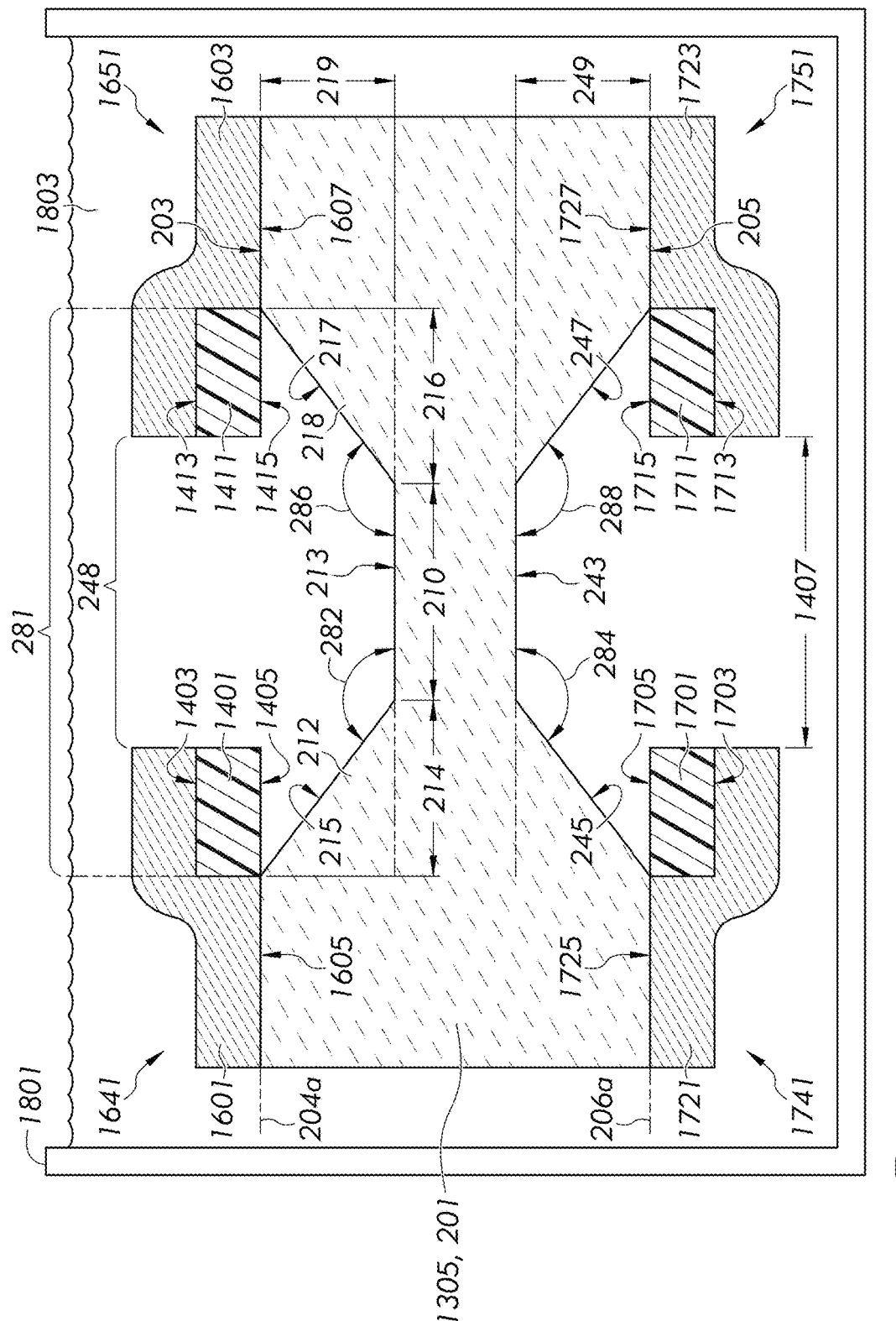

After step 1105, as shown in FIG. 18, methods can proceed to step 1107 comprising etching the foldable substrate 1305 by contacting a central region 248 of a central portion 281 of the foldable substrate 1305 that is between the first portion 1641 of the etch mask and the second portion 1651 of the etch mask to form the foldable substrate 201. As used herein, a surface is positioned between two portions if the surface is laterally positioned between the two portions, which allows for a displacement of the surface perpendicular to the direction of a minimum distance between the two portions. For example, as shown in FIG. 18, all of the central region 248 of the foldable substrate 201 is positioned between the first portion 1641 of the etch mask and the second portion 1651 of the etch mask even though the central region 248 is displaced from the first portion 1641 of the etch mask and the second portion 1651 of the etch mask in the direction 202 of the thickness because the direction 202 of the thickness is perpendicular to a direction (e.g., direction 106) of the minimum distance 1407 between the first portion 1641 of the etch mask and the second portion 1651 of the etch mask and the central region 248 is laterally positioned (e.g., in the direction 106) between the first portion 1641 of the etch mask and the second portion 1651 of the etch mask. In aspects, the etching can remove a portion of the foldable substrate to form the first central surface area 213 that is recessed from the first major surface 203 (e.g., first plane 204a) by the first distance 219. In further aspects, the etching can remove a portion of the foldable substrate to form the first transition surface area 215 of the first transition region 212. In further aspects, the etching can remove a portion of the foldable substrate to form the third transition surface area 217 of the second transition region 218. In aspects, the first transition width 214 of the first transition region 212 can be greater than or equal to the first width 1417 of the first polymer layer 1401. In aspects, the second transition width 216 of the second transition region 218 can be greater than or equal to the second width 1419 of the second polymer layer 1411.

In aspects, as shown in FIG. 18, step 1107 can further comprise etching the foldable substrate 1305 by contacting a central region 248 of a central portion 281 of the foldable substrate 1305 that is between the third portion 1741 of the etch mask and the fourth portion 1751 of the etch mask to form the foldable substrate 201. In aspects, the etching can remove a portion of the foldable substrate to form the second central surface area 243 that is recessed from the second major surface 205 (e.g., second plane 206a) by the second distance 249. In further aspects, the etching can remove a portion of the foldable substrate to form the second transition surface area 245 of the first transition region 212. In further aspects, the etching can remove a portion of the foldable substrate to form the fourth transition surface area 247 of the second transition region 218. Although FIG. 18 shows etching both the existing first central surface area 1343 to form the first central surface area 213 and the existing second central surface area 1345 to form the second central surface area 243 (e.g., to form the foldable substrate 201 shown in FIGS. 2-3 and 15), step 1107 can comprise etching the existing first central surface area 1343 to form the first central surface area 213 without etching the existing second central surface area 1345 relative to the initial second major surface 1315, for example, to produce the foldable substrate 201 shown in FIGS. 4-5 and FIG. 14.

In aspects, as shown in FIG. 18, the etching of step 1107 can comprise contacting the central portion 281 (e.g., central region 248) of the foldable substrate 1305 with an etchant 1803 to form the foldable substrate 201. In further aspects, as shown, the etchant 1803 can be a liquid etchant contained in an etchant bath 1801. In even further aspects, the etchant can comprise one or more mineral acids (e.g., HCl, HF, $H_2SO_4$, $HNO_3$). Without wishing to be bound by theory, the polymer layer can be deflected away from the foldable substrate during etching to enable the etchant access to an additional portion of the foldable substrate that the polymer layer could otherwise be in contact with. While the etchant can contact the additional portion of the foldable substrate by deflection of the polymer layer, diffusion of the etchant to the additional portion is limited, which limits the extent of etching of the additional portion, producing the transition region.

In aspects, step 1107 can further comprise removing the etch mask (e.g., first portion 1641, second portion 1651, third portion 1741, fourth portion 1751). In further aspects, removing the etching mask can comprise lifting and/or peeling the etch mask from the foldable substrate. In further aspects, removing the etching mask can comprise rinsing the foldable substrate with deionized water, a neutral detergent, an alkaline detergent, and/or an alkaline solution. Rinsing the foldable substrate can remove any residue from the material adhering the etch mask to the foldable substrate.

Figure 14:
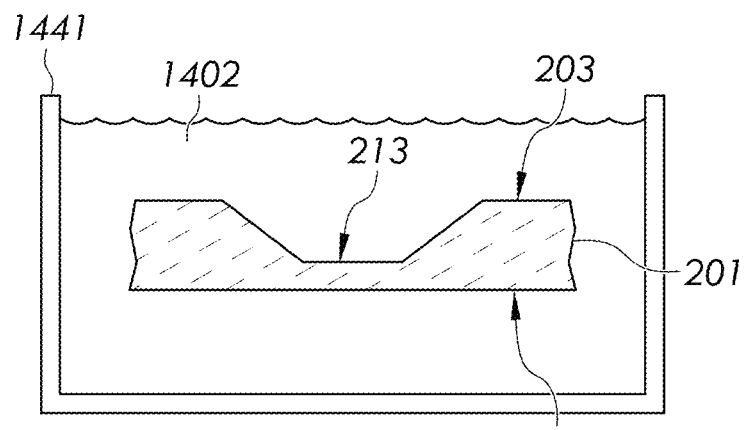

After step 1107, as shown in FIGS. 14-15, methods can proceed to step 1109 comprising chemically strengthening the foldable substrate 201. In aspects, as shown, chemically strengthening the foldable substrate 201 can comprise contacting at least a portion of a foldable substrate 201 with a salt solution 1402 or 1502 in a salt bath 1441 or 1551 comprising potassium cations and/or sodium cations. In further aspects, a composition of the salt solution 1402 or 1502 can comprise one or more of the materials discussed above with reference to salt solution 1302. In further aspects, a composition of the salt solution 1402 or 1502 can be the same as the salt solution 1302 discussed above. In further aspects, a temperature of the salt solution 1402 or 1502 can be within one or more of the ranges discussed above with reference to the temperature of the salt solution 1302. In further aspects, a time that the salt solution 1402 or 1502 contacts the foldable substrate 201 can be within one or more of the ranges discussed above with reference to the time that the salt solution 1302 contacts the foldable substrate 1305. At the end of step 1109, the foldable substrate 201 can comprise the first compressive stress region, the second compressive stress region, the third compressive stress region, the fourth compressive stress region, the first central compressive stress region, and/or the second central compressive stress region can comprise a corresponding maximum compressive stress within one or more of the ranges discussed above for the corresponding maximum compress stress of the corresponding compressive stress region and/or the corresponding depth of compression can be within one or more of the ranges discussed above for the corresponding depth of compression of the corresponding compressive stress region.

After step 1109, as shown in FIGS. 19-21, methods can proceed to step 1111 comprising assembling the foldable apparatus. In aspects, as shown in FIGS. 19-21, step 1111 can comprise assembling the foldable apparatus by disposing a polymer-based portion (e.g., first polymer-based portion 289, second polymer-based portion 299), an adhesive layer 261, and/or a coating 251 over the foldable substrate 201. In further aspects, as shown in FIG. 19, a first polymer-based portion 289 can be disposed in the first recess 211 and/or over the first central surface area 213. In further aspects, as shown in FIGS. 19-20, a coating 251 can be disposed over the first major surface 203 (e.g., first surface area 223 and third surface area 233), for example, by dispensing a first liquid 1903 from a container 1901 (e.g., conduit, flexible tube, micropipette, or syringe) over the first major surface 203 that can be cured to form the coating 251. In even further aspects, the first liquid 1903 may comprise a coating precursor, a solvent, particles, nanoparticles, and/or fibers. In still further aspects, the coating precursor can comprise, without limitation, one or more of a monomer, an accelerator, a curing agent, an epoxy, and/or an acrylate. Curing the first liquid 1903 can comprise heating the first liquid 1903, irradiating the first liquid 1903 with ultraviolet (UV) radiation, and/or waiting a predetermined amount of time (e.g., from about 30 minutes to 24 hours, from about 1 hour to about 8 hours). In aspects, although not shown, the coating 251 can be disposed in the first recess 211 (e.g., fill the first recess 211) without contacting the first major surface 203 (e.g., first surface area 223, third surface area 233), for example, in place of the first polymer-based portion 289 in FIGS. 19-21. In further aspects, as shown in FIGS. 20-21, a second polymer-based portion 299 can be disposed in the second recess 241, for example, by dispensing a second liquid 2003 from a container 2001 (e.g., conduit, flexible tube, micropipette, or syringe) over the second central surface area 243 that can be cured to form the second polymer-based portion 299. Curing the second liquid 2003 can comprise heating the second liquid 2003, irradiating the second liquid 2003 with ultraviolet (UV) radiation, and/or waiting a predetermined amount of time (e.g., from about 30 minutes to 24 hours, from about 1 hour to about 8 hours). In further aspects, as shown in FIG. 21, an adhesive layer 261 can contact the second major surface 205 (e.g., the second surface area 225 and the fourth surface area 235). For example, the adhesive layer 261 can comprise one or more sheets of an adhesive material. In aspects, there can be an integral interface between the one or more sheets comprising the adhesive layer 261, which can reduce (e.g., avoid) optical diffraction and/or optical discontinuities as light travels between the sheets since the one or more sheets can include substantially the same index of refraction. In aspects, although not shown, at least a portion of the adhesive layer can be disposed in the second recess. In aspects, as shown in FIG. 3, a cover substrate 351 can be disposed on the polymer-based portion (e.g., first polymer-based portion 289) instead of the coating 251, although both a coating 251 and a cover substrate 351 can be provided in other aspects. In aspects, a release liner (e.g., see release liner 271 in FIG. 2) or a display device may be disposed on the adhesive layer 261 (e.g., second contact surface 265). After step 1107, 1109, or 1111, methods of the disclosure according to the flow chart in FIG. 11 of making the foldable substrate and/or foldable apparatus can be complete at step 1113.

Figure 11:
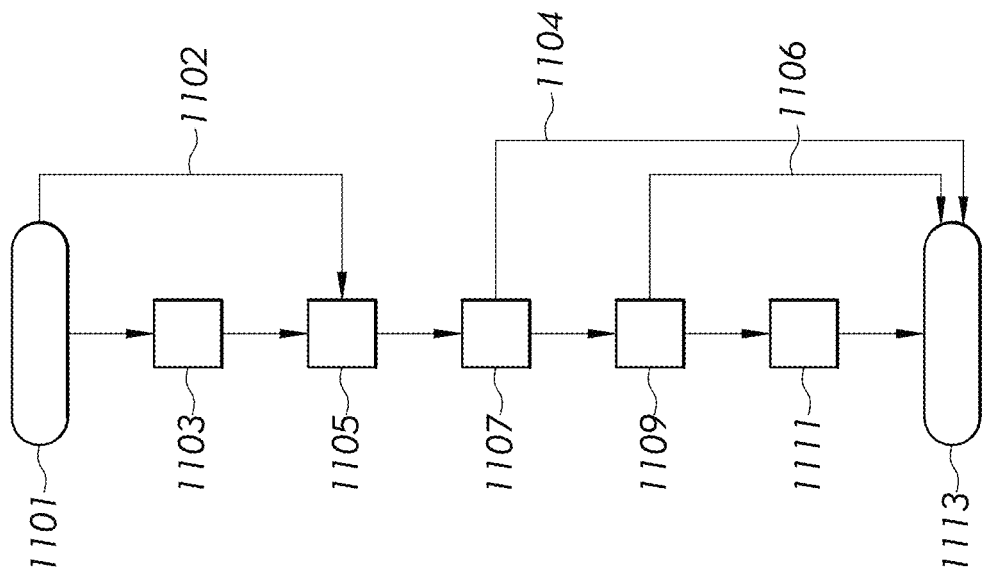

In aspects, the foldable substrate 201 produced by the methods outlined in the flow chart of FIG. 11 can comprise the first average angle 282, the second average angle 284, the third average angle 286, and/or the fourth average angle 288 can be within one or more of the ranges discussed above for the corresponding average angle. In aspects, the foldable substrate 201 produced by the methods outlined in the flow chart of FIG. 11 can comprise the first transition width 214 and/or the second transition width 216 can be within one or more of the ranges discussed above for the corresponding transition width. In aspects, the foldable substrate 201 produced by the methods outlined in the flow chart of FIG. 11 can comprise a first distance 219, second distance 249, substrate thickness 207, and/or central thickness 209 within one or more of the ranges discussed above for the corresponding distance or thickness. In aspects, the foldable substrate 201 produced by the methods outlined in the flow chart of FIG. 11 can comprise a contrast ratio within one more of the ranges discussed above for the corresponding value (e.g., about 0.25 or less).

In aspects, methods of making a foldable apparatus in accordance with aspects of the disclosure can proceed along steps 1101, 1103, 1105, 1107, 1109, 1111, and 1113 of the flow chart in FIG. 11 sequentially, as discussed above. In aspects, methods can follow arrow 1102 from step 1101 to step 1105, for example, when the foldable substrate 1305 comprises one or more compressive stress regions after step 1101 and/or the foldable substrate 1305 is not going to be chemically strengthened before the etching in step 1107. In aspects, arrow 1104 can be followed from step 1107 to step 1113, for example, when methods of making the foldable substrate 201 are complete at the end of step 1107. In aspects, arrow 1106 can be followed from step 1109 to step 1113, for example, when methods of making the foldable substrate 201 are complete at the end of step 1109. Any of the above options may be combined to make a foldable apparatus in accordance with aspects of the disclosure.

Example aspects of making the foldable apparatus 101, 301, 401, 501, 601, and/or 801 and/or foldable substrate 201 illustrated in FIGS. 2-5 and 7-8 will now be discussed with reference to FIGS. 13-15 and 19-25 and the flow chart in FIG. 12. In a first step 1201 of methods of the disclosure, methods can start with providing a foldable substrate 1305 (see FIGS. 13 and 22-23). In step 1201, the foldable substrate 1305 can be provided through any of the methods discussed above with reference to step 1101 and the foldable substrate can comprise the properties discussed above for the foldable substrate 1305 with reference to step 1101.

After step 1201, as shown in FIG. 13, methods can proceed to step 1203 comprising initially chemically strengthening the foldable substrate 1305. In aspects, the foldable substrate 1305 can exist in a substantially unstrengthened state (i.e., be substantially unstrengthened) before the chemically strengthening of step 1203. In aspects, as shown, chemically strengthening the foldable substrate 1305 can comprise contacting at least a portion of a foldable substrate 1305 comprising lithium cations and/or sodium cations with a salt bath 1301 comprising salt solution 1302. In further aspects, the salt solution 1302 can comprise any of the components discussed above with reference to step 1103. In further aspects, the temperature of the salt solution 1302 and/or the time that the foldable substrate 1305 can be in contact with the salt solution 1302 can be within one or more of the ranges discussed above for the corresponding property. Step 1103 can result in an initial first compressive stress region extending to an initial first depth of compression from the initial first major surface 1313 and/or an initial second compressive stress region extending to an initial second depth of compression from the initial second major surface 1315, where the corresponding initial depth of compression as a percentage of the substrate thickness 207 can be within one or more of the ranges discussed above in step 1103. In aspects, the initial first depth of compression can be less than the first distance 219 of the resulting foldable substrate 201 and/or the initial second depth of compression can be less than the second distance 249 of the resulting foldable substrate 201, which can enable the entire initial first depth of compression and/or the second depth of compression to be removed from the central portion 281 (e.g., central region 248) of the foldable substrate 1305 during etching in step 1107. In aspects, before step 1103, the foldable substrate 201 can be in a substantially unstrengthened state (i.e., substantially unstrengthened) (e.g., unstressed, not chemically strengthened, not thermally strengthened). As used herein, "substantially unstrengthened" and "substantially unstrengthened state" refer to a substrate comprising either no depth of layer or a depth of layer in a range from 0% to about 5% of the substrate thickness.

Figure 22:
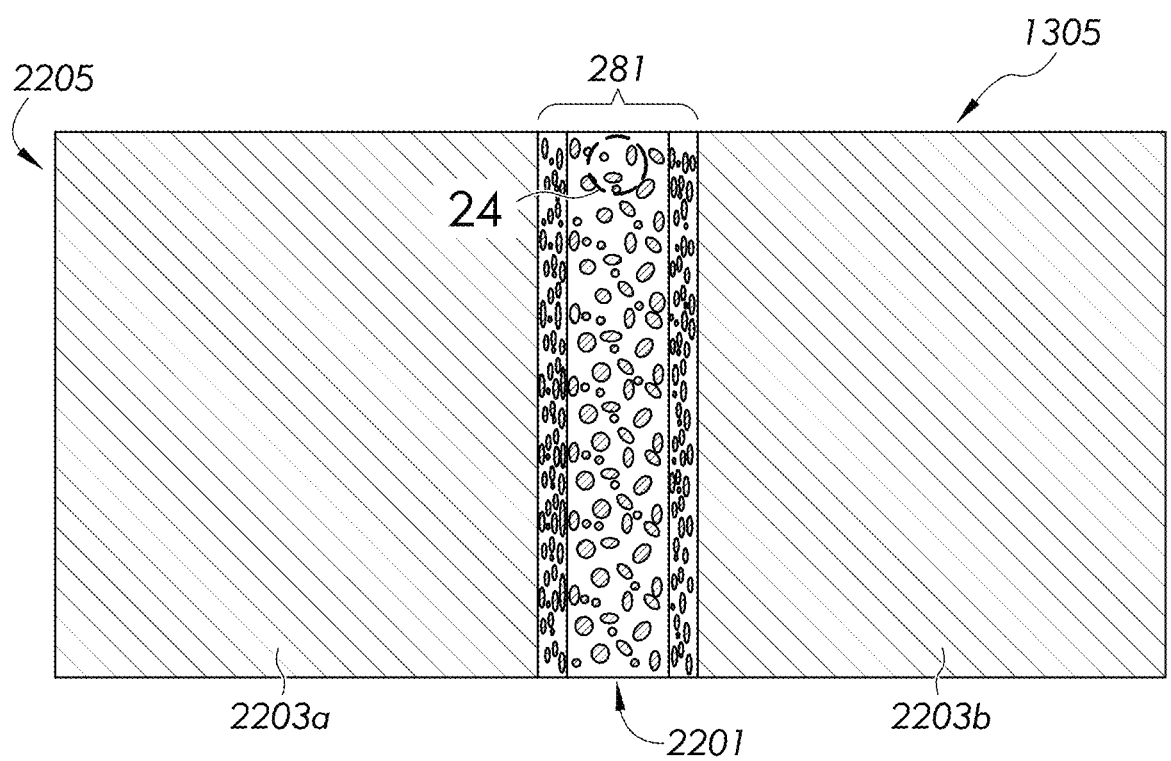
Figure 23:
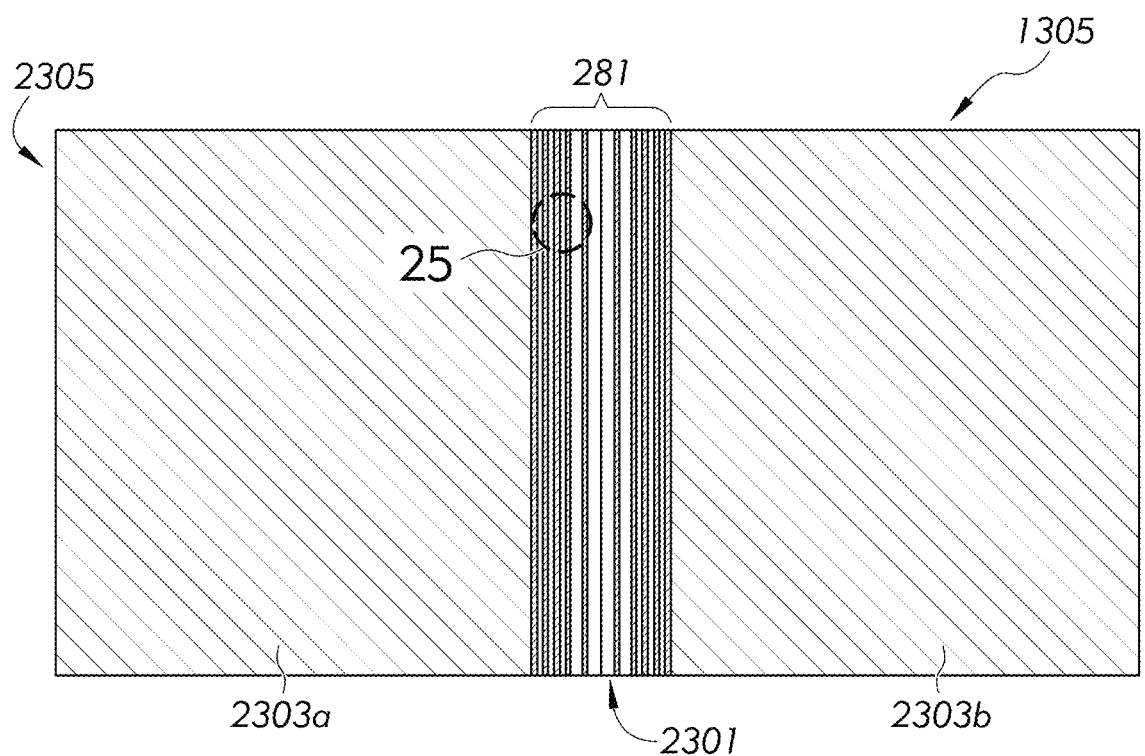

After step 1201 or 1203, as shown in FIGS. 22-25, methods can proceed to step 1205 comprising disposing an etch mask 2205 or 2305 over the initial first major surface 1313 (e.g., including the existing first central surface area 1343) of the foldable substrate 1305. In aspects, as shown in FIGS. 22-23, the etch mask 2205 or 2305 can comprise a first portion 2203a or 2303a disposed over a first portion (e.g., see first portion 221 in FIGS. 2-5) of the foldable substrate 1305 and a second portion 2203b or 2303b disposed over a second portion (e.g., see second portion 231 in FIGS. 2-5) of the foldable substrate 1305. Additionally, as shown in FIGS. 22-25, the etch mask can further comprise a plurality of shapes (e.g., plurality of features 2201 or 2301) disposed on the foldable substrate 1305 (e.g., existing first central surface area 1343). Although not shown, it is to be understood that a similar or identical pattern to the plurality of shapes (e.g., plurality of features 2201 and/or 2301) can be disposed on the existing second central surface area in step 1205 (e.g., to produce the foldable substrate 201 shown in FIGS. 2-3 and FIG. 15) or a uniform mask can be disposed over the existing second central surface area and the second major surface (e.g., to produce the foldable substrate 201 shown in FIGS. 4-5 and FIG. 14).

Figure 24:
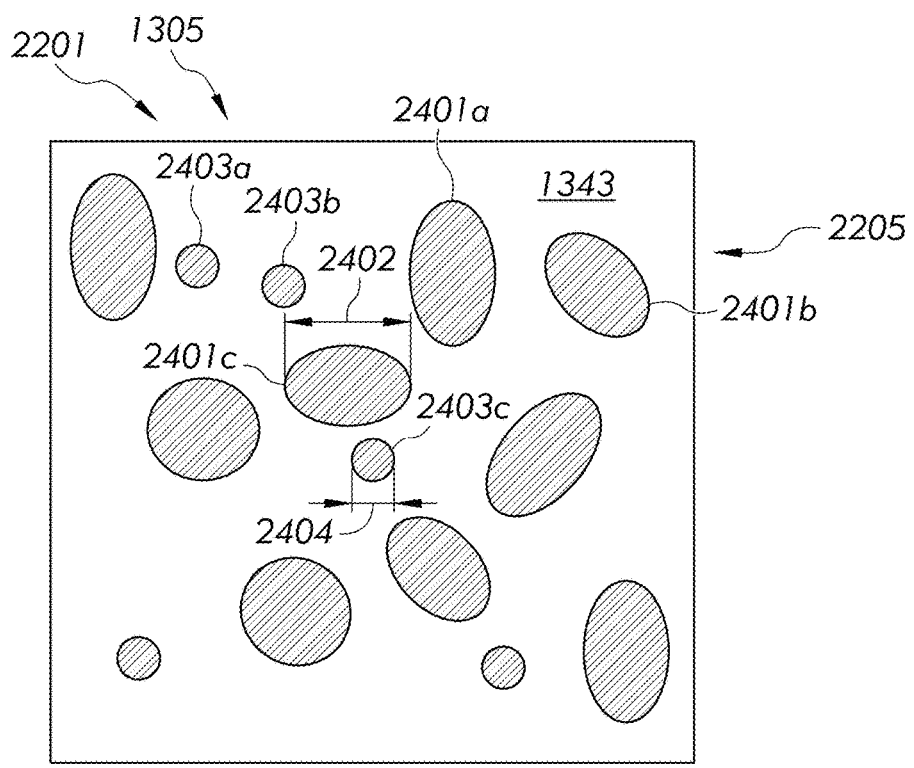
Figure 25:
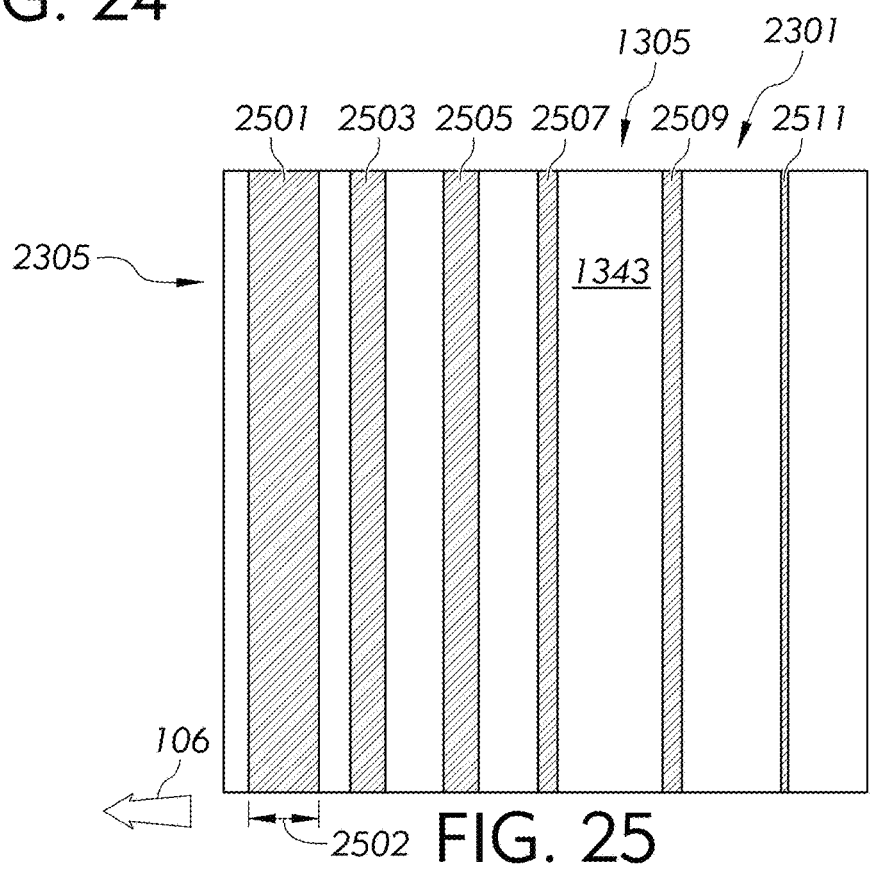

In aspects, disposing the plurality of shapes (e.g., plurality of features 2201 and/or 2301) as part of the etch mask 2205 or 2305 (see FIGS. 22-23) can comprise ink-jet printing the plurality of shapes on the initial first major surface 1313 including a central portion of the foldable substrate 1305 (e.g., including the existing first central surface area 1343). FIGS. 24-25 present enlarged views of the plurality of features 2201 and 2301 shown in FIGS. 22-23, respectively. The plurality of features 2201 and 2301 can be curved, curvilinear, and/or polygonal. In further aspects, as shown in FIG. 24, the plurality of shapes (e.g., plurality of features 2201) can include (e.g., correspond to) a plurality of curved shapes (e.g., ovals 2401a-2401c and/or circles 2403a-2403c). For example, the plurality of shapes (e.g., plurality of features 2201) can include curved shapes that are ovals 2401a-2401c and/or circles 2403a-2403c. Alternatively or additionally, in further aspects, as shown in FIG. 25, the plurality of shapes 2501, 2503, 2505, 2507, 2509, and/or 2511 can comprise elongated shapes (e.g., with an aspect ratio of about 10 or more). For example, as shown in FIG. 25, the plurality of shapes 2501, 2503, 2505, 2507, 2509, and/or 2511 can extend substantially from one end of the existing first central surface area 1343 to another end opposite the one end, although shorter but still elongated shapes are possible in other aspects. In even further aspects, an aspect ratio of elongated shapes of the plurality of shapes can be 10 or more, 15 or more, 20 or more, 25 or more, 30 or more, 40 or more, 50 or more, 60 or more, 80 or more, or 100 or more, for example, in a range from about 10 to about 100,000, from about 15 to about 10,000, from about 20 to about 5,000, from about 25 to about 2,000, from about 30 to about 1,000, from about 40 to about 800, from about 50 to about 600, from about 60 to about 400, from about 80 to about 300, from about 100 to about 200, or any range or subrange therebetween.

Throughout the disclosure, a width of a shape of the plurality of shapes is defined as a maximum distance in the direction 106 (see FIGS. 1-5) extending from the first transition region 212 (e.g., first transition surface area 215) to the second transition region 218 (e.g., third transition surface area 217) (see FIGS. 2-5). For example, as shown in FIG. 24, a width 2402 of oval 2401c is measured as a maximum distance in the direction 106, where the maximum dimension is the longest line segment entirely within the shape (excluding the endpoints). In aspects, as shown in FIG. 24, the width 2402 of oval 2401c of one or more of the plurality of shapes can be greater than a corresponding dimension perpendicular to direction 106 (and perpendicular to the direction 202 of the substrate thickness 207). Alternatively or additionally, as shown in FIG. 24, the width 2404 of circle 2403c of one or more of the plurality of shapes can be substantially equal to a corresponding dimension perpendicular to direction 106 (and perpendicular to the direction 202 of the substrate thickness 207). Alternatively or additionally, as shown in FIG. 25, the width 2502 of shape 2501 of one or more of the plurality of shapes can be substantially less than a corresponding dimension perpendicular to direction 106 (and perpendicular to the direction 202 of the substrate thickness 207). In aspects, the width of one of more of the shapes of the plurality of shapes can be about 500 nm or more, about 800 nm or more, about 1 µm or more, about 2 µm or more, about 5 µm or more, about 8 µm or more, about 10 µm or more, about 15 µm or more, about 20 µm or more, about 25 µm or more, about 50 µm or more, about 40 µm or more, about 30 µm or more, about 25 µm or less, about 20 µm or less, about 15 µm or less, about 10 µm or less, about 8 µm or less, about 5 µm or less, about 2 µm or less, or about 1 µm or less. In aspects, the width of one or more of the shapes of the plurality of shapes can be in a range from about 500 nm to about 50 µm, from about 500 nm to about 40 µm, from about 800 nm to about 30 µm, from about 800 nm to about 25 µm, from about 1 µm to about 20 µm, from about 1 µm to about 15 µm, from about 2 µm to about 10 µm, from about 5 µm to about 8 µm, or any range or subrange therebetween. Providing a width of the one or more shapes of the plurality of shapes from about 500 nm to about 50 µm can enable the underlying foldable substrate to be etched to produce a substantially continuous and/or smooth surface of the resulting surface (e.g., first transition surface area 215, third transition surface area 217, and/or first central surface area 213 shown in FIGS. 2-5).

As shown in FIGS. 22-25, the plurality of shapes can be non-uniformly distributed over the initial first major surface 1313 (e.g., including the existing first central surface area 1343) in a predetermined pattern. Throughout the disclosure, a "fractional area" (or "fractional area profile") refers to a ratio of an area of the first major surface (including the existing first central surface area) covered by the plurality of shapes to a total area of the first major surface (including the existing first central surface area), where the ratio can be calculated for a subsection of the first major surface (including the existing first central surface area) in the direction (e.g., of the width of a shape of the plurality of shapes—averaged perpendicular to both a direction of the substrate thickness and a direction extending from the first transition surface to the third transition surface area). For example, with reference to FIG. 25, a fractional area of the right third of FIG. 25 would be the area of shape 2509 and shape 2511 covering the existing first central surface area 1343 divided by the total area of the existing first central surface area 1343 in the right third of FIG. 25. In aspects, as shown in FIGS. 22-23, the predetermined pattern can produce a fractional area profile that can increase (e.g., monotonically increase) as a distance from a center of the central portion 281 increases. For example, as shown in FIG. 25, going from right to left (corresponding to the left side of the central portion 281 in FIG. 23), the area occupied by shapes 2511, 2509, 2507, 2505, 2503, and 2501 increases, for example, by increasing a width of the corresponding shapes, which causes a fractional area profile to also increase going from right to left. In aspects, as shown in FIG. 22, the fractional area profile may change more quickly at the edges of the central portion 281 (corresponding to the first transition portion and/or the second transition portion) relative to center of the central portion 281. In aspects, the fractional area profile (of the corresponding predetermined pattern) can be proportional to an amount of material removed by the etching to produce a predetermined first transition region and a predetermined second transition region in the etching of step 1207.

After step 1205, methods can proceed to step 1207 comprising etching the foldable substrate by contacting the central portion of the foldable substrate and the plurality of shapes, for example, similar to the step 1107 described above with reference to FIG. 18 with the understanding that the etch mask in FIG. 18 is replaced with the etch mask 2205 and/or 2305 shown in FIGS. 22-23. Consequently, in aspects, the etchant can be a liquid etchant contained in an etchant bath, the etching can comprise immersing foldable substrate with the etch mask disposed therein in the etchant bath, and/or the etchant can comprise one or more mineral acids (e.g., HCl, HF, $H_2SO_4$, $HNO_3$). Additionally, step 1207 can further comprise removing a remaining portion of the etch mask after the etching. In aspects, one or more (e.g., a majority) of the plurality of shapes in the central portion of the foldable substrate can be removed in the etching itself while other portions disposed on the first portion and/or the second portion can remain on the foldable substrate throughout the etching to removed subsequently. As discussed above, the fractional area profile and/or the predetermined pattern of the etch mask can be proportional to an amount of material removed by the etching to produce a predetermined first transition region and a predetermined second transition region in the etching. Without wishing to be bound by theory, it is believed that the shapes of the present disclosure are sufficiently small that undercutting by the etchant (e.g., isotropic etchant) can produce a relatively smooth surface (e.g., without discernable flat spots corresponding to the predetermined pattern). At the same time, it is believed that the shapes of the present disclosure are large enough that the shapes can limit etching (e.g., diffusion of the etchant) in areas with higher fractional areas to produce the predetermined profile.

After step 1207, as shown in FIGS. 14-15, methods can proceed to step 1209 comprising chemically strengthening the foldable substrate 201. In aspects, step 1209 can comprise any and/or all of the aspects discussed above with reference to step 1109.

After step 1209, as shown in FIGS. 19-21, methods can proceed to step 1211 comprising assembling the foldable apparatus. In aspects, step 1211 can comprise any and/or all of the aspects discussed above with reference to step 1111. For example, a first polymer-based portion 289 can be disposed in the first recess 211 and/or a second polymer-based portion 299 can be disposed in a recess (e.g., first recess 211 and/or second recess 241). Further, a coating 251, a cover substrate 351, an adhesive layer 261, a release liner 271, and/or a display device can be disposed thereon to assemble to foldable apparatus. After the end of step 1207, 1209, or 1211, methods can be complete upon reaching step 1213.

Figure 12:
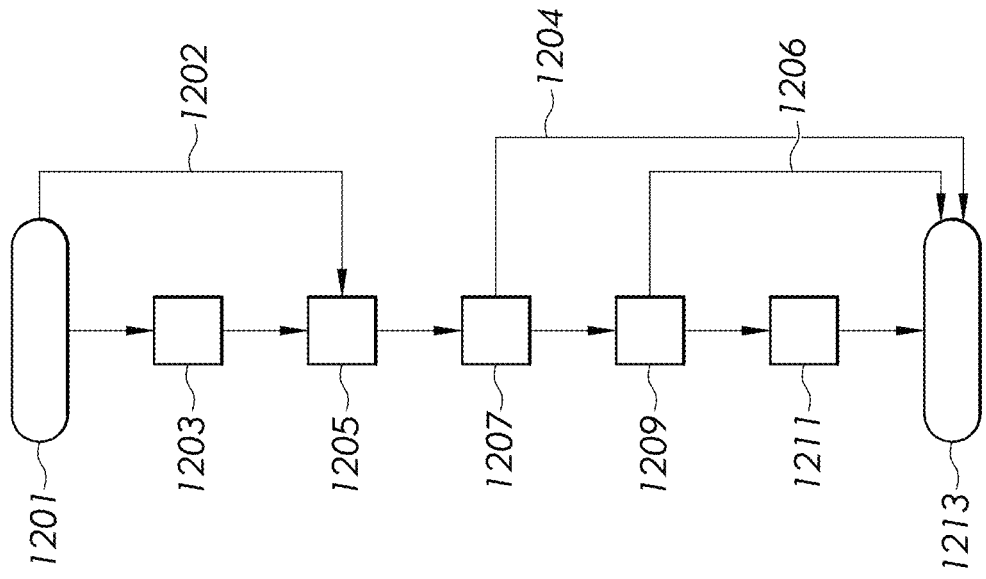
FIGS. 11-12 are flow charts illustrating example methods making foldable apparatus in accordance with aspects of the disclosure.

In aspects, the foldable substrate 201 produced by the methods outlined in the flow chart of FIG. 12 can comprise the first average angle 282, the second average angle 284, the third average angle 286, and/or the fourth average angle 288 can be within one or more of the ranges discussed above for the corresponding average angle. In aspects, the foldable substrate 201 produced by the methods outlined in the flow chart of FIG. 12 can comprise the first transition width 214 and/or the second transition width 216 can be within one or more of the ranges discussed above for the corresponding transition width. In aspects, the foldable substrate 201 produced by the methods outlined in the flow chart of FIG. 12 can comprise a first distance 219, second distance 249, substrate thickness 207, and/or central thickness 209 within one or more of the ranges discussed above for the corresponding distance or thickness. In aspects, the foldable substrate 201 produced by the methods outlined in the flow chart of FIG. 12 can comprise a contrast ratio within one or more of the ranges discussed above for the corresponding value (e.g., about 0.25 or less).

In aspects, methods of making a foldable apparatus in accordance with aspects of the disclosure can proceed along steps 1201, 1203, 1205, 1207, 1209, 1211, and 1213 of the flow chart in FIG. 12 sequentially, as discussed above. In aspects, methods can follow arrow 1202 from step 1201 to step 1205, for example, when the foldable substrate 1305 comprises one or more compressive stress regions after step 1201 and/or the foldable substrate 1305 is not going to be chemically strengthened before the etching in step 1207. In aspects, arrow 1204 can be followed from step 1207 to step 1213, for example, when methods of making the foldable substrate 201 are complete at the end of step 1207. In aspects, arrow 1206 can be followed from step 1209 to step 1213, for example, when methods of making the foldable substrate 201 are complete at the end of step 1209. Any of the above options may be combined to make a foldable apparatus in accordance with aspects of the disclosure.

Examples

Various aspects will be further clarified by the following examples. Examples 1-8, 10-14, and A-E comprise a glass-based substrate (Composition 1 having a nominal composition in mol % of: 63.6 $SiO_2$; 15.7 $Al_2O_3$; 10.8 $Na_2O$; 6.2 $Li_2O$; 1.16 ZnO; 0.04 $SnO_2$; and 2.5 $P_2O_5$) with a substrate thickness 207 of 100 μm. In Examples 1-4, 9-14, and A-E, the glass-based substrate was etched to form a central thickness 209 of 30 μm with a first recess 211 and a second recess 241 opposite the first recess 211 (e.g., with a first distance 219 and a second distance 249 substantially equal to 35 μm; see foldable substrate 201 in FIGS. 2-3). Examples 5-8 comprised a central thickness of 35 μm with a first recess 211 (e.g., with a first distance 219 substantially equal to about 65 μm; see foldable substrate 201 in FIGS. 4-5) and a second central surface area flush with the second major surface. In Examples 1-8 and A-E, the recess(es) were filled with a polymer-based material, where polymer-based material was formed by curing a precursor liquid that was flush with the corresponding major surface (e.g., first major surface, second major surface) with the resulting difference between the corresponding major surface (e.g., first major surface, second major surface) and the outer surface (e.g., third contact surface 283 and/or fourth contact surface 295 in FIGS. 2-3) of the polymer-based portion is presented in Tables 1-2 and 4 as the "Polymer-Surface Height Difference" in micrometers (see distance 3323 and 3325 in FIG. 33). In Examples 1-3, 5-7, and A-E, the polymer-based material was Polymer X, which has a refractive index within 1.501 of the refractive index of the foldable substrate. In Examples 4 and 8, the polymer-based material was Polymer Y, which has a refractive index of 1.505.

Figure 31:
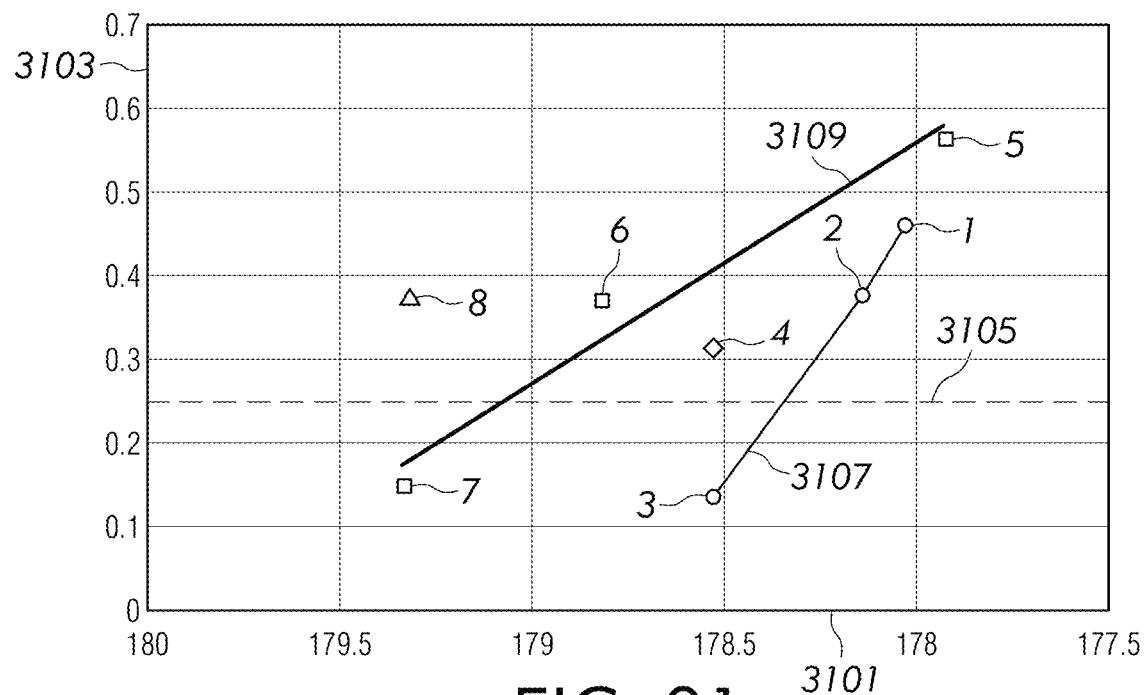
FIG. 31 shows relationships between a polymer angle and contrast ratio for Examples 1-8.
Figure 32:
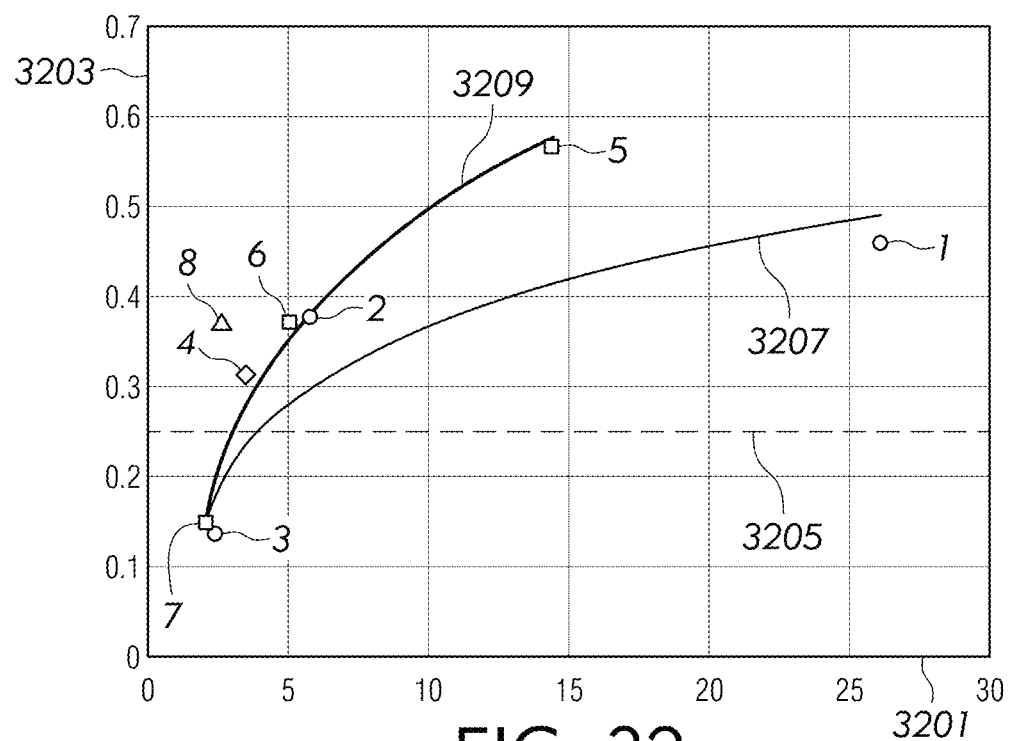
FIG. 32 shows relationship between a distance between the first major surface and a surface of the first polymer bases portion and contrast ratio for Examples 1-8.
Figure 34:
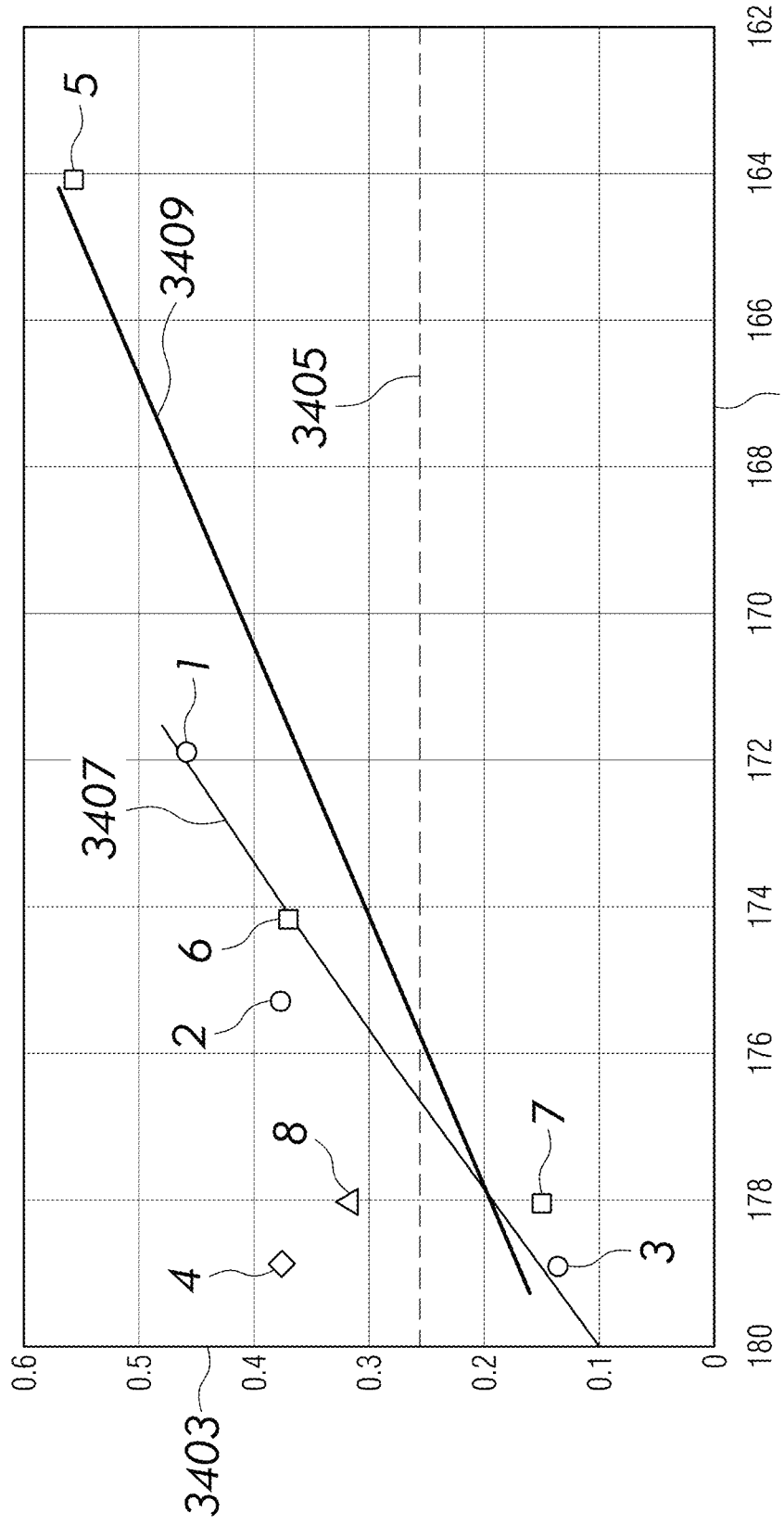
FIG. 34 shows relationships between an angle of the transition region and contrast ratio for Examples 1-8.

Table 1 presents the properties of Examples 1-4 (with a first recess opposite the second recess) that are also presented in FIGS. 31-32 and 34 as points 1-4, respectively. The "average transition angle" in Tables 1-2 was measured as the "surface angle" defined above, although the "average angle" defined above was substantially equal to the "surface angle." As shown, the contrast ratio decreases going from Example 1 to Example 3 as the average transition angle (e.g., first average angle) and/or polymer angle increases. Notably, as shown in FIG. 31 and Table 1, Example 3 with a polymer angle of 178.5° has a contrast ratio 0.14, which is below the visibility threshold of about 0.25 discussed here with reference to FIG. 29. Based on modeling and additional sampling (not shown but line 3107 in FIG. 31 is representative), it was determined that a contrast ratio of 0.25 or less can be obtained for the double recess foldable substrate (with the thickness and central thickness of Examples 1-4) when the polymer angle is 178.3° or more.

As shown in FIG. 34 and Table 1, Example 3 with an average transition angle of 178.9° (corresponding to a transition width of 1.96 mm), which is below the visibility threshold of about 0.25. Based on modeling and additional sampling (not shown but line 3407 in FIG. 34 is representative), it was determined that a contrast ratio of 0.25 or less can be obtained for the double recess foldable substrate (with the thickness and central thickness of Examples 1-4)

when the average transition angle is 177.0° or more (corresponding to a transition width of 0.67 mm).

TABLE 1

Properties of Examples 1-4

| Ex. | Average Transition Angle (°) | Transition Width (mm) | Polymer | Polymer-Surface Height Difference (μm) | Polymer Angle (°) | Contrast Ratio |
|---|---|---|---|---|---|---|
| 1 | 171.9 | 0.23 | X | 26.1 | 178.0 | 0.46 |
| 2 | 175.3 | 0.42 | X | 5.8 | 178.1 | 0.38 |
| 3 | 178.9 | 1.96 | X | 2.4 | 178.5 | 0.14 |
| 4 | 178.9 | 1.96 | Y | 2.6 | 179.3 | 0.37 |

TABLE 2

Properties of Examples 5-8

| Ex. | Average Transition Angle (°) | Transition Width (mm) | Polymer | Polymer-Surface Height Difference (μm) | Polymer Angle (°) | Contrast Ratio |
|---|---|---|---|---|---|---|
| 5 | 164.1 | 0.24 | X | 14.4 | 177.9 | 0.57 |
| 6 | 174.2 | 0.71 | X | 5.0 | 178.8 | 0.37 |
| 7 | 178.0 | 1.86 | X | 2.1 | 179.3 | 0.15 |
| 8 | 178.0 | 1.86 | Y | 3.5 | 179.7 | 0.31 |

Table 2 presents the properties of Examples 5-8 (with a first recess and the second central surface area is flush with the second major surface) that are also presented in FIGS. 31-32 and 34 as points 5-8, respectively. As shown, the contrast ratio decreases going from Example 5 to Example 7 as the average transition angle (e.g., first average angle) and/or polymer angle increases. Notably, as shown in FIG. 31 and Table 1, Example 7 with a polymer angle of 179.3° has a contrast ratio 0.15, which is below the visibility threshold of about 0.25 discussed here with reference to FIG. 29. Based on modeling and additional sampling (not shown but line 3109 in FIG. 31 is representative), it was determined that a contrast ratio of 0.25 or less can be obtained for the double recess foldable substrate (with the thickness and central thickness of Examples 5-8) when the average transition angle 179.1°.

As shown in FIG. 34 and Table 1, Example 7 with an average transition angle of 178.0° (corresponding to a transition width of 1.86 mm) has a contrast ratio 0.15, which is below the visibility threshold of about 0.25 discussed here with reference to FIG. 29. Based on modeling and additional sampling (not shown but line 3407 in FIG. 34 is representative), it was determined that a contrast ratio of 0.25 or less can be obtained for the double recess foldable substrate (with the thickness and central thickness of Examples 5-8) when the average transition angle of 176.1° (corresponding to a transition width of 1.0 mm).

FIG. 31 schematically shows the polymer angle on the horizontal axis 3101 versus contrast ratio on the vertical axis 3103 for Examples 1-8 labeled as points 1-8. Dashed line 3105 is at a contrast ratio of 0.25 with points below dashed line 3105 corresponding to transition region that is invisible to the naked eye. Line 3107 was fit to points 1-3 and intersects dashed line 3105 at a polymer angle of about 178.3°. Line 3109 was fit to points 5-7 and intersects dashed line 3105 at a polymer angle of about 179.1°.

FIG. 34 schematically shows the average transition angle (e.g., first average angle) on the horizontal axis 3401 versus contrast ratio on the vertical axis 3403 for Examples 1-8 labeled as points 1-8. Dashed line 3405 is at a contrast ratio of 0.25 with points below dashed line 3405 corresponding to transition region that is invisible to the naked eye. Line 3407 was fit to points 1-3 and intersects dashed line 3405 at a transition angle of about 177.0°. Line 3409 was fit to points 5-7 and intersects dashed line 3405 at a transition angle of about 176.1°.

FIG. 32 schematically shows a distance between the first major surface and a surface (e.g., third contact surface 283 in FIGS. 2-5) of the polymer-based portion in micrometers (μm) on the horizontal axis 3201 versus contrast ratio on the vertical axis 3203. Points 1-8 correspond to Examples 1-8. Curve 3207 is a logarithmic curve fit to points 1-3, and curve 3209 is a logarithmic curve fit to points 5-7. As shown, the contrast ratio increases as the distance between the polymer-based portion and the first major surface increases. This is believed to be the result of differences in the path travelled by rays travelling through the polymer-based portion followed by air versus rays travelling through the foldable substrate, which exacerbates the relative shift in rays discussed above with reference to FIG. 27. Dashed line 3105 is at a contrast ratio of 0.25 with points below dashed line 3105 corresponding to transition region that is invisible to the naked eye. Curves 3207 and 3209 intersect dashed line 3205 at a distance of less than 5 μm. Also, the distance between the polymer-based portion and the first major surface is correlated with the average transition angle (e.g., first average angle) since steeper angles (e.g., further from 180°) are associated with larger gaps from an alignment error or shrinkage from curing to form the polymer-based material.

Examples 4 and 8 have Polymer Y in the recess(es) instead of Polymer X, where the refractive index of Polymer X is closer to the refractive index of the foldable substrate than Polymer Y. Otherwise, Example 4 is identical to Example 3, and Example 8 is identical to Example 7. As shown in Table 1 and FIGS. 31-32, the contrast ratio for Example 4 is much higher (0.37 versus 0.14) than the contrast ratio of Example 3. Likewise, the contrast ratio for Example 8 is much higher (0.31 versus 0.15) than the contrast ratio of Example 7. This demonstrates that having a material with a refractive index that matches (e.g., within 0.1 or less, within 0.05 or less, within 0.02 or less, etc.) the refractive index of the foldable substrate is important to achieving a low visibility transition region (e.g., low contrast ratio). With reference to FIG. 27, the larger refractive index difference for Polymer Y means that the rays passing through the central portion (including the transition portions) are further shifted relative to the rays passing through the first portion or second portion due to refraction at an interface between the transition region and the polymer-based material.

Table 3 presents the properties of Examples 10-14 (with a first recess opposite the second recess without a polymer-based material in the recesses). Examples 10-14 were formed using the etch mask depicted in FIGS. 16-18, where the first width 1417 is shown in Table 3 as the "space width." The average transition angle increases (closer to 180°) as the space width increases. Further, there appears to be an exponential relationship between the spacer length and the average transition angle. As shown in Table 3, the contrast ratio decreases as the spacer width increases and the resulting average transition angle increases (closer to 180°) for Examples 10-12. In contrast to Tables 1-2, Table 3 measures the contrast ratio without a polymer-based material in the recess. Comparing the average transition angles of Examples 10-14 to Examples 1-4, it is expected that the contrast ratio with a polymer-based material in the recess for Examples 10-14 would be much lower than those reported in Table 3 (in line with those in Table 1).

TABLE 3

Properties of Examples 10-14

| Example | Spacer Width (mm) | Average Transition Angle (°) | Contrast Ratio (No Polymer) |
|---|---|---|---|
| 10 | 0.3 | 175.28 | 0.88 |
| 11 | 0.7 | 177.00 | 0.86 |
| 12 | 1.0 | 177.25 | 0.81 |
| 13 | 1.5 | 178.06 | 0.84 |
| 14 | 2.0 | 179.47 | 0.86 |

TABLE 4

Properties of Examples A-E

| Example | Average Transition Angle (°) | Polymer ($1^{st}/2^{nd}$ recess) | Contrast Ratio |
|---|---|---|---|
| A | 171.73 | None | 0.87 |
| B | 171.73 | V/V | 0.60 |
| C | 171.73 | V/W | 0.48 |
| D | 171.73 | W/W | 0.28 |
| E | 178.93 | W/W | 0.21 |

Table 4 presents the properties of Examples A-E (with a first recess opposite the second recess without a polymer-based material in the recesses) corresponding to FIGS. 29(a)-29(e). As used in Table 4, "A/B" for the "Polymer" column means that polymer "A" was disposed in the first recess and polymer "B" was disposed in the second recess. Polymer V had a refractive index of 1.4998, and Polymer W had a refractive index of 1.5006. Since Example A did not have any polymer positioned in the recess, the polymer-surface height difference was about 35 µm.

The above observations can be combined to provide foldable apparatus comprising foldable substrates, foldable substrates, and methods of making foldable apparatus and foldable substrates comprising foldable substrates that comprise a first portion and a second portion. The portions can comprise glass-based and/or ceramic-based portions, which can provide good dimensional stability, reduced incidence of mechanical instabilities, good impact resistance, and/or good puncture resistance. The first portion and/or the second portion can comprise glass-based and/or ceramic-based portions comprising one or more compressive stress regions, which can further provide increased impact resistance and/or increased puncture resistance. By providing a substrate comprising a glass-based and/or ceramic-based substrate, the substrate can also provide increased impact resistance and/or puncture resistance while simultaneously facilitating good folding performance. In aspects, the substrate thickness can be sufficiently large (e.g., from about 80 micrometers (microns or µm) to about 2 millimeters) to further enhance impact resistance and puncture resistance. Providing foldable substrates comprising a central portion comprising a central thickness that is less than a substrate thickness can enable a small parallel plate distance (e.g., about 10 millimeters or less) based on the reduced thickness in the central portion.

In aspects, the foldable apparatus and/or foldable substrates can comprise a plurality of recesses, for example, a first central surface area recessed from a first major surface by a first distance and a second central surface area recessed from a second major surface by a second distance. Providing a first recess opposite a second recess can provide the central thickness that is less than a substrate thickness. Further, providing a first recess opposite a second recess can reduce a maximum bend-induced strain of the foldable apparatus, for example, between a central portion and a first portion and/or second portion since the central portion comprising the central thickness can be closer to a neutral axis of the foldable apparatus and/or foldable substrates than if only a single recess was provided. Additionally, providing the first distance substantially equal to the second distance can reduce the incidence of mechanical instabilities in the central portion, for example, because the foldable substrate is symmetric about a plane comprising a midpoint in the substrate thickness and the central thickness. Moreover, providing a first recess opposite a second recess can reduce a bend-induced strain of a material positioned in the first recess and/or second recess compared to a single recess with a surface recessed by the sum of the first distance and the second distance. Providing a reduced bend-induced strain of a material positioned in the first recess and/or the second recess can enable the use of a wider range of materials because of the reduced strain requirements for the material. For example, stiffer and/or more rigid materials can be positioned in the first recess, which can improve impact resistance, puncture resistance, abrasion resistance, and/or scratch resistance of the foldable apparatus. Additionally, controlling properties of a first material positioned in a first recess and a second material positioned in a second recess can control the position of a neutral axis of the foldable apparatus and/or foldable substrates, which can reduce (e.g., mitigate, eliminate) the incidence of mechanical instabilities, apparatus fatigue, and/or apparatus failure.

In aspects, the foldable apparatus and/or foldable substrates can comprise a first transition region attaching the central portion to the first portion and/or a second transition region attaching the central portion to the second portion. Providing transition regions with smoothly and/or monotonically decreasing (e.g., continuously decreasing) thicknesses can reduce stress concentration in the transition regions and/or avoid optical distortions. Providing a sufficient length of the transition region(s) (e.g., from about 2 mm to about 5 mm, from about 2.2 mm to about 4 mm, or from about 2.5 mm to about 3.5 mm) can decrease a visibility of the transition region (e.g., enable a lower contrast ratio and/or produce a transition region that is invisible to the naked eye), for example as measured by a contrast ratio defined herein. The sufficiently long transition region (and/or associated average transition angle) and/or polymer angle (defined herein) can avoid optical distortions (that may otherwise exist from a sharp change in thickness of the foldable substrate) from being discernable to a user, for example with a contrast ratio of about 0.27 or less, about 0.26 or less, or 0.25 or less. As discussed with reference to FIG. 29 and Examples A-E, a contrast ratio of 0.25 or less can be invisible to the naked eye (e.g., user).

Providing an average transition angle and/or a surface angle of a first transition surface area of the first transition region relative to the first central surface area that is sufficiently large (e.g., from about 176.1° to about 179.9° or from about 177.0° to about 179.9°) can reduce optical distortions and/or reduce visibility of the transition region such that it may not be discernable to a user. As demonstrated by Examples 1-4 and FIG. 30, when the foldable substrate comprises a first recess and a second recess opposite the first recess, the average transition angle and/or the surface angle can be from about 176.1° to about 179.9° or from about 177.0° to about 179.9° to produce a contrast ratio of 0.25 or less, which is associated with a transition region that is invisible to the naked eye. As demonstrated by Examples 5-8 and FIG. 30, when the foldable substrate comprises a second recess and the second central surface area is flush with the second major surface, the average transition angle can be from about 176.1° to about 179.9° to produce a contrast ratio of 0.25 or less, which is associated with a transition region that is invisible to the naked eye.

Providing a polymer angle that is sufficiently large (e.g., from about 178.3° to about 179.9° or from about 179.10 to about 179.9°) can reduce optical distortions and/or reduce visibility of the transition region such that it may not be discernable to a user. As demonstrated by Examples 1-4 and FIG. 30, when the foldable substrate comprises a first recess and a second recess opposite the first recess, the polymer angle can be from about 178.3° to about 179.9° or from about 179.10 to about 179.9° to produce a contrast ratio of 0.25 or less, which is associated with a transition region that is invisible to the naked eye. As demonstrated by Examples 5-8 and FIG. 30, when the foldable substrate comprises a second recess and the second central surface area is flush with the second major surface, the polymer angle can be from about 179.10 to about 179.9° to produce a contrast ratio of 0.25 or less, which is associated with a transition region that is invisible to the naked eye.

Also, providing a polymer-based material in the recess (es) with a refractive index close (e.g., within 0.1 or less, within 0.05 or less, within 0.02 or less, or within 0.01 or less) to the refractive index of the foldable substrate can further decrease a visibility of the transition region (e.g., enable a lower contrast ratio and/or produce a transition region that is invisible to the naked eye), as demonstrated by comparing Examples 3-4 or Examples 7-8. When the polymer-based material that does not extend beyond the recess(es), providing a distance between the contact surface of the polymer-based portion and the corresponding major surface of the foldable substrate of about 5 µm or less (e.g., about 2 µm or less) facilitates a low contrast ratio (e.g., low visibility) of the transition region. Alternatively, a portion of the polymer-based portion can be positioned in the recess and another (e.g., continuous) portion of the polymer-based portion can further contact a major surface of the foldable substrate, which can reduce optical distortions.

Methods of the aspects of the disclosure can enable formation of transition regions using an etch mask and an etchant. Providing an etch mask comprising a polymer layer at a peripheral portion of the etch mask can enable formation of transition regions with a transition width (e.g., about 1.5 mm or more, from about 1.5 mm to about 5 mm, from about 2 mm to about 4 mm), an average transition angle (e.g., from about 178.3° to about 179.9° or from about 179.10 to about 179.9°), and/or a surface angle (e.g., from about 178.3° to about 179.9° or from about 179.1° to about 179.9°) that can be greater than comparative etch masks (see Examples 10-12). Without wishing to be bound by theory, the polymer layer can be deflected away from the foldable substrate during etching to enable the etchant access to an additional portion of the foldable substrate that the polymer layer could otherwise be in contact with. While the etchant can contact the additional portion of the foldable substrate by deflection of the polymer layer, diffusion of the etchant to the additional portion is limited, which limits the extent of etching of the additional portion, producing a transition region.

Alternatively, methods can comprise ink-jet printing a plurality of shapes (e.g., on the existing first central surface area and/or existing first major surface) that can be etched to form the central portion (e.g., first transition region, second transition region, central region). Providing a width of one or more shapes of the plurality of shapes from about 500 nm to about 50 µm can enable the underlying foldable substrate to be etched to produce a substantially continuous and/or smooth surface of the resulting surface (e.g., first transition surface area 215, third transition surface area 217, and/or first central surface area 213 shown in FIGS. 2-5). In aspects, the fractional area profile (of the corresponding predetermined pattern) can be proportional to an amount of material removed by the etching to produce a predetermined first transition region and a predetermined second transition region in the etching of step 1207. Without wishing to be bound by theory, it is believed that the shapes of the present disclosure are sufficiently small that undercutting by the etchant (e.g., isotropic etchant) can produce a relatively smooth surface (e.g., without discernable flat spots corresponding to the predetermined pattern). At the same time, it is believed that the shapes of the present disclosure are large enough that the shapes can limit etching (e.g., diffusion of the etchant) in areas with higher fractional areas to produce the predetermined profile.

Directional terms as used herein—for example, up, down, right, left, front, back, top, bottom—are made only with reference to the figures as drawn and are not intended to imply absolute orientation.

It will be appreciated that the various disclosed aspects may involve features, elements, or steps that are described in connection with that aspect. It will also be appreciated that a feature, element, or step, although described in relation to one aspect, may be interchanged or combined with alternate aspects in various non-illustrated combinations or permutations.

It is also to be understood that, as used herein the terms "the," "a," or "an," mean "at least one," and should not be limited to "only one" unless explicitly indicated to the contrary. For example, reference to "a component" comprises aspects having two or more such components unless the context clearly indicates otherwise. Likewise, a "plurality" is intended to denote "more than one."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. Ranges can be expressed herein as from "about" one particular value, and/or to "about" another particular value. When such a range is expressed, aspects include from the one particular value and/or to the other particular value. Similarly, when values are expressed as approximations, by use of the antecedent "about," it will be understood that the particular value forms another aspect. Whether or not a numerical value or endpoint of a range in the specification recites "about," the numerical value or endpoint of a range is intended to include two aspects: one modified by "about," and one not modified by "about." It will be further understood that the endpoints of each of the ranges are significant both in relation to the other endpoint and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In aspects, "substantially similar" may denote values within about 10% of each other, for example, within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred.

While various features, elements, or steps of particular aspects may be disclosed using the transitional phrase "comprising," it is to be understood that alternative aspects, including those that may be described using the transitional phrases "consisting of" or "consisting essentially of," are implied. Thus, for example, implied alternative aspects to an apparatus that comprises A+B+C include aspects where an apparatus consists of A+B+C and aspects where an apparatus consists essentially of A+B+C. As used herein, the terms "comprising" and "including", and variations thereof shall be construed as synonymous and open-ended unless otherwise indicated.

The above aspects, and the features of those aspects, are exemplary and can be provided alone or in any combination with any one or more features of other aspects provided herein without departing from the scope of the disclosure.

It will be apparent to those skilled in the art that various modifications and variations can be made to the present disclosure without departing from the spirit and scope of the disclosure. Thus, it is intended that the present disclosure cover the modifications and variations of the aspects herein provided they come within the scope of the appended claims and their equivalents.

What is claimed is:

1. A foldable apparatus comprising a foldable substrate, the foldable substrate comprising:
   a substrate thickness in a range from about 80 micrometers to about 5 millimeters defined between a first major surface and a second major surface opposite the first major surface, the foldable substrate comprising a glass-based material or a ceramic-based material;
   a first portion comprising the substrate thickness between a first surface area of the first major surface and a second surface area of the second major surface;
   a second portion comprising the substrate thickness between a third surface area of the first major surface and a fourth surface area of the second major surface;
   a central portion comprising a central thickness less than the substrate thickness and in a range from about 20 micrometers to about 200 micrometers defined between a first central surface area and a second central surface area opposite the first central surface area, and the first central surface area recessed from the first major surface by a first distance and defining a first recess; and
   a first polymer-based portion disposed in the first recess comprising a first contact surface facing the first central surface area and a second contact surface opposite the first contact surface, and an absolute value of a difference between a first refractive index of the foldable substrate and a second refractive index of the first polymer-based portion is about 0.1 or less,
   wherein a first polymer angle defined as an internal angle between the first major surface of the foldable substrate and the second contact surface of the polymer-based portion is in a range from 179.2° to about 179.5°, and the second central surface area is recessed from the second major surface by a second distance and defines a second recess.

2. The foldable apparatus of claim 1, wherein a distance in a direction of the substrate thickness between the first major surface and the second contact surface is about 5 micrometers or less.

3. The foldable apparatus of claim 1, wherein the foldable apparatus comprises a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

4. The foldable apparatus of claim 1, wherein the substrate thickness is in a range from about 100 micrometers to about 400 micrometers, and the central thickness is in a range from about 25 micrometers to about 80 micrometers.

5. The foldable apparatus of claim 1, wherein the foldable substrate achieves a parallel plate distance of 10 millimeters.

6. The foldable apparatus of claim 1, wherein the foldable substrate comprises a minimum parallel plate distance in a range from about 0.5 millimeters to about 10 millimeters.

7. A consumer electronic device comprising:
   a housing comprising a front surface, a back surface, and side surfaces;
   electrical components at least partially within the housing, the electrical components comprising a controller, a memory, and a display, the display is at or adjacent to the front surface of the housing; and
   a cover substrate disposed over the display,
   wherein at least one of a portion of the housing or the cover substrate comprises the foldable apparatus of claim 1.

8. A method of making a foldable substrate comprising a substrate thickness a predetermined first transition region and a predetermined second transition region, the method comprising:
   ink-jet printing a plurality of shapes on a first major surface including a central portion of the foldable substrate, wherein the plurality of shapes are non-uniformly distributed over the first major surface in a predetermined pattern;
   etching the foldable substrate by contacting a central portion of the foldable substrate and the plurality of shapes with an etchant, the etching removes a portion of the foldable substrate to form a first central surface area recessed from the first major surface by a first distance and defining a first recess, the etching removes a portion of the foldable substrate to form a first transition surface area of the predetermined first transition region, and the etching removes a portion of the foldable substrate to form a third transition surface area of the predetermined second transition region; and
   disposing a first polymer-based portion in the first recess, a first polymer-based portion disposed in the first recess comprising a first contact surface facing the first central surface area and a second contact surface opposite the first contact surface, and an absolute value of a difference between a first refractive index of the foldable substrate and a second refractive index of the first polymer-based portion is about 0.1 or less, wherein the substrate thickness is in a range from about 80 micrometers to about 5 millimeters, the foldable substrate comprising a glass-based material or a ceramic-based material, and the foldable substrate comprises:
   a first portion comprising the substrate thickness between a first surface area of the first major surface and a second surface area of the second major surface:
   a second portion comprising the substrate thickness between a third surface area of the first major surface and a fourth surface area of the second major surface:
   the central portion comprising:
      a central thickness less than the substrate thickness and in a range from about 20 micrometers to about 200 micrometers defined between the first central surface area and a second central surface area opposite the first central surface area:
      the predetermined first transition region comprising the first transition surface area extending between the first surface area and the first central surface area with a first average angle relative to the first central surface area, and a thickness of the first transition region smoothly and monotonically decreases between the substrate thickness of the first portion and the central thickness of the central portion; and
      the predetermined second transition region comprising the third transition surface area extending between the third surface area and the first central surface area with a third average angle relative to the first central surface area, and a thickness of the second transition region smoothly and monotonically decreases between the substrate thickness of the second portion and the central thickness of the central portion,
   wherein a first polymer angle defined as an internal angle between the first major surface of the foldable substrate and the second contact surface of the polymer-based portion is in a range from about 178.3° to about 179.9°, and the first average angle is in a range from about 176.1° to about 179.9°.

9. The method of claim 8, wherein the predetermined pattern produces a fractional area profile of a portion of first major surface covered by the plurality of shapes averaged in a direction perpendicular to both a direction of the substrate thickness and a direction extending from the first transition surface to the third transition surface area, and the fractional area profile is proportional to an amount of material removed by the etching to produce the predetermined first transition region and the predetermined second transition region.

10. The method of claim 8, wherein the plurality of shapes comprise a plurality of elongated shapes with an aspect ratio of about 10 or more.

11. The method of claim 8, wherein a shape of the plurality of shapes comprises a shape width in a range from about 500 nanometers to about 50 micrometers, and the shape width is in a direction extending from the first transition surface to the third transition surface area.

12. The method of claim 8, wherein the central portion comprises a second central surface area opposite the first central surface area, the foldable substrate further comprises a second major surface opposite the first major surface, the second central surface area is flush with the second major surface, and the first average angle is in a range from about 177.0° to about 179.0°.

13. The method of claim 8, wherein the foldable substrate exhibits a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test when the first recess is filled with a material comprising substantially the same refractive index as the foldable substrate.

14. A foldable apparatus comprising a foldable substrate, the foldable substrate comprising:
   a substrate thickness in a range from about 80 micrometers to about 5 millimeters defined between a first major surface and a second major surface opposite the first major surface, the foldable substrate comprising a glass-based material or a ceramic-based material;
   a first portion comprising the substrate thickness between a first surface area of the first major surface and a second surface area of the second major surface;
   a second portion comprising the substrate thickness between a third surface area of the first major surface and a fourth surface area of the second major surface;
   a central portion comprising:
      a central thickness less than the substrate thickness and in a range from about 20 micrometers to about 200 micrometers defined between a first central surface area and a second central surface area opposite the first central surface area;
      the first central surface area is recessed from the first major surface by a first distance and defining a first recess;
      a first transition region comprising a first transition surface area extending between the first surface area and the first central surface area with a first average angle relative to the first central surface area, and a thickness of the first transition region smoothly and monotonically decreases between the substrate thickness of the first portion and the central thickness of the central portion; and
      a second transition region comprising a third transition surface area extending between the third surface area and the first central surface area with a third average angle relative to the first central surface area, and a thickness of the second transition region smoothly and monotonically decreases between the substrate thickness of the second portion and the central thickness of the central portion,
   a first polymer-based portion disposed in the first recess comprising a first contact surface facing the first central surface area and a second contact surface opposite the first contact surface, and an absolute value of a difference between a first refractive index of the foldable substrate and a second refractive index of the first polymer-based portion is about 0.1 or less,
   wherein a first polymer angle defined as an internal angle between the first major surface of the foldable substrate and the second contact surface of the polymer-based portion is in a range from about 178.3° to about 179.9°, and the first average angle is in a range from about 176.1° to about 179.9°.

15. The foldable apparatus of claim 1, wherein the first average angle is in a range from about 177.0 to about 179.0°.

16. The foldable apparatus of claim 14, wherein a distance in a direction of the substrate thickness between the first major surface and the second contact surface is about 5 micrometers or less.

17. The foldable apparatus of claim 14, wherein the foldable apparatus comprises a contrast ratio of about 0.25 or less, and the contrast ratio is defined as a difference between a maximum fractional intensity and a minimum fractional intensity divided by the sum of the maximum fractional intensity and the minimum fractional intensity as measured using a Contrast Test.

18. The foldable apparatus of claim 14, wherein the substrate thickness is in a range from about 100 micrometers to about 400 micrometers, and the central thickness is in a range from about 25 micrometers to about 80 micrometers.

19. The foldable apparatus of claim 14, wherein a first transition width of the first transition region is in a range from about 2.0 millimeters to about 6.0 millimeters.

20. The foldable apparatus of claim 14, wherein the foldable substrate achieves a parallel plate distance of 10 millimeters, or the foldable substrate comprises a minimum parallel plate distance in a range from about 0.5 millimeters to about 10 millimeters.

* * * * *

UNITED STATES PATENT AND TRADEMARK OFFICE
CERTIFICATE OF CORRECTION

Page 1 of 1

PATENT NO. : 12,207,539 B1
APPLICATION NO. : 18/409627
DATED : January 21, 2025
INVENTOR(S) : Agnello et al.

It is certified that error appears in the above-identified patent and that said Letters Patent is hereby corrected as shown below:

On the Title Page

Item (57) in the Abstract, at Column 2, Line 5, delete "176.10" and insert --176.1°--

Item (57) in the Abstract, at Column 2, Line 7, delete "176.10" and insert --176.1°--

In the Claims

At Column 88, Line 59, Claim 15, delete "claim 1" insert --claim 14--

Signed and Sealed this
Sixteenth Day of December, 2025

John A. Squires
*Director of the United States Patent and Trademark Office*